(12) United States Patent
Chen et al.

(10) Patent No.: US 11,309,289 B2
(45) Date of Patent: Apr. 19, 2022

(54) INTEGRATED CIRCUIT PACKAGE HAVING HEAT DISSIPATION STRUCTURE

(71) Applicant: Taiwan Semiconductor Manufacturing Co., Ltd., Hsinchu (TW)

(72) Inventors: Ming-Fa Chen, Taichung (TW); Hsien-Wei Chen, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/901,643

(22) Filed: Jun. 15, 2020

(65) Prior Publication Data

US 2020/0312816 A1 Oct. 1, 2020

Related U.S. Application Data

(60) Continuation of application No. 16/568,642, filed on Sep. 12, 2019, now Pat. No. 10,950,579, which is a
(Continued)

(51) Int. Cl.
*H01L 23/48* (2006.01)
*H01L 25/065* (2006.01)
(Continued)

(52) U.S. Cl.
CPC .......... *H01L 25/0657* (2013.01); *H01L 21/78* (2013.01); *H01L 25/50* (2013.01);
(Continued)

(58) Field of Classification Search
None
See application file for complete search history.

(56) References Cited

U.S. PATENT DOCUMENTS 6,930,378 B1 * 8/2005 St. Amand .......... H01L 25/0657
257/686
8,772,137 B2 7/2014 Chen et al.
(Continued)

FOREIGN PATENT DOCUMENTS

CN 106463469 A 2/2017
JP 2007180529 A 7/2007
(Continued)

*Primary Examiner* — Hung K Vu
(74) *Attorney, Agent, or Firm* — Slater Matsil, LLP

(57) ABSTRACT

A package and a method of forming the same are provided. A method includes forming a first die structure. The first die structure includes a die stack and a stacked dummy structure bonded to a carrier. A second die structure is formed. The second die structure includes a first integrated circuit die. The first die structure is bonded to the second die structure by bonding a topmost integrated circuit die of the die stack to the first integrated circuit die. The topmost integrated circuit die of the die stack is a farthest integrated circuit die of the die stack from the carrier. A singulation process is performed on the first die structure to form a plurality of individual die structures. The singulation process singulates the stacked dummy structure into a plurality of individual stacked dummy structures.

20 Claims, 63 Drawing Sheets

Related U.S. Application Data division of application No. 16/009,609, filed on Jun. 15, 2018, now Pat. No. 10,685,937.

(51) Int. Cl.
*H01L 21/78* (2006.01)
*H01L 25/00* (2006.01)

(52) U.S. Cl.
CPC .............. *H01L 2225/06513* (2013.01); *H01L 2225/06541* (2013.01); *H01L 2225/06555* (2013.01); *H01L 2225/06582* (2013.01); *H01L 2225/06589* (2013.01)

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2005/0048698 A1 | 3/2005 | Yamaguchi | |
| 2007/0126085 A1 | 6/2007 | Kawano et al. | |
| 2008/0224322 A1 | 9/2008 | Shinogi | |
| 2013/0210198 A1* | 8/2013 | Lin | H01L 23/49827 438/126 |
| 2015/0279431 A1* | 10/2015 | Li | H01L 25/0652 365/51 |
| 2015/0364386 A1 | 12/2015 | Yu et al. | |
| 2018/0138101 A1* | 5/2018 | Yu | H01L 23/3114 |
| 2018/0158749 A1* | 6/2018 | Yu | H01L 21/6835 |
| 2019/0355637 A1* | 11/2019 | Chen | H01L 23/28 |

FOREIGN PATENT DOCUMENTS

| | | |
|---|---|---|
| KR | 20180054440 A | 5/2018 |
| WO | 2018075204 A1 | 4/2018 |

* cited by examiner

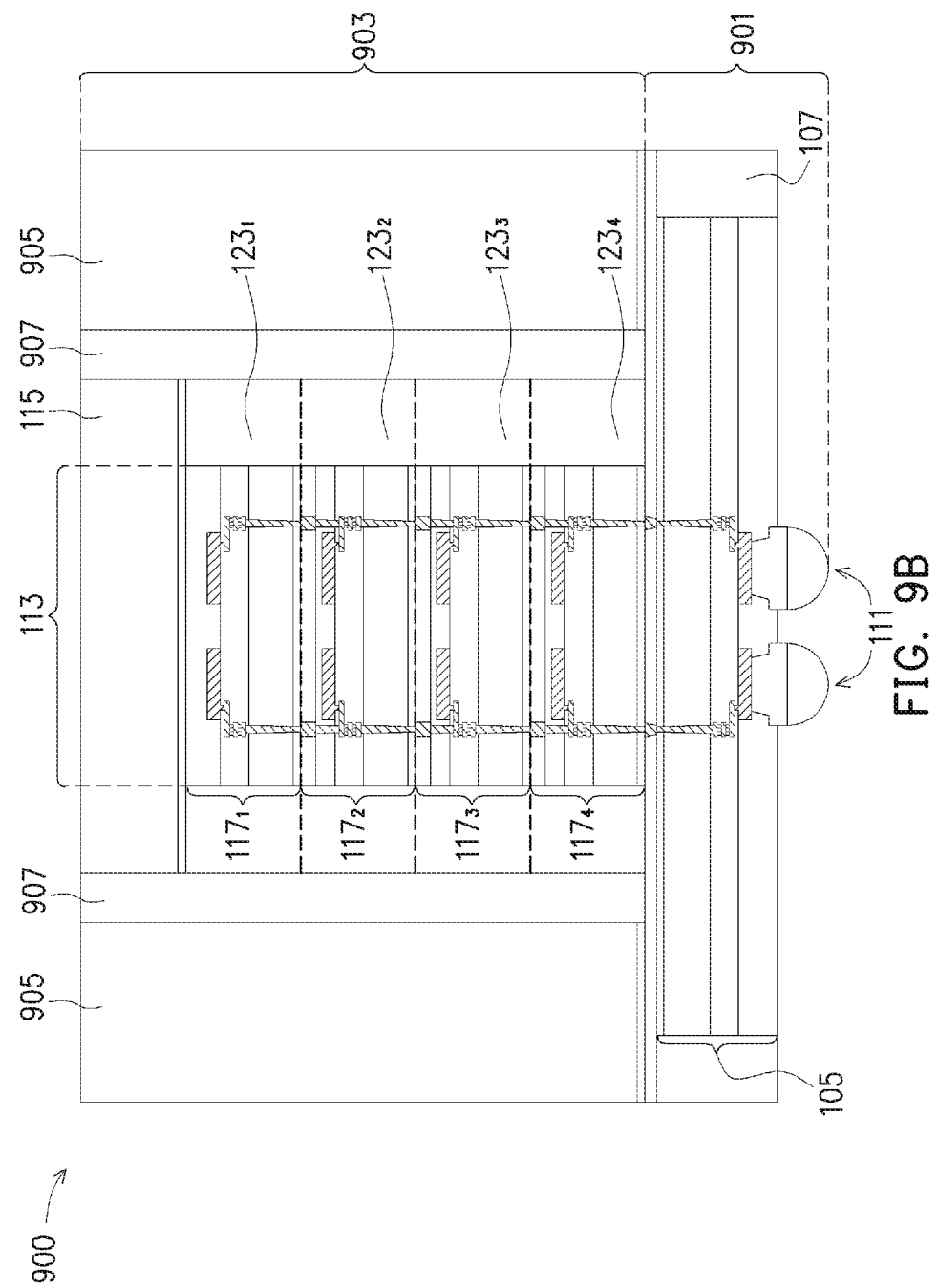

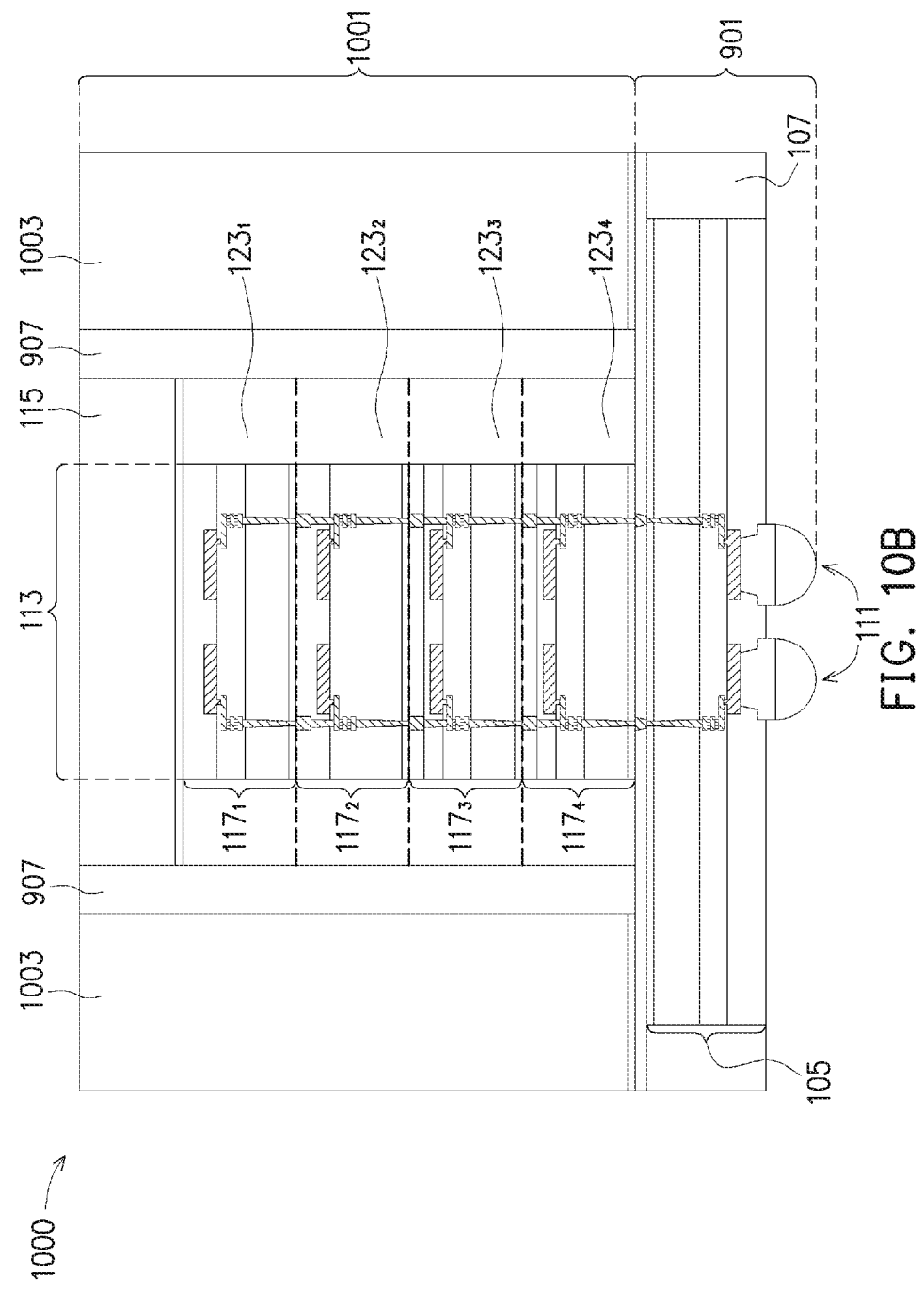

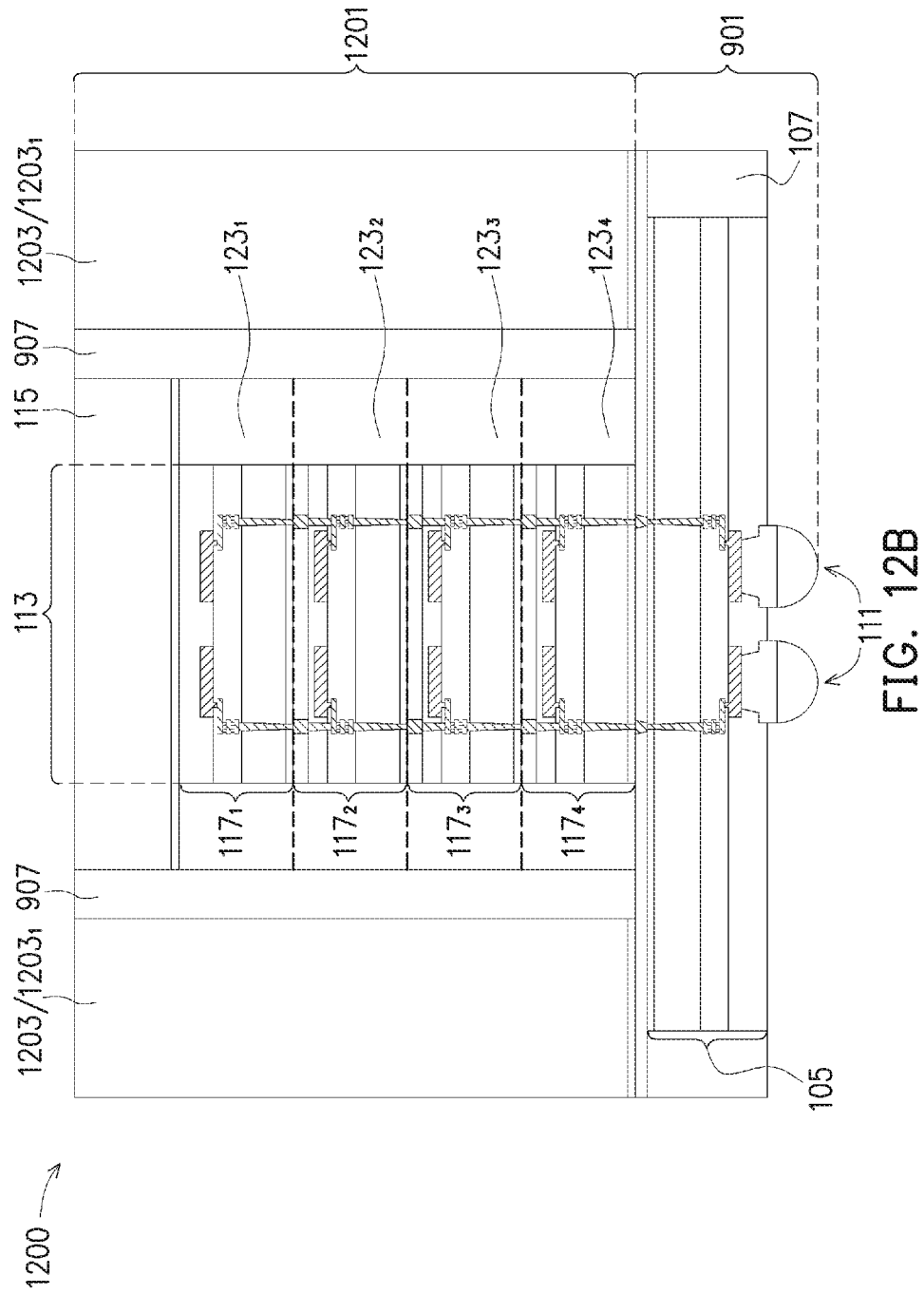

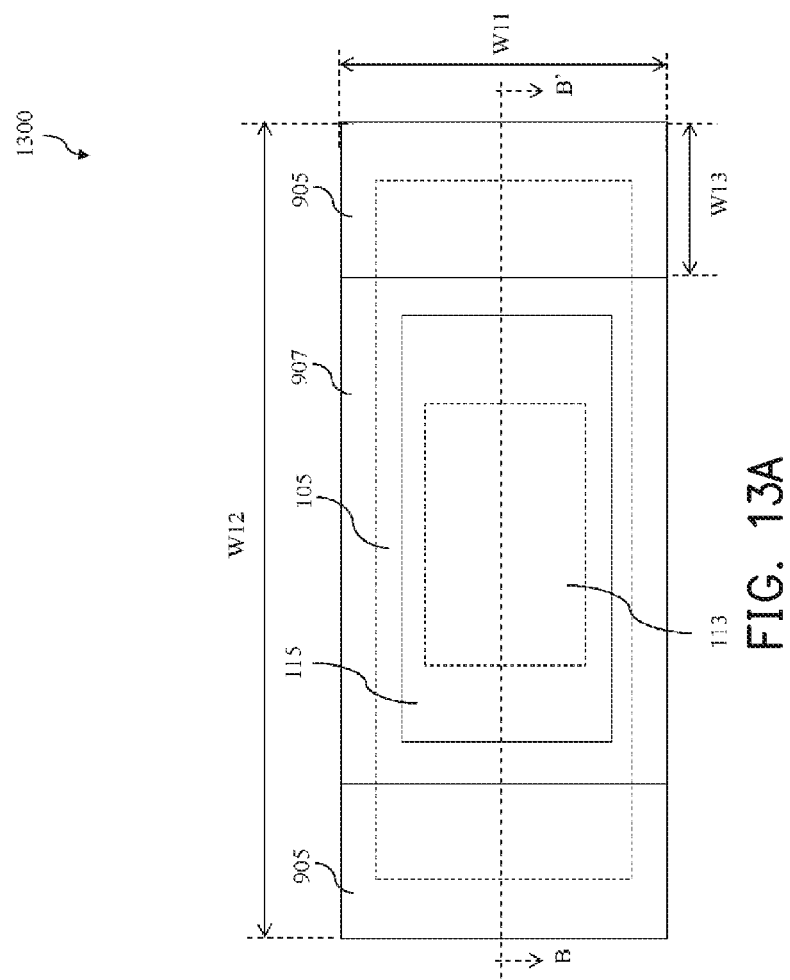

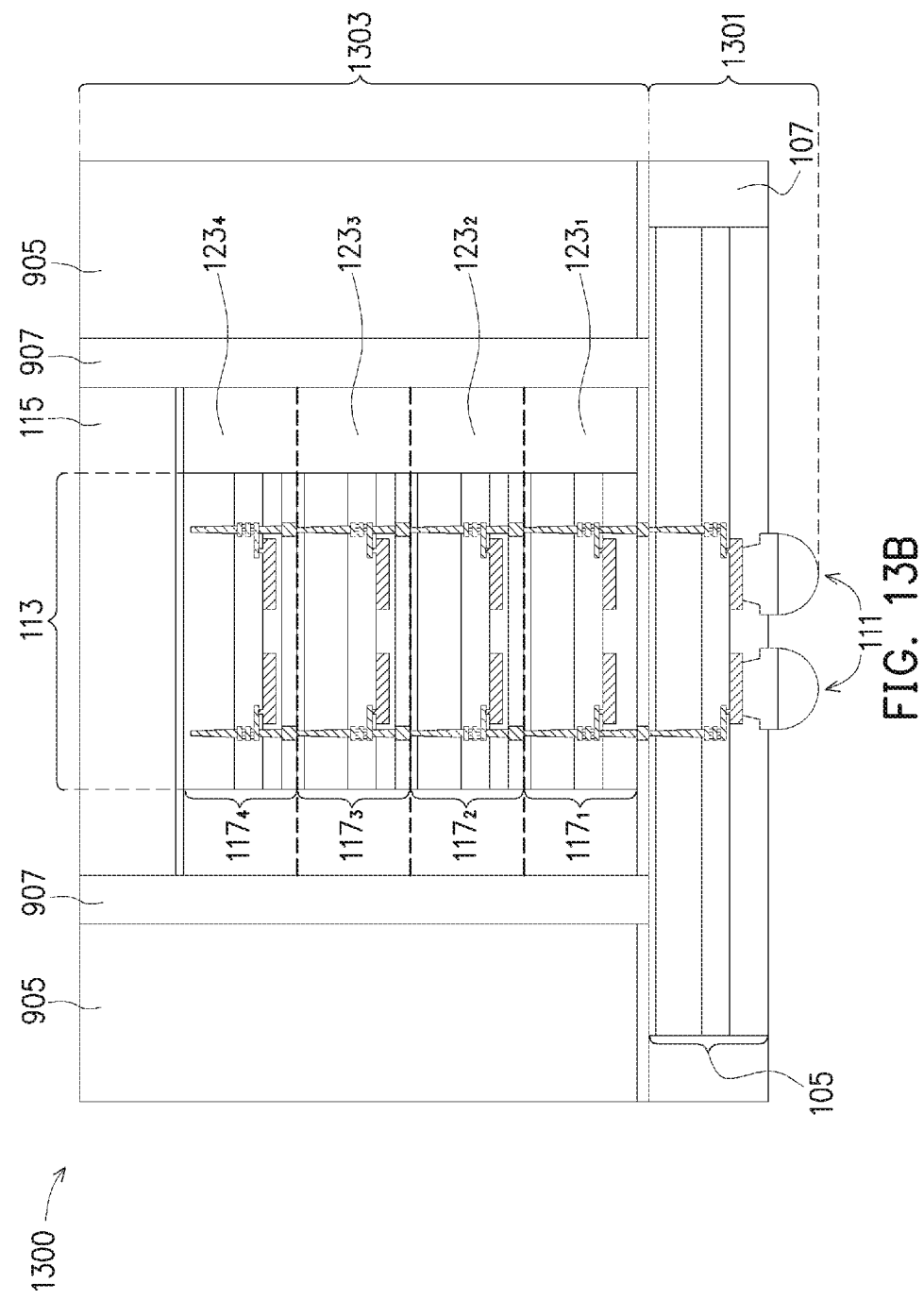

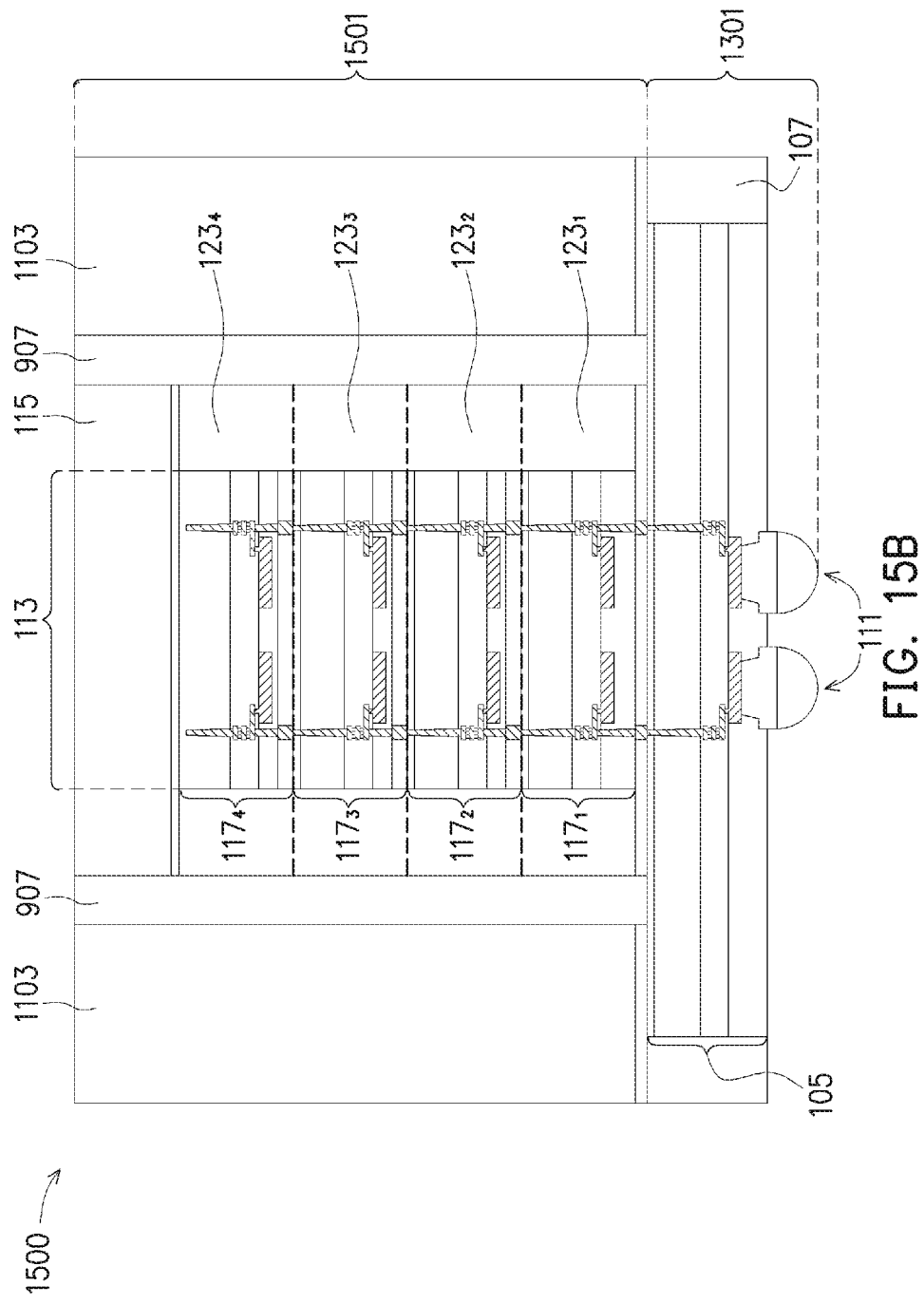

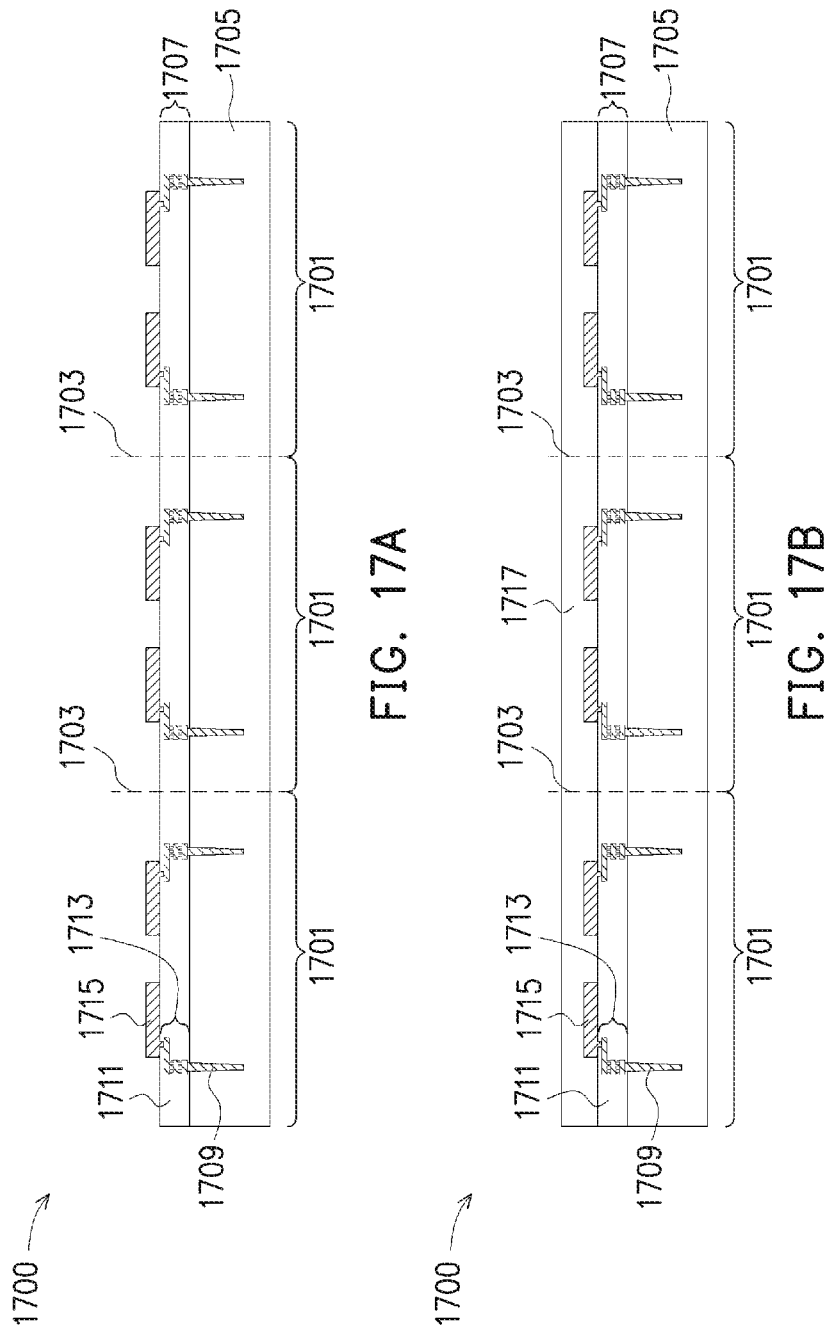

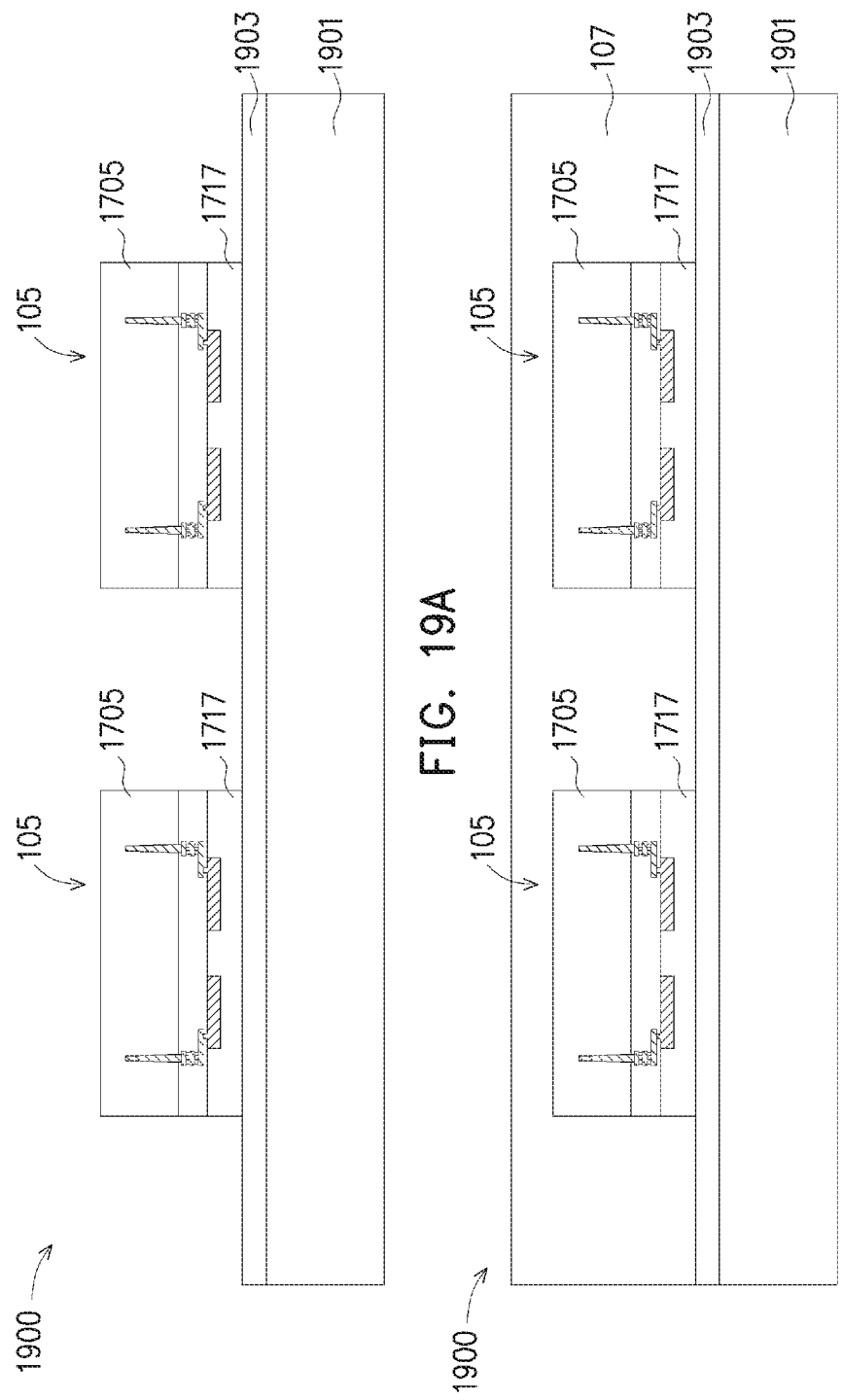

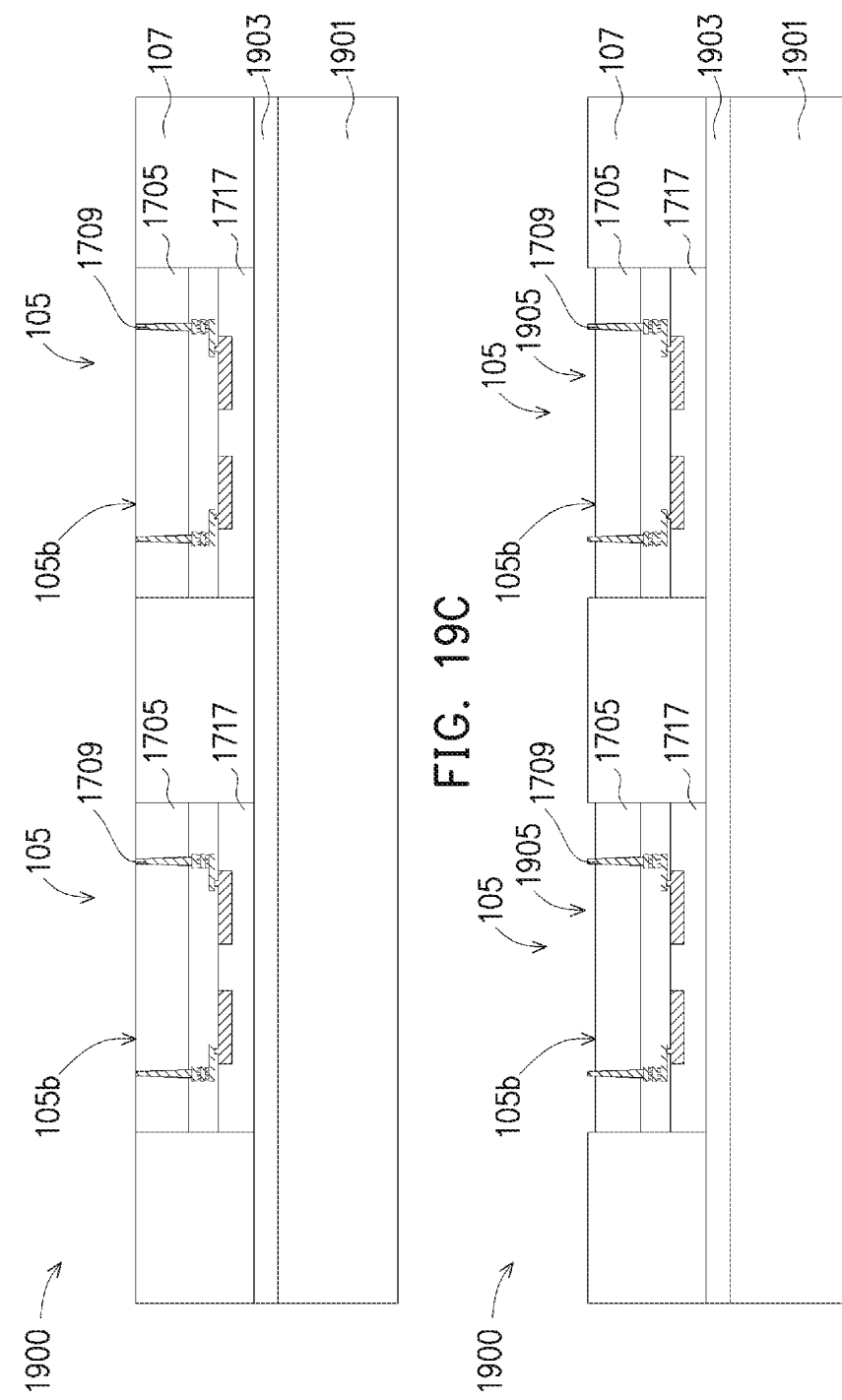

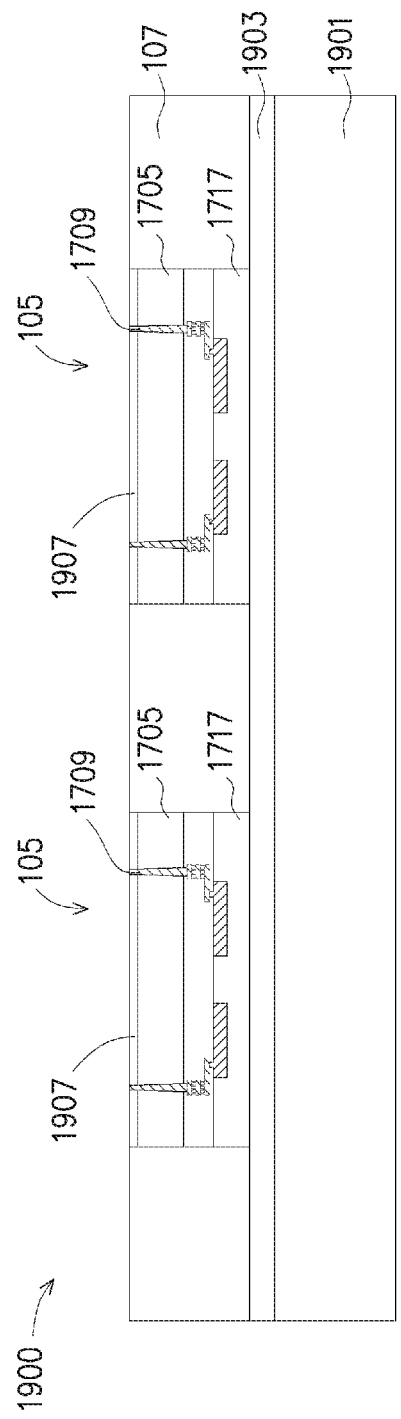
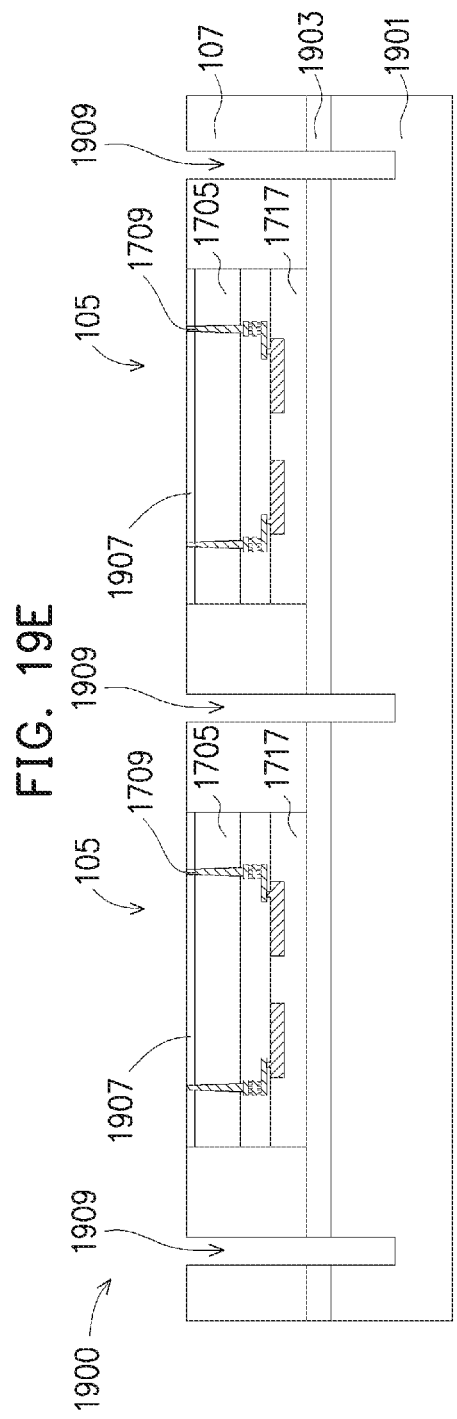

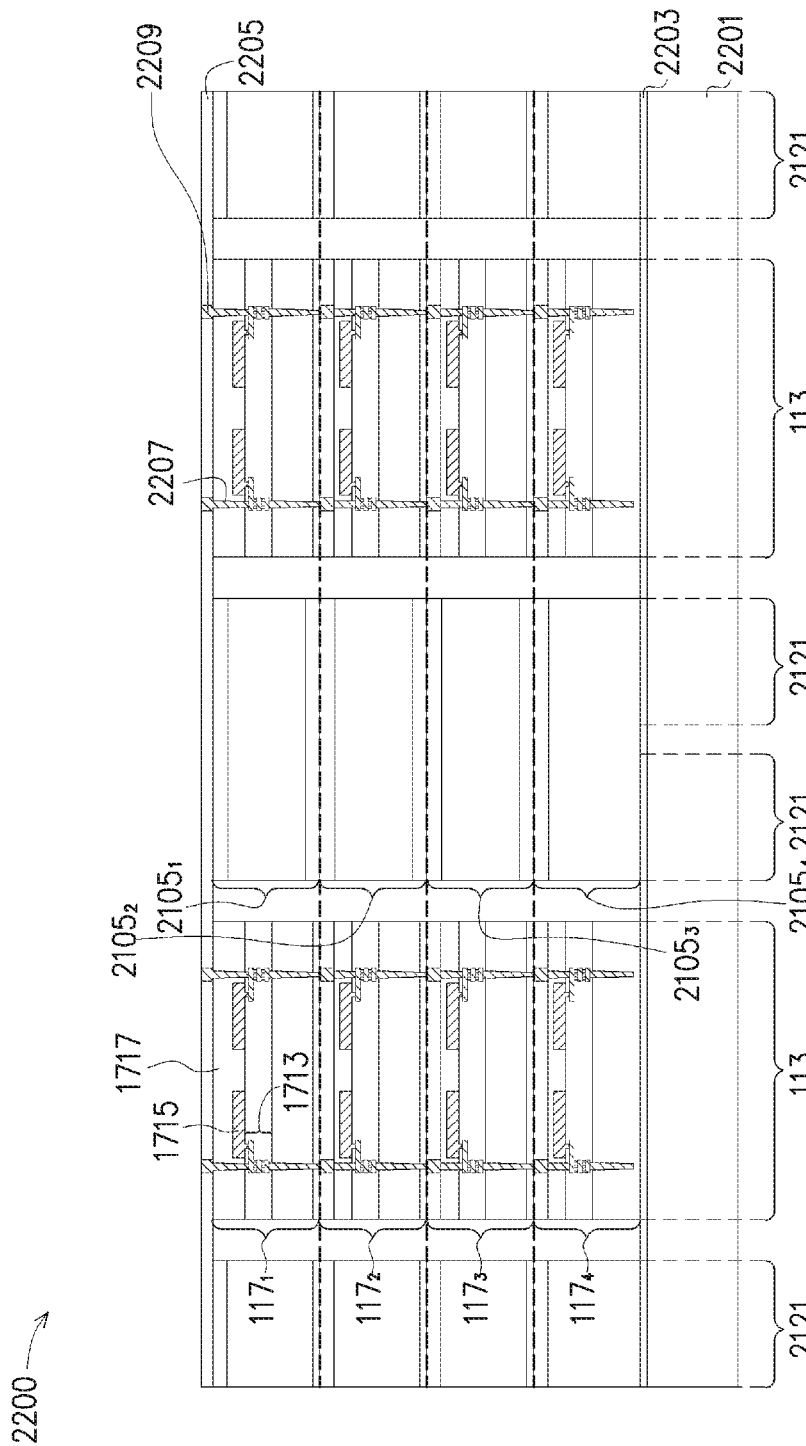

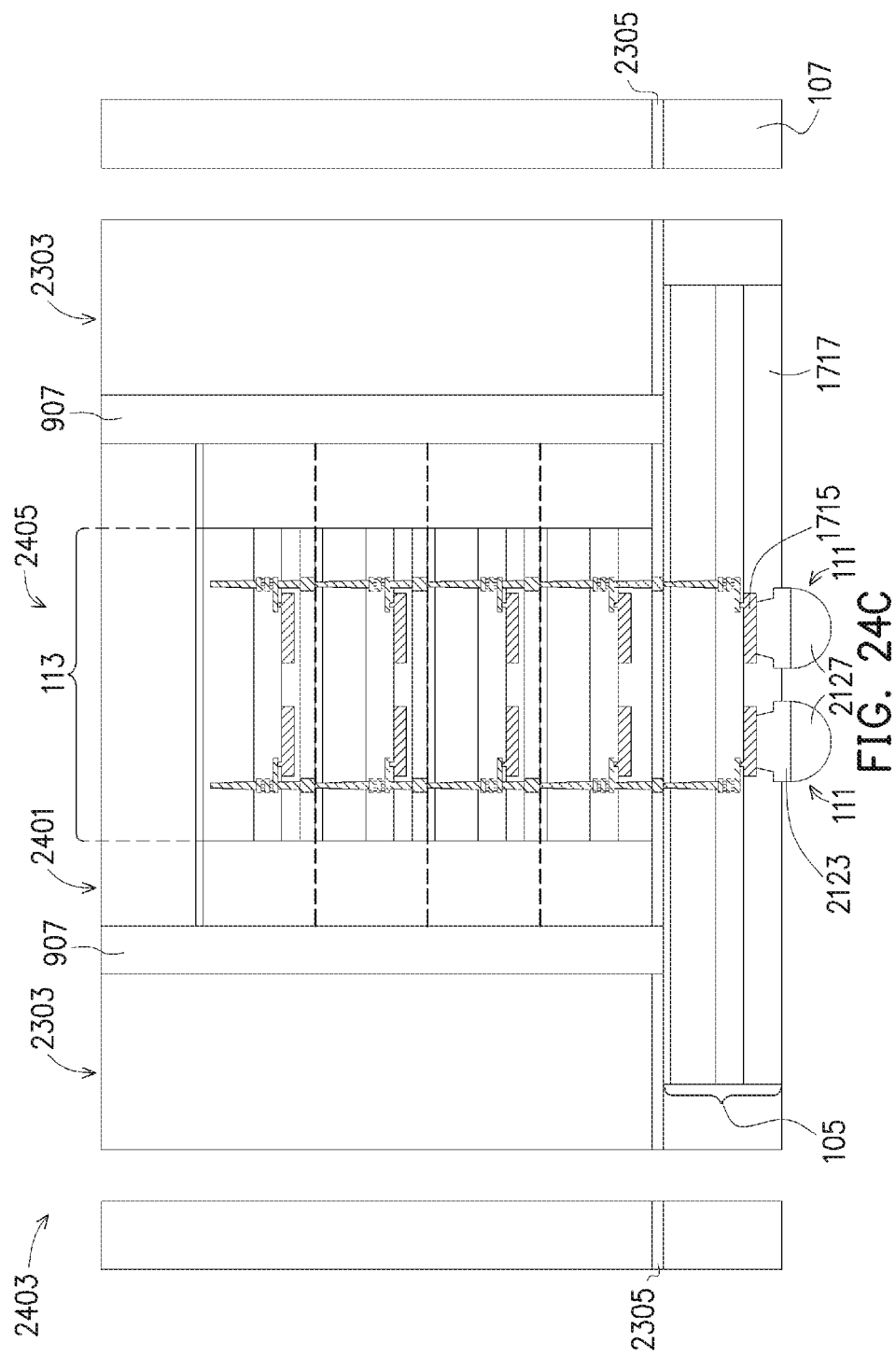

INTEGRATED CIRCUIT PACKAGE HAVING HEAT DISSIPATION STRUCTURE

PRIORITY CLAIM AND CROSS-REFERENCE

This application is a continuation and claims the benefit of U.S. application Ser. No. 16/568,642, filed on Sep. 12, 2019, entitled "Integrated Circuit Package and Method of Forming Same," which is a division of U.S. application Ser. No. 16/009,609, filed on Jun. 15, 2018, now U.S. Pat. No. 10,685,937 issued on Jun. 16, 2020, entitled "Integrated Circuit Package and Method of Forming Same," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A and 9B illustrate top and cross-sectional views of an integrated circuit package in accordance with some embodiments.

FIGS. 10A and 10B illustrate top and cross-sectional views of an integrated circuit package in accordance with some embodiments.

FIGS. 12A and 12B illustrate top and cross-sectional views of an integrated circuit package in accordance with some embodiments.

FIGS. 13A and 13B illustrate top and cross-sectional views of an integrated circuit package in accordance with some embodiments.

FIGS. 15A and 15B illustrate top and cross-sectional views of an integrated circuit package in accordance with some embodiments.

FIGS. 17A-17C illustrate cross-sectional views of various processing steps during fabrication of integrated circuit dies in accordance with some embodiments.

FIGS. 19A-19G illustrate cross-sectional views of various processing steps during fabrication of integrated circuit die structures in accordance with some embodiments.

FIGS. 22A-22D illustrate cross-sectional views of various processing steps during fabrication of integrated circuit packages in accordance with some embodiments.

FIGS. 24A-24C illustrate cross-sectional views of various processing steps during fabrication of integrated circuit packages in accordance with some embodiments.

DETAILED DESCRIPTION

Figure 1A:
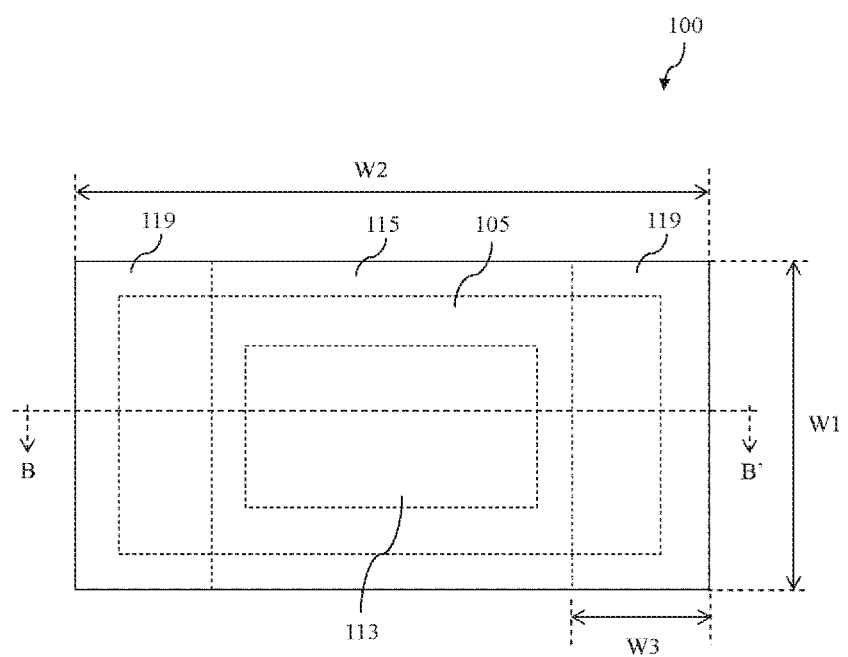
FIGS. 1A and 1B illustrate top and cross-sectional views of an integrated circuit package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely an integrated circuit package, such as a 3DIC package, and a method of forming the same. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, or the like, or mounting input components, boards, dies or other components, or for connection packaging or mounting combinations of any type of integrated circuit or electrical component. Various embodiments described herein allow for forming integrated circuit packages by direct bonding integrated circuit dies to one another. Various embodiments described herein further allow for embedding heat dissipation structures within integrated circuit packages and reducing a time for formation of the heat dissipation structures and the integrated circuit packages. Accordingly, a wafer per hour (WPH) yield may be increased and production cost may be reduced during the production of integrated circuit packages.

Figure 1B:
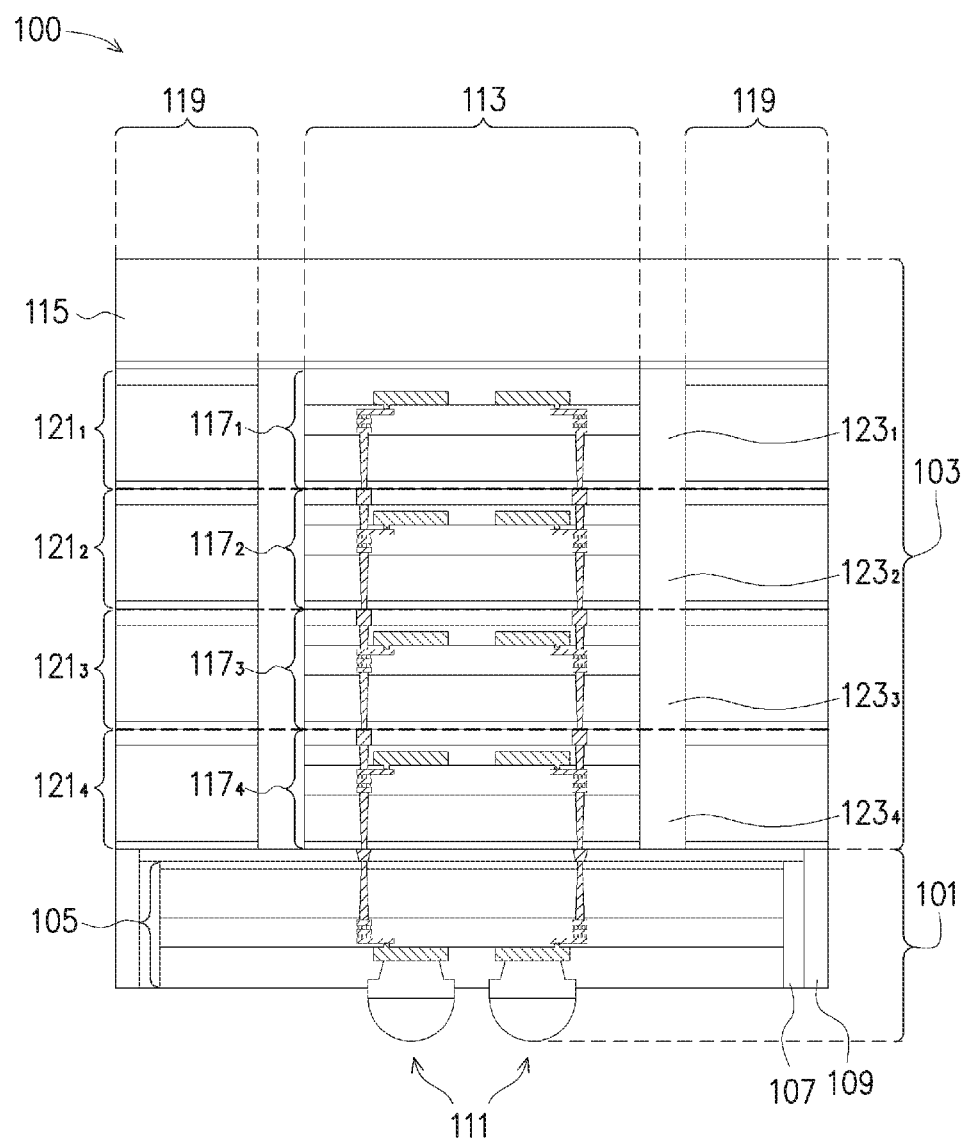

FIGS. 1A and 1B illustrate top and cross-sectional views of an integrated circuit (IC) package 100 in accordance with some embodiments. FIG. 1A illustrates a top view, while FIG. 1B illustrated a cross-sectional view along a line BB' in FIG. 1A. In some embodiments, the IC package 100 comprises a first IC die structure 101 bonded to a second IC die structure 103. In some embodiments, the first IC die structure 101 is electrically connected to the second IC die structure 103. The first IC die structure 101 comprises an IC die 105 encapsulated in encapsulants 107 and 109. In some embodiments, the IC die 105 may comprise a logic die, a memory die, a CPU, a GPU, an xPU, a MEMS die, an SoC die, or the like. In some embodiments, the IC die 105 may be formed using a method described below with reference to FIGS. 17A-17C, and the detailed description of the IC die 105 is provided at that time. The encapsulants 107 and 109 may comprise suitable insulating materials. In some embodiments, the encapsulants 107 and 109 may comprise a same material. In other embodiments, the encapsulants 107 and 109 may comprise different materials. In some embodiments, the first IC die structure 101 further comprises a plurality of connectors 111 on a front side of the IC die 105, which electrically connect the IC package 100 to external components bonded to the connectors 111. In some embodiments, the first IC die structure 101 may be formed using a method described below with reference to FIGS. 20A and 20B, and the detailed description of the first IC die structure 101 is provided at that time.

The second IC die structure 103 comprises a die stack 113 bonded to a base structure 115. In some embodiments, the die stack 113 comprises IC dies $117_1$-$117_4$ bonded to one another in a pairwise manner, such that a backside of one IC die in a pair is bonded to a front side of another die in the pair. Furthermore, a front side of the IC die $117_1$ of the die stack 113 is bonded to the base structure 115 and a backside of the IC die $117_4$ is bonded to a backside of the IC die 105. In some embodiments, the IC dies $117_1$-$117_4$ may comprise a logic die, a memory die, a CPU, a GPU, an xPU, a MEMS die, an SoC die, or the like. In some embodiments, the IC dies $117_1$-$117_4$ may be formed using a method described below with reference to FIGS. 17A-17C, 18A and 18B, and the detailed description of the IC dies $117_1$-$117_4$ is provided at that time. The base structure 115 may comprise a semiconductor material, an insulating material, a combination thereof, or the like. In some embodiments, the base structure 115 may comprise a same material as the substrate of the IC dies 105 and $117_1$-$117_4$. In such embodiments, the base structure 115 and the IC dies 105 and $117_1$-$117_4$ may have substantially similar coefficients of thermal expansion (CTEs), which may prevent the damage of the IC package 100 due to the CTE mismatch. In some embodiments, the base structure 115 may not comprise active and/or passive devices on or in the base structure 115. In some embodiments, the IC dies $117_1$-$117_4$ are encapsulated in encapsulants $123_1$-$123_4$, respectively. In some embodiments, the encapsulants $123_1$-$123_4$ may comprise a suitable insulating material. In some embodiments, the encapsulants $123_1$-$123_4$ may comprise a same material. In other embodiments, the encapsulants $123_1$-$123_4$ may comprise different materials. In some embodiments, the die structure 103 further comprises stacked dummy structures 119, such that the die stack 113 is interposed between the adjacent stacked dummy structures 119. In some embodiments, each stacked dummy structure 119 comprises a stack of dummy structures $121_1$-$121_4$, such that the encapsulants $123_1$-$123_4$ are interposed between the dummy structures $121_1$-$121_4$ and the IC dies $117_1$-$117_4$, respectively. The dummy structures $121_1$-$121_4$ may comprise a semiconductor material, an insulating material, a combination thereof, or the like. In some embodiments, the dummy structures $121_1$-$121_4$ may comprise a same material as the substrates of the IC dies 105 and $117_1$-$117_4$. In such embodiments, the dummy structures $121_1$-$121_4$ and the IC dies 105 and $117_1$-$117_4$ may have substantially similar CTEs, which may prevent the damage of the IC package 100 due to the CTE mismatch. In some embodiments, the dummy structures $121_1$-$121_4$ may not comprise active and/or passive devices and may not provide addition electrical functionality to the IC package 100. In some embodiments, the stacked dummy structures 119 may be configured as heat dissipation structures that transfer heat away from the IC die 105 of the first IC die structure 101. Accordingly, the stacked dummy structures 119 may also be referred to as heat dissipation structures 119.

Referring further to FIGS. 1A and 1B, the stacked dummy structures 119 and the base structure 115 may have a rectangular shape in a top view. In some embodiments, three sidewalls of each stacked dummy structure 119 are substantially coplanar with respective three sidewalls of the base structure 115, such that a first width of the stacked dummy structures 119 is substantially equal to the a first width W1 of the base structure 115 and a second width W2 of the base structure 115 is greater than a second width W3 of the stacked dummy structures 119. In some embodiments, the width W1 may be between about 5 mm and about 10 mm. In some embodiments, the width W2 may be between about 7 mm and about 15 mm. In some embodiments, the width W3 may be between about 1 mm and about 4 mm. In some embodiments, a ratio W1/W2 may be between about 0.7 and about 0.6. In some embodiments, a ratio W1/W3 may be between about 5 and about 2.5. In some embodiments, a ratio W2/W3 may be between about 7 and about 3.75.

In the embodiment illustrated in FIGS. 1A and 1B, the first IC die structure 101 comprises a single IC die (such as the IC die 105), and the second IC die structure 103 comprises a single die stack (such as the die stack 113) comprising four IC dies (such as the IC dies $117_1$-$117_4$) and two dummy structures (such as the stacked dummy structures 119) each comprising a stack of four dummy structures (such as the dummy structures $121_1$-$121_4$). In other embodiments, the first IC die structure 101 may comprise more than one IC die, and the second IC die structure 103 may comprise more than one die stack comprising more or less than four IC dies and more or less than two dummy structures comprising stacks of more or less than four dummy structures, depending on design requirements for the IC package 100. In some embodiments, the IC package 100 may be formed using a method described below with reference to FIGS. 21A-21H, and the detailed description of the IC package 100 is provided at that time.

Figure 2A:
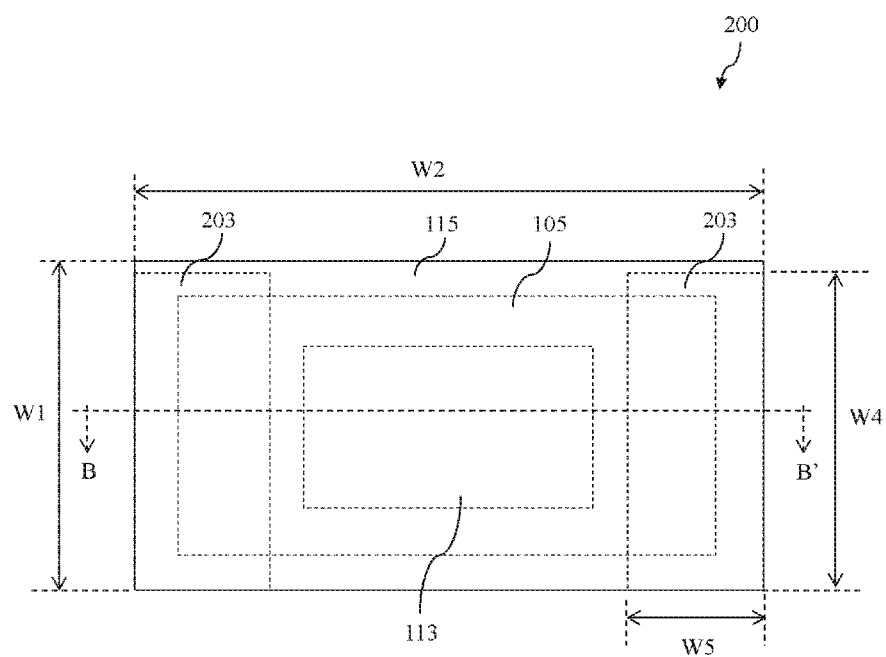
FIGS. 2A and 2B illustrate top and cross-sectional views of an integrated circuit package in accordance with some embodiments.
Figure 2B:
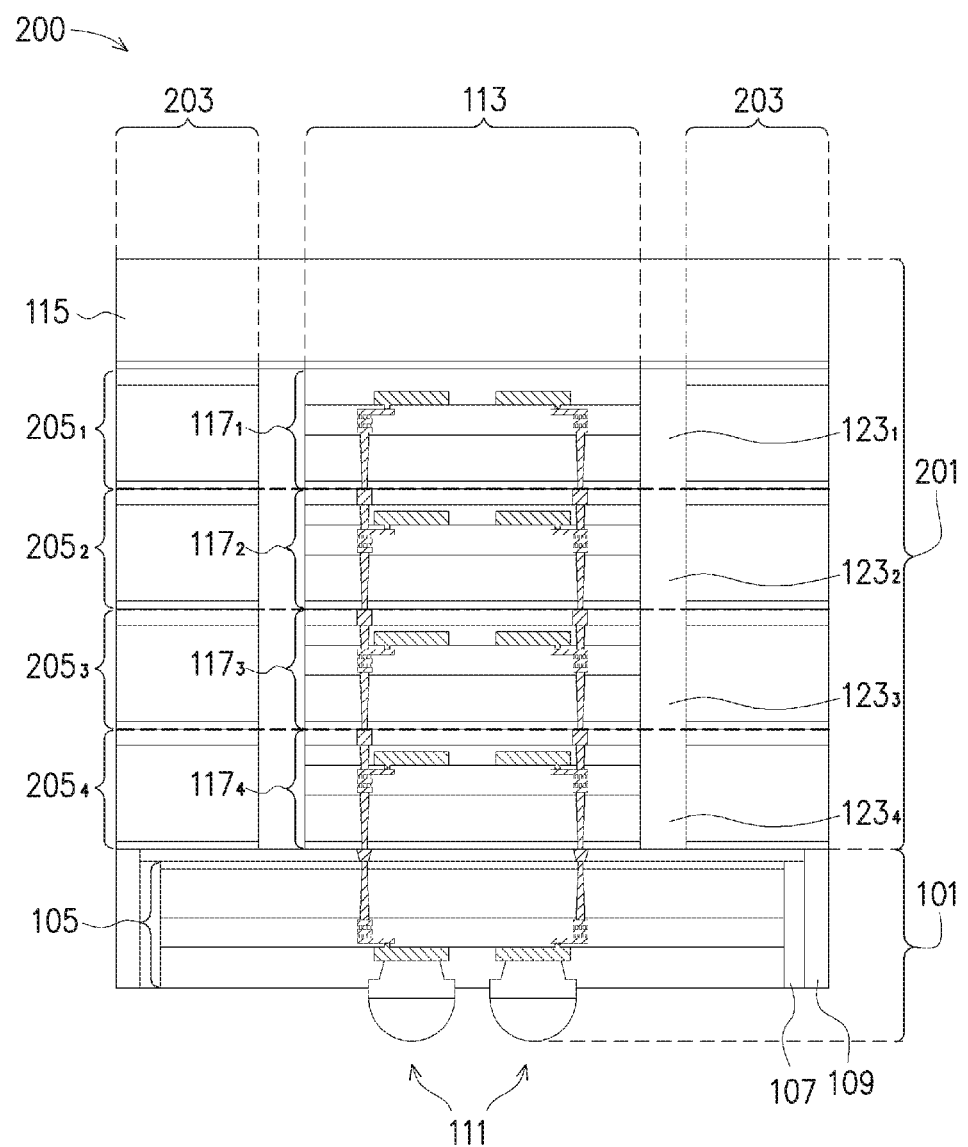

FIGS. 2A and 2B illustrate top and cross-sectional views of an IC package 200 in accordance with some embodiments. FIG. 2A illustrates a top view, while FIG. 2B illustrated a cross-sectional view along a line BB' in FIG. 2A. To highlight differences between the IC package 200 and the IC package 100 (see FIGS. 1A and 1B), the common features of these packages are labeled by same numerical references and their description is not repeated herein. In some embodiments, the IC package 200 comprises a first IC die structure 101 bonded to a second IC die structure 201. In some embodiments, the first IC die structure 101 is electrically connected to the second IC die structure 201. The second IC die structure 201 comprises a die stack 113 bonded to a base structure 115. In some embodiments, the die stack 113 comprises IC dies $117_1$-$117_4$ that are encapsulated in encapsulants $123_1$-$123_4$, respectively. In some embodiments, the second die structure 201 further comprises stacked dummy structures 203, such that the die stack 113 is interposed between the adjacent stacked dummy structures 203. In some embodiments, each stacked dummy structures 203 comprises a stack of dummy structures $205_1$-$205_4$, such that the encapsulants $123_1$-$123_4$ are interposed between the dummy structures $205_1$-$205_4$ and the IC dies $117_1$-$117_4$, respectively. In some embodiments, the dummy structures $205_1$-$205_4$ may be formed using similar materials and methods as the dummy structures $121_1$-$121_4$ described above with reference to FIGS. 1A and 1B, and the description is not repeated herein. In some embodiments, the stacked dummy structures 203 may be configured as heat dissipation structures that transfer heat away from the IC die 105 of the first IC die structure 101. Accordingly, the stacked dummy structures 203 may also be referred to as heat dissipation structures 203.

Referring further to FIGS. 2A and 2B, the stacked dummy structures 203 and the base structure 115 may have a rectangular shape in a top view. In some embodiments, two sidewalls of each stacked dummy structure 203 are substantially coplanar with respective two sidewalls of the base structure 115. In some embodiments, a first width W4 of the stacked dummy structures 203 is less than a first width W1 of the base structure 115 and a second width W5 of the stacked dummy structures 203 is less than a second width W2 of the base structure 115. In some embodiments, the width W4 may be between about 4.0 mm and about 9.5 mm. In some embodiments, the width W5 may be between about 1 mm and about 4 mm. In some embodiments, a ratio W1/W4 may be between about 1.25 and about 1.5. In some embodiments, a ratio W1/W5 may be between about 5 and about 2.5. In some embodiments, a ratio W2/W4 may be between about 1.75 and about 1.5. In some embodiments, a ratio W2/W5 may be between about 7 and about 3.75. In some embodiments, a ratio W4/W5 may be between about 5 and about 2.5. In some embodiments, the IC package 200 may be formed using a method described below with reference to FIGS. 21A-21H, and the detailed description of the IC package 200 is provided at that time.

Figure 3A:
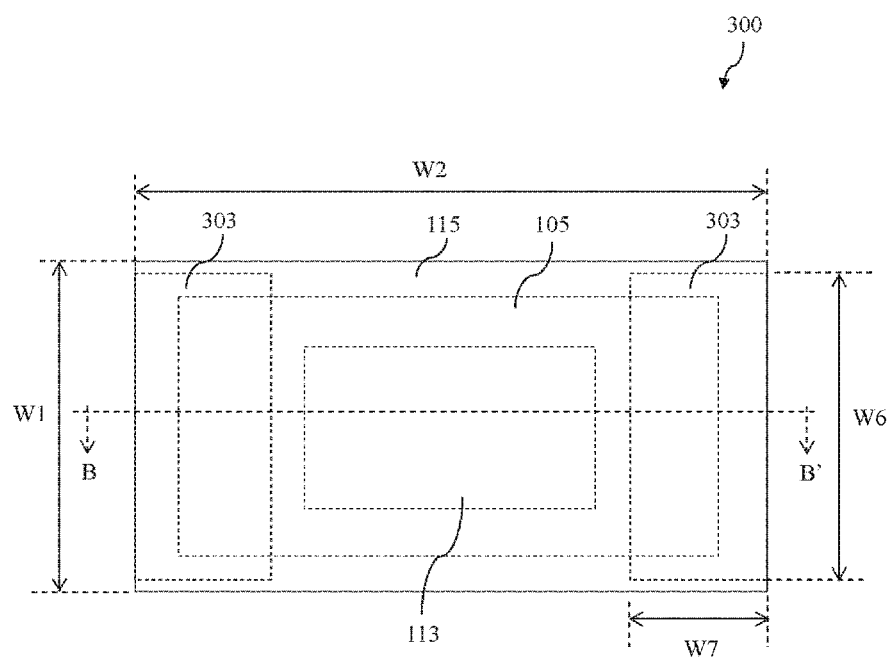
FIGS. 3A and 3B illustrate top and cross-sectional views of an integrated circuit package in accordance with some embodiments.
Figure 3B:
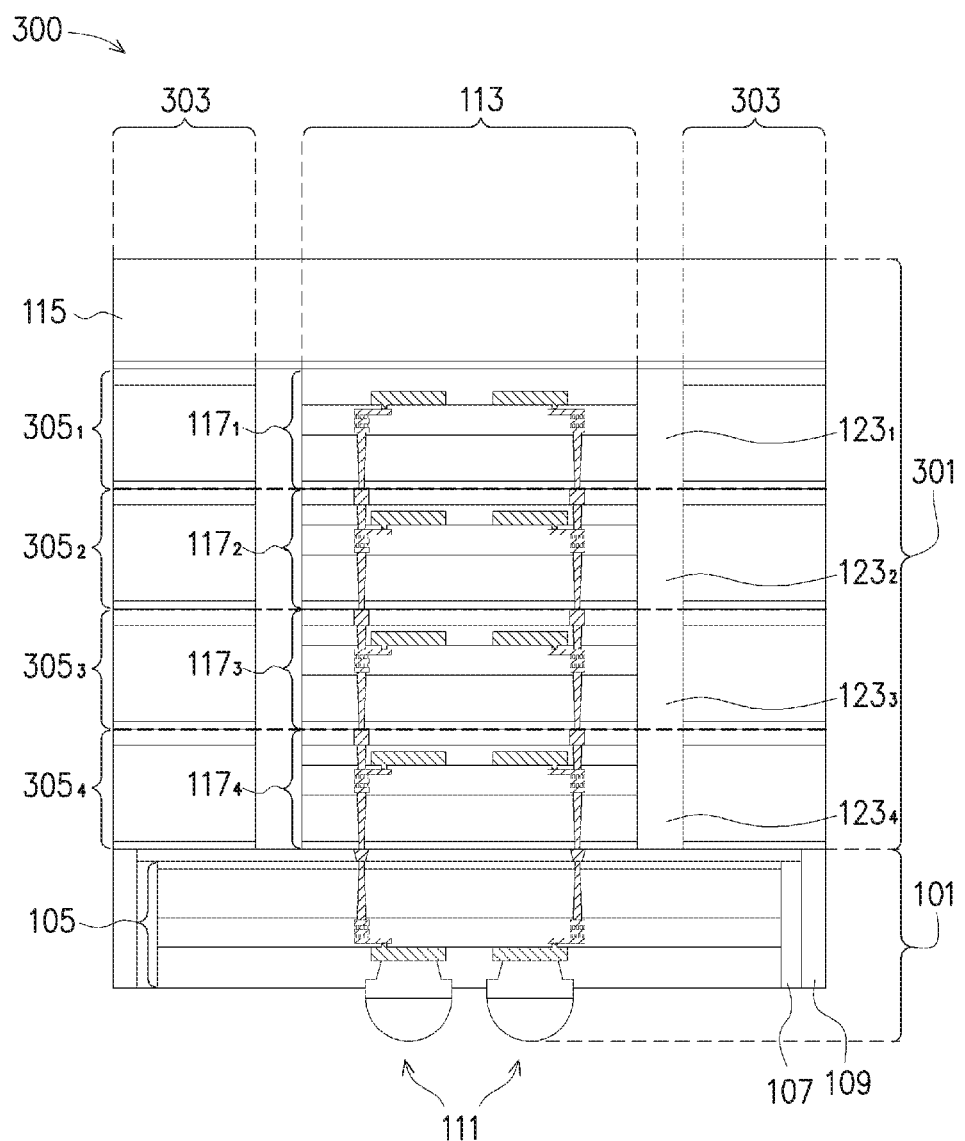

FIGS. 3A and 3B illustrate top and cross-sectional views of an IC package 300 in accordance with some embodiments. FIG. 3A illustrates a top view, while FIG. 3B illustrated a cross-sectional view along a line BB' in FIG. 3A. To highlight differences between the IC package 300 and the IC package 100 (see FIGS. 1A and 1B), the common features of these packages are labeled by same numerical references and their description is not repeated herein. In some embodiments, the IC package 300 comprises a first IC die structure 101 bonded to a second IC die structure 301. In some embodiments, the first IC die structure 101 is electrically connected to the second IC die structure 301. The second IC die structure 301 comprises a die stack 113 bonded to a base structure 115. In some embodiments, the die stack 113 comprises IC dies $117_1$-$117_4$ that are encapsulated in encapsulants $123_1$-$123_4$, respectively. In some embodiments, the die structure 103 further comprises stacked dummy structures 303, such that the die stack 113 is interposed between the adjacent stacked dummy structures 303. In some embodiments, each stacked dummy structure 303 comprises a stack of dummy structures $305_1$-$305_4$, such that the encapsulants $123_1$-$123_4$ are interposed between the dummy structures $305_1$-$305_4$ and the IC dies $117_1$-$117_4$, respectively. In some embodiments, the dummy structures $305_1$-$305_4$ may be formed using similar materials and methods as the dummy structures $121_1$-$121_4$ described above with reference to FIGS. 1A and 1B, and the description is not repeated herein. In some embodiments, the stacked dummy structures 303 may be configured as heat dissipation structures that transfer heat away from the IC die 105 of the first IC die structure 101. Accordingly, the stacked dummy structures 303 may also be referred to as heat dissipation structures 303.

Referring further to FIGS. 3A and 3B, the stacked dummy structures 303 and the base structure 115 may have a rectangular shape in a top view. In some embodiments, a sidewall of each stacked dummy structure 303 is substantially coplanar with a respective sidewall of the base structure 115. In some embodiments, a first width W6 of the stacked dummy structures 303 is less than a first width W1 of the base structure 115 and a second width W7 of the stacked dummy structures 303 is less than a second width W2 of the base structure 115. In some embodiments, the width W6 may be between about 3 mm and about 9 mm. In some embodiments, the width W7 may be between about 1 mm and about 4 mm. In some embodiments, a ratio W1/W6 may be between about 1.6 and about 1.1. In some embodiments, a ratio W1/W7 may be between about 5 and about 2.5. In some embodiments, a ratio W2/W6 may be between about 2.3 and about 1.6. In some embodiments, a ratio W2/W7 may be between about 7.0 and about 3.75. In some embodiments, a ratio W6/W7 may be between about 3 and about 2.25. In some embodiments, the IC package 300 may be formed using a method described below with reference to FIGS. 21A-21H, and the detailed description of the IC package 300 is provided at that time.

Figure 4A:
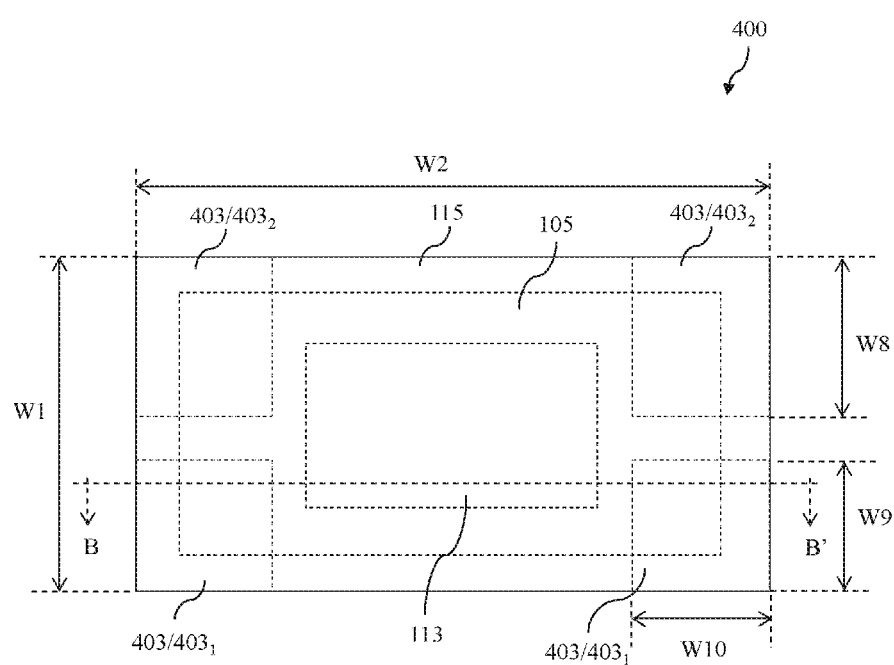
FIGS. 4A and 4B illustrate top and cross-sectional views of an integrated circuit package in accordance with some embodiments.
Figure 4B:
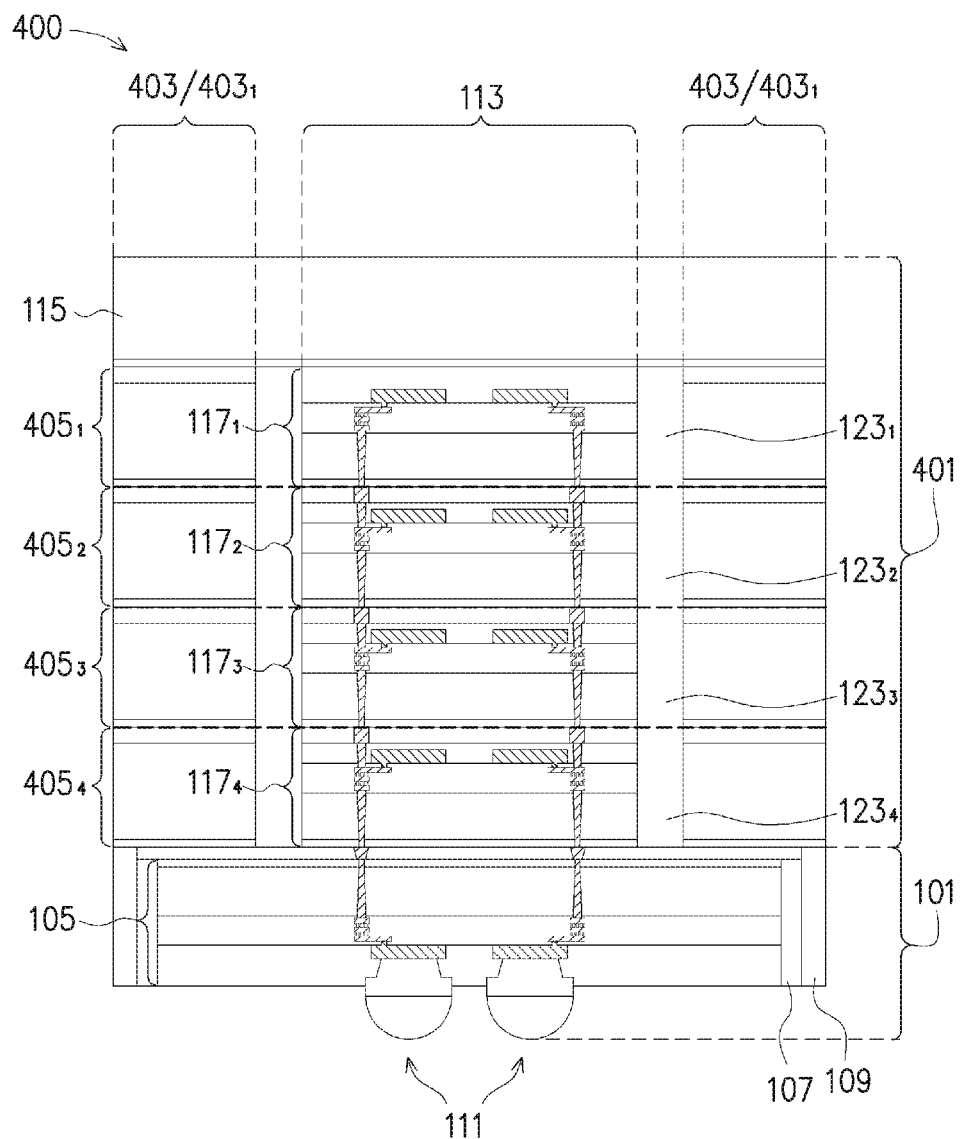

FIGS. 4A and 4B illustrate top and cross-sectional views of an IC package 400 in accordance with some embodiments. FIG. 4A illustrates a top view, while FIG. 4B illustrated a cross-sectional view along a line BB' in FIG. 4A. To highlight differences between the IC package 400 and the IC package 100 (see FIGS. 1A and 1B), the common features of these packages are labeled by same numerical references and their description is not repeated herein. In some embodiments, the IC package 400 comprises a first IC die structure 101 bonded to a second IC die structure 401. In some embodiments, the first IC die structure 101 is electrically connected to the second IC die structure 401. The second IC die structure 401 comprises a die stack 113 bonded to a base structure 115. In some embodiments, the die stack 113 comprises IC dies $117_1$-$117_4$ that are encapsulated in encapsulants $123_1$-$123_4$, respectively. In some embodiments, the second IC die structure 401 further comprises stacked dummy structures 403, such that the die stack 113 is interposed between the adjacent stacked dummy structures 403. In some embodiments, each stacked dummy structure 403 comprises a stack of dummy structures $405_1$-$405_4$, such that the encapsulants $123_1$-$123_4$ are interposed between the dummy structures $405_1$-$405_4$ and the IC dies $117_1$-$117_4$, respectively. In some embodiments, the dummy structures $405_1$-$405_4$ may be formed using similar materials and methods as the dummy structures $121_1$-$121_4$ described above with reference to FIGS. 1A and 1B, and the description is not repeated herein. In some embodiments, the stacked dummy structures 403 may be configured as heat dissipation structures that transfer heat away from the IC die 105 of the first IC die structure 101. Accordingly, the stacked dummy structures 403 may also be referred to as heat dissipation structures 403.

Referring further to FIGS. 4A and 4B, the stacked dummy structures 403 and the base structure 115 may have a rectangular shape in a top view. In some embodiments, two sidewalls of each stacked dummy structure 403 are substantially coplanar with respective two sidewall of the base structure 115. In some embodiments, the stacked dummy structures 403 (such as stacked dummy structures $403_1$ and $403_2$) disposed at opposite corners of the base structure 115 have different dimensions. In some embodiments, a first width W9 of the stacked dummy structures $403_1$ is less than a first width W1 of the base structure 115. In some embodiments, a first width W8 of the stacked dummy structures $403_2$ is less than the first width W1 of the base structure 115. In some embodiments, the width W8 is different from the width W9. In other embodiments, the width W8 may be substantially equal to the width W9. In some embodiments, a second width of the stacked dummy structures $403_1$ may equal to a second width of the stacked dummy structures $403_2$ and may equal to a width W10. In some embodiments, the width W10 is less than a second width W2 of the base structure 115. In some embodiment, a sum of the widths W8 and W9 is less than the width W1. In some embodiments, the width W8 may be between about 2 mm and about 4.5 mm. In some embodiments, the width W9 may be between about 2 mm and about 4.5 mm. In some embodiments, the width W10 may be between about 1 mm and about 4 mm. In some embodiments, a ratio W1/W8 may be between about 2.5 and about 2. In some embodiments, a ratio W1/W9 may be between about 2.5 and about 2. In some embodiments, a ratio W1/W10 may be between about 5 and about 2.5. In some embodiments, a ratio W2/W8 may be between about 3.5 and about 3. In some embodiments, a ratio W2/W9 may be between about 3.5 and about 3. In some embodiments, a ratio W2/W10 may be between about 7 and about 3.75. In some embodiments, a ratio W8/W9 may be between about 1 and about 2.5. In some embodiments, a ratio W8/W10 may be between about 2 and about 1. In some embodiments, a ratio W9/W10 may be between about 2 and about 1. In some embodiments, the IC package 400 may be formed using a method described below with reference to FIGS. 21A-21H, and the detailed description of the IC package 400 is provided at that time.

Figure 5A:
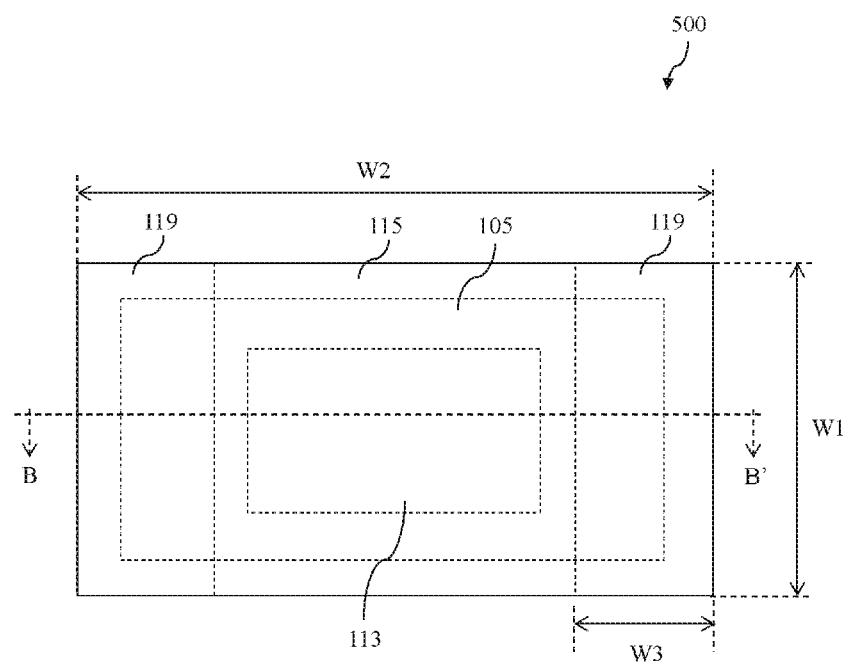
FIGS. 5A and 5B illustrate top and cross-sectional views of an integrated circuit package in accordance with some embodiments.
Figure 5B:
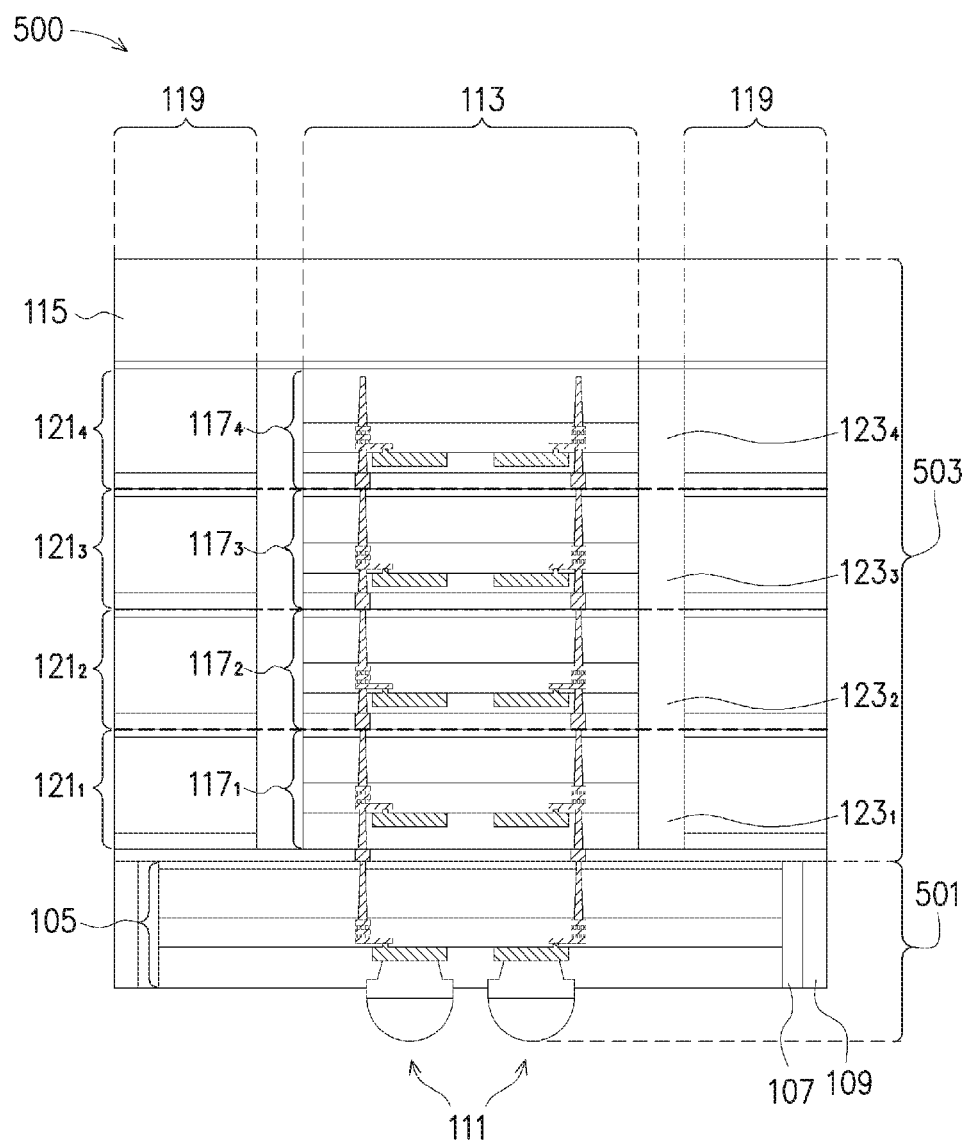

FIGS. 5A and 5B illustrate top and cross-sectional views of an IC package 500 in accordance with some embodiments. FIG. 5A illustrates a top view, while FIG. 5B illustrated a cross-sectional view along a line BB' in FIG. 5A. To highlight differences between the IC package 500 and the IC package 100 (see FIGS. 1A and 1B), the common features of these packages are labeled by same numerical references and their description is not repeated herein. In some embodiments, the IC package 500 comprises a first IC die structure 501 bonded to a second IC die structure 503. In some embodiments, the first IC die structure 501 is electrically connected to the second IC die structure 503. In some embodiment, the first IC die structure 501 is similar to the first IC die structure 101 (see FIGS. 1A and 1B) with the distinction that the first IC die structure 501 and the first IC die structure 101 have different backside structures. In some embodiments, the IC die structure 501 may be formed using a method described below with reference to FIGS. 19A-19G, and the detailed description of the IC die structure 501 is provided at that time. In some embodiments, the second IC die structure 503 is similar to the second IC die structure 103 (see FIGS. 1A and 1B) with the distinction that the structure comprising the die stack 113, the stacked dummy structures 119, and the encapsulants $123_1$-$123_4$ is vertically flipped, such that a backside of the IC die $117_4$ of the die stack 113 and the dummy structures $121_4$ of the stacked dummy structures 119 are bonded to the base structure 115. Furthermore, a front side of the IC die $117_1$ of the die stack 113 is bonded to the backside of the IC die 105. In some embodiments, the IC package 500 may be formed using a method described below with reference to FIGS. 22A-22D, and the detailed description of the IC package 500 is provided at that time.

Figure 6A:
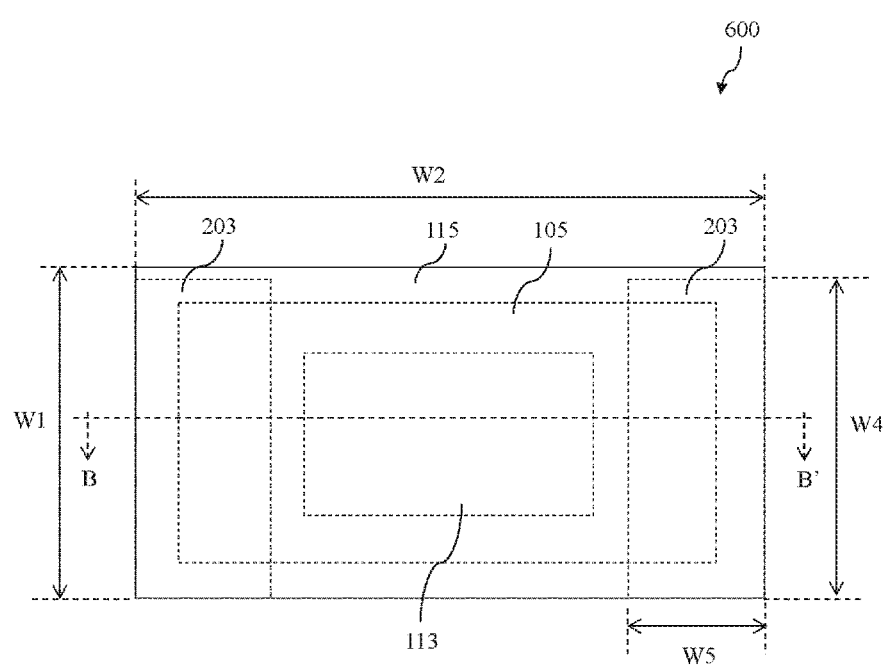
FIGS. 6A and 6B illustrate top and cross-sectional views of an integrated circuit package in accordance with some embodiments.
Figure 6B:
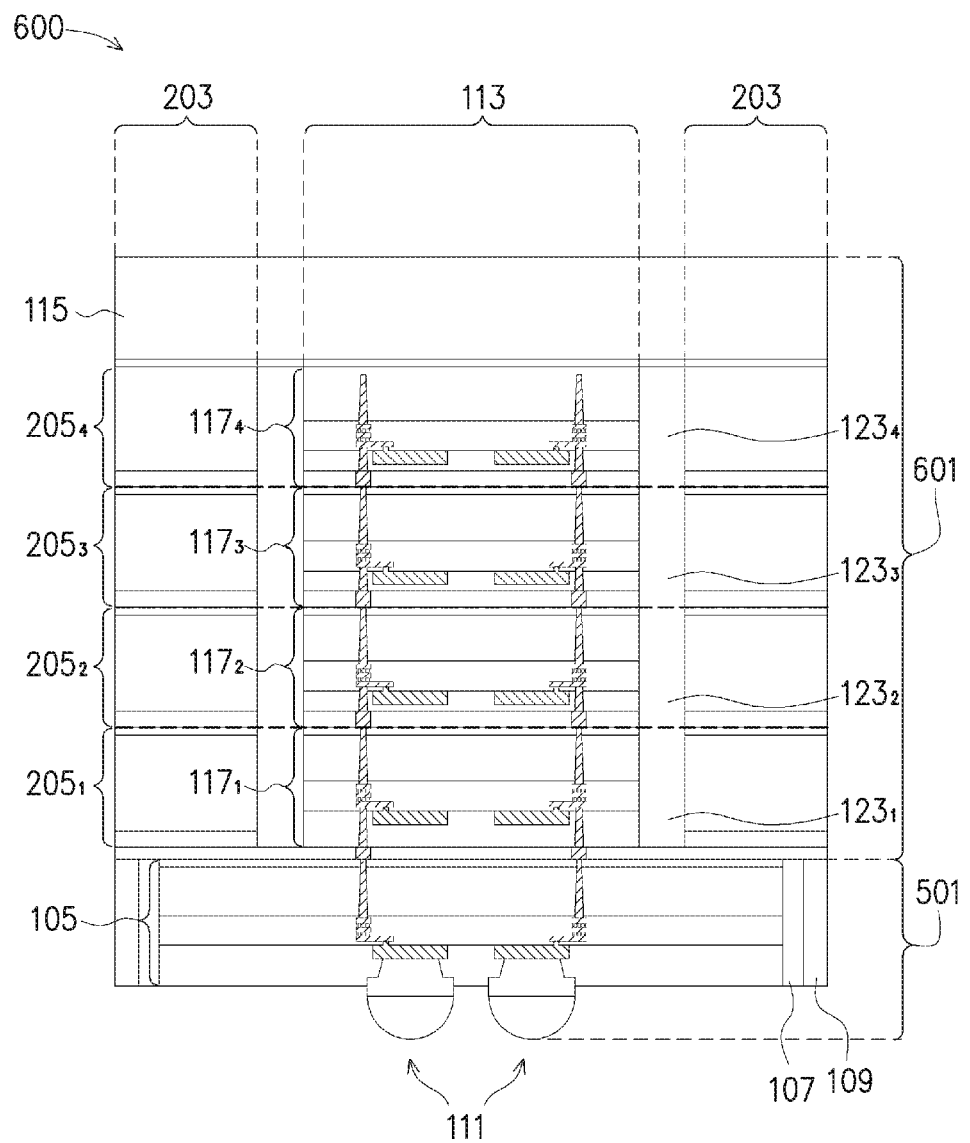

FIGS. 6A and 6B illustrate top and cross-sectional views of an IC package 600 in accordance with some embodiments. FIG. 6A illustrates a top view, while FIG. 6B illustrated a cross-sectional view along a line BB' in FIG. 6A. To highlight differences between the IC package 600 and the IC package 200 (see FIGS. 2A and 2B), the common features of these packages are labeled by same numerical references and their description is not repeated herein. In some embodiments, the IC package 600 comprises a first IC die structure 501 bonded to a second IC die structure 601. In some embodiments, the first IC die structure 501 is electrically connected to the second IC die structure 601. In some embodiment, the first IC die structure 501 is similar to the first IC die structure 101 (see FIGS. 2A and 2B) with the distinction that the first IC die structure 501 and the first IC die structure 101 have different backside structures. In some embodiments, the IC die structure 501 may be formed using a method described below with reference to FIGS. 19A-19G, and the detailed description of the IC die structure 501 is provided at that time. In some embodiments, the second IC die structure 601 is similar to the second IC die structure 201 (see FIGS. 2A and 2B) with the distinction that the structure comprising the die stack 113, the stacked dummy structures 203, and the encapsulants $123_1$-$123_4$ is vertically flipped, such that a backside of the IC die $117_4$ of the die stack 113 and the dummy structures $205_4$ of the stacked dummy structures 203 are bonded to the base structure 115. Furthermore, a front side of the IC die $117_1$ of the die stack 113 is bonded to the backside of the IC die 105. In some embodiments, the IC package 600 may be formed using a method described below with reference to FIGS. 22A-22D, and the detailed description of the IC package 600 is provided at that time.

Figure 7A:
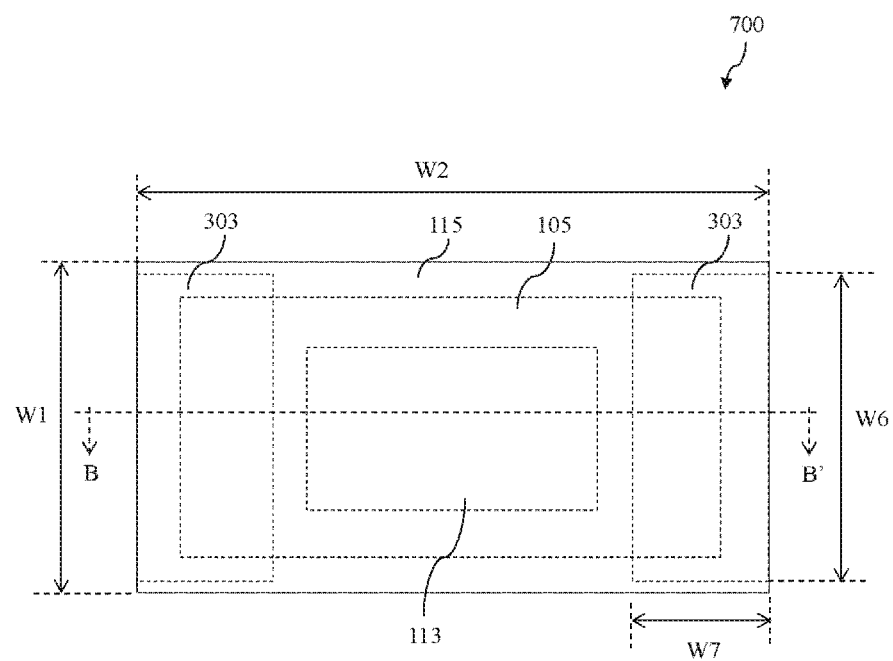
FIGS. 7A and 7B illustrate top and cross-sectional views of an integrated circuit package in accordance with some embodiments.
Figure 7B:
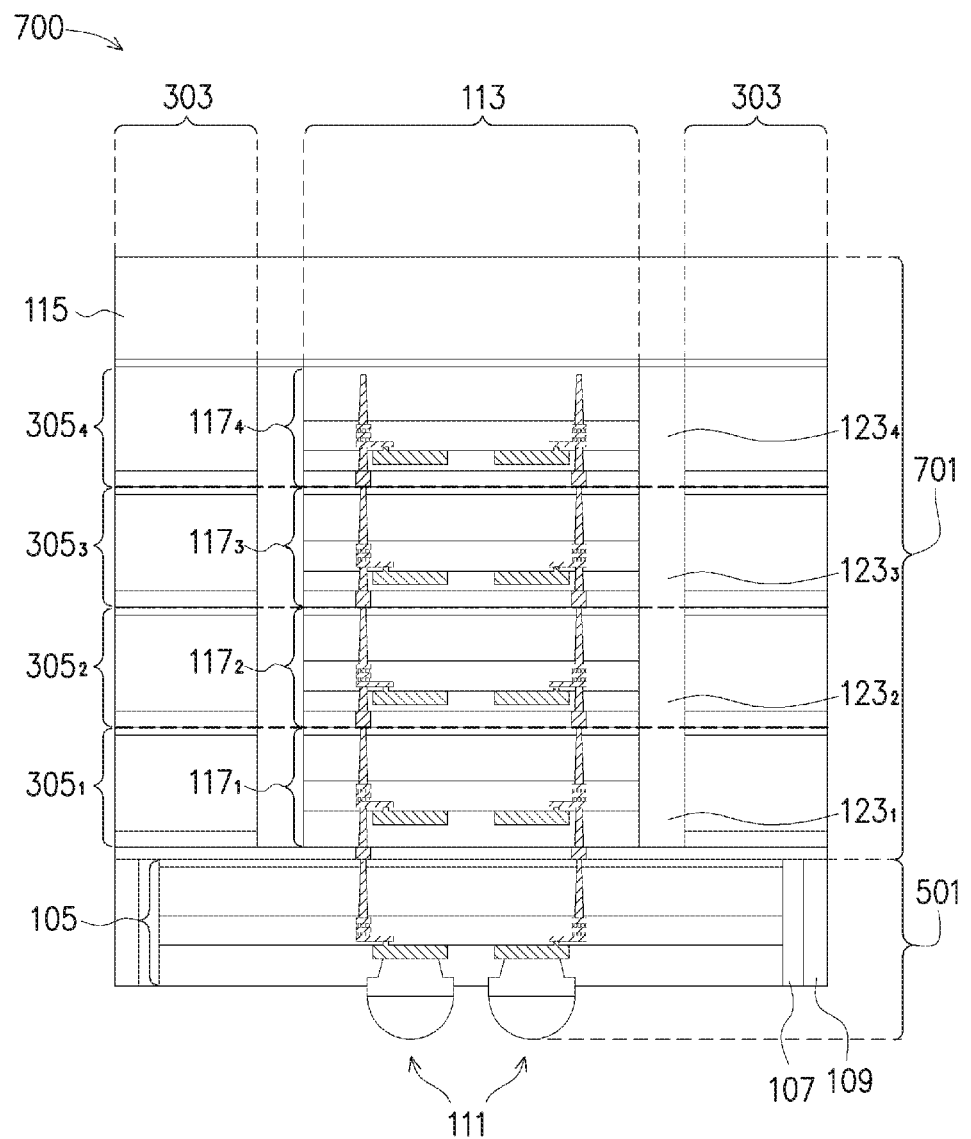

FIGS. 7A and 7B illustrate top and cross-sectional views of an IC package 700 in accordance with some embodiments. FIG. 7A illustrates a top view, while FIG. 7B illustrated a cross-sectional view along a line BB' in FIG. 7A. To highlight differences between the IC package 700 and the IC package 300 (see FIGS. 3A and 3B), the common features of these packages are labeled by same numerical references and their description is not repeated herein. In some embodiments, the IC package 700 comprises a first IC die structure 501 bonded to a second IC die structure 701. In some embodiments, the first IC die structure 501 is electrically connected to the second IC die structure 701. In some embodiment, the first IC die structure 501 is similar to the first IC die structure 101 (see FIGS. 3A and 3B) with the distinction that the first IC die structure 501 and the first IC die structure 101 have different backside structures. In some embodiments, the IC die structure 501 may be formed using a method described below with reference to FIGS. 19A-19G, and the detailed description of the IC die structure 501 is provided at that time. In some embodiments, the second IC die structure 701 is similar to the second IC die structure 301 (see FIGS. 3A and 3B) with the distinction that the structure comprising the die stack 113, the stacked dummy structures 303, and the encapsulants $123_1$-$123_4$ is vertically flipped, such that a backside of the IC die $117_4$ of the die stack 113 and the dummy structures $305_4$ of the stacked dummy structures 303 are bonded to the base structure 115. Furthermore, a front side of the IC die $117_1$ of the die stack 113 is bonded to the backside of the IC die 105. In some embodiments, the IC package 700 may be formed using a method described below with reference to FIGS. 22A-22D, and the detailed description of the IC package 700 is provided at that time.

Figure 8A:
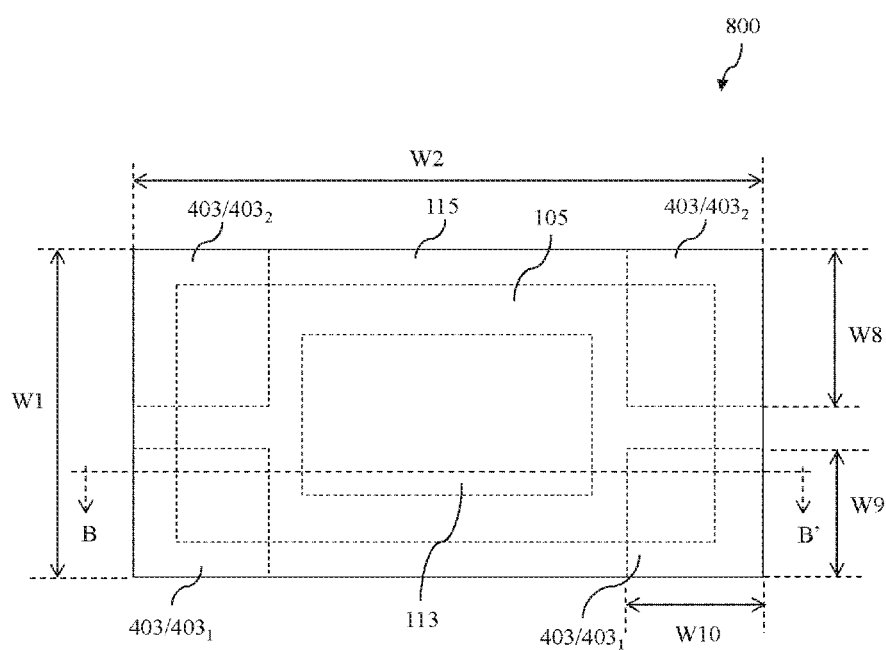
FIGS. 8A and 8B illustrate top and cross-sectional views of an integrated circuit package in accordance with some embodiments.
Figure 8B:
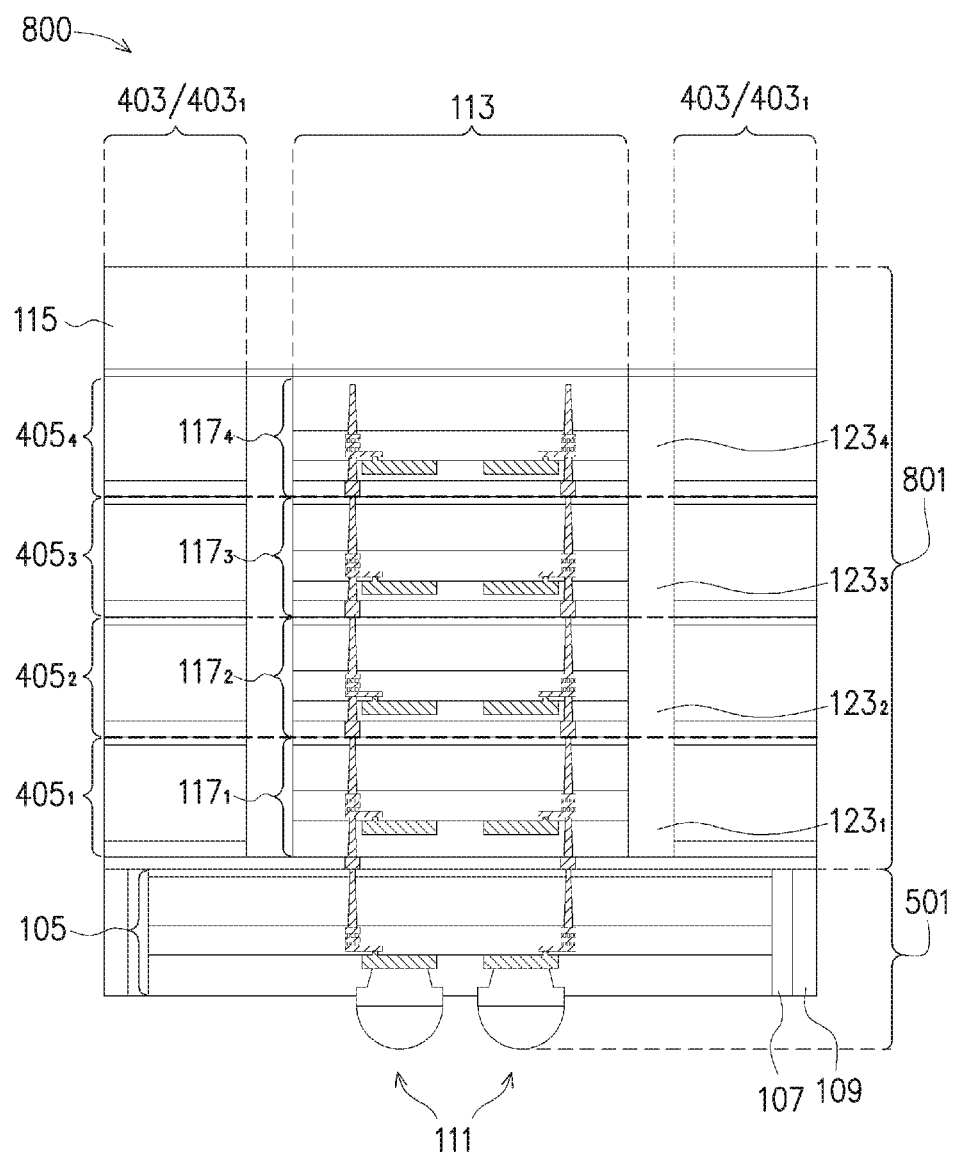

FIGS. 8A and 8B illustrate top and cross-sectional views of an IC package 800 in accordance with some embodiments. FIG. 8A illustrates a top view, while FIG. 8B illustrated a cross-sectional view along a line BB' in FIG. 8A. To highlight differences between the IC package 800 and the IC package 400 (see FIGS. 4A and 4B), the common features of these packages are labeled by same numerical references and their description is not repeated herein. In some embodiments, the IC package 800 comprises a first IC die structure 501 bonded to a second IC die structure 801. In some embodiments, the first IC die structure 501 is electrically connected to the second IC die structure 801. In some embodiment, the first IC die structure 501 is similar to the first IC die structure 101 (see FIGS. 4A and 4B) with the distinction that the first IC die structure 501 and the first IC die structure 101 have different backside structures. In some embodiments, the IC die structure 501 may be formed using a method described below with reference to FIGS. 19A-19G, and the detailed description of the IC die structure 501 is provided at that time. In some embodiments, the second IC die structure 801 is similar to the second IC die structure 401 (see FIGS. 4A and 4B) with the distinction that the structure comprising the die stack 113, the stacked dummy structures 403, and the encapsulants $123_1$-$123_4$ is vertically flipped, such that a backside of the IC die $117_4$ of the die stack 113 and the dummy structures $405_4$ of the stacked dummy structures 403 are bonded to the base structure 115. Furthermore, a front side of the IC die $117_1$ of the die stack 113 is bonded to the backside of the IC die 105. In some embodiments, the IC package 800 may be formed using a method described below with reference to FIGS. 22A-22D, and the detailed description of the IC package 800 is provided at that time.

Figure 9A:
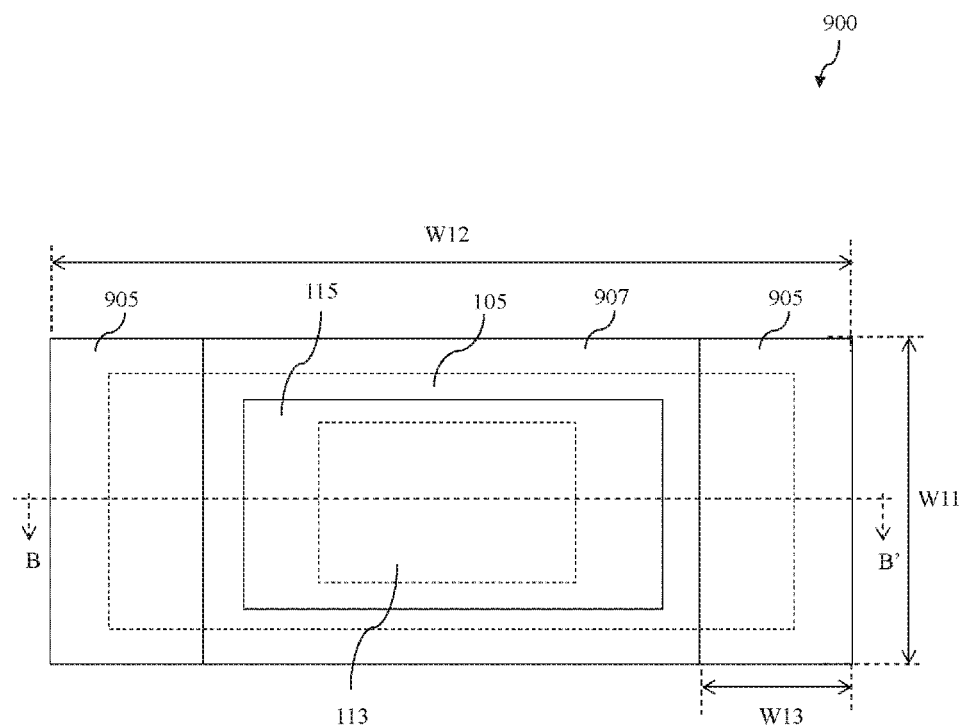

FIGS. 9A and 9B illustrate top and cross-sectional views of an IC package 900 in accordance with some embodiments. FIG. 9A illustrates a top view, while FIG. 9B illustrated a cross-sectional view along a line BB' in FIG. 9A. To highlight differences between the IC package 900 and the IC package 100 (see FIGS. 1A and 1B), the common features of these packages are labeled by same numerical references and their description is not repeated herein. In some embodiments, the IC package 900 comprises a first IC die structure 901 bonded to a second IC die structure 903. In some embodiments, the first IC die structure 901 is electrically connected to the second IC die structure 903. In some embodiments, the first IC die structure 901 is similar to the first the IC structure 101 (see FIGS. 1A and 1B) with the distinction that the IC die 105 is encapsulated only in the encapsulant 107 and the encapsulant 109 is omitted. In some embodiments, the IC die structure 901 may be formed using a method described below with reference to FIGS. 20A and 20B, and the detailed description of the IC die structure 901 is provided at that time.

The second IC die structure 903 comprises a die stack 113 bonded to a base structure 115. In some embodiments, the die stack 113 comprises IC dies $117_1$-$117_4$ that are encapsulated in encapsulants $123_1$-$123_4$, respectively. In some embodiments, second IC die structure 903 further comprises an encapsulant 907 encapsulating the base structure 115, the die stack 113, and the encapsulants $123_1$-$123_4$. In some embodiments, the encapsulant 907 may comprise a suitable insulating material. In some embodiments, the encapsulant 907 and encapsulants $123_1$-$123_4$ may comprise a same material. In other embodiments, the encapsulant 907 and encapsulants $123_1$-$123_4$ may comprise different materials. In some embodiments, the second IC die structure 903 further comprises dummy structures 905, such that the die stack 113 is interposed between adjacent dummy structures 905. In some embodiments, the dummy structures 905 may be formed using similar materials and methods as the dummy structures $121_1$-$121_4$, described above with reference to FIGS. 1A and 1B, and the description is not repeated herein. In some embodiments, the dummy structures 905 may be configured as heat dissipation structures that transfer heat away from the IC die 105 of the first IC die structure 901. Accordingly, the dummy structures 905 may also be referred to as heat dissipation structures 905.

Referring further to FIGS. 9A and 9B, the dummy structures 905 and the first IC die structure 901 may have a rectangular shape in a top view. In some embodiments, three sidewalls of each dummy structure 905 are substantially coplanar with respective three sidewalls of the first IC die structure 901. In some embodiments, a first width of the dummy structures 905 is substantially equal to a first width W11 of the first IC die structure 901 and a second width W13 of the dummy structures 905 is less than a second width W12 of the first IC die structure 901. In some embodiments, the width W11 may be between about 5 mm and about 10 mm. In some embodiments, the width W12 may be between about 7 mm and about 15 mm. In some embodiments, the width W13 may be between about 1 mm and about 4 mm. In some embodiments, a ratio W11/W12 may be between about 0.7 and about 0.6. In some embodiments, a ratio W11/W13 may be between about 5 and about 2.5. In some embodiments, a ratio W12/W13 may be between about 7 and about 3.75. In some embodiments, the IC package 900 may be formed using a method described below with reference to FIGS. 23A-23F, and the detailed description of the IC package 900 is provided at that time.

Figure 10A:
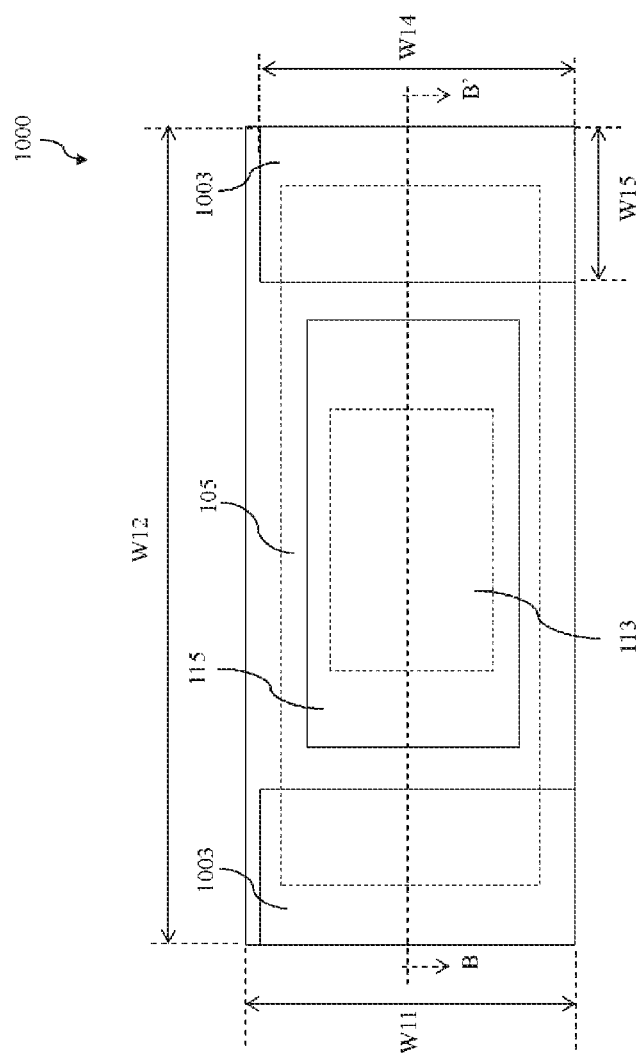

FIGS. 10A and 10B illustrate top and cross-sectional views of an IC package 1000 in accordance with some embodiments. FIG. 10A illustrates a top view, while FIG. 10B illustrated a cross-sectional view along a line BB' in FIG. 10A. To highlight differences between the IC package 1000 and the IC package 900 (see FIGS. 9A and 9B), the common features of these packages are labeled by same numerical references and their description is not repeated herein. In some embodiments, the IC package 1000 comprises a first IC die structure 901 bonded to a second IC die structure 1001. In some embodiments, the first IC die structure 901 is electrically connected to the second IC die structure 1001.

In some embodiments, the second IC die structure 1001 comprises a die stack 113 bonded to a base structure 115. In some embodiments, the die stack 113 comprises IC dies $117_1$-$117_4$ that are encapsulated in encapsulants $123_1$-$123_4$, respectively. In some embodiments, the second IC die structure 1001 further comprises an encapsulant 907 encapsulating the base structure 115, the die stack 113, and the encapsulants $123_1$-$123_4$. In some embodiments, the second IC die structure 1001 further comprises dummy structures 1003, such that the die stack 113 is interposed between adjacent dummy structures 1003. In some embodiments, the dummy structures 1003 may be formed using a similar materials and methods as the dummy structures 905 described above with reference to FIGS. 9A and 9B, and the description is not repeated herein. In some embodiments, the dummy structures 1003 may be configured as heat dissipation structures that transfer heat away from the IC die 105 of the first IC die structure 901. Accordingly, the dummy structures 1003 may also be referred to as heat dissipation structures 1003.

Referring further to FIGS. 10A and 10B, the dummy structures 1003 and the first IC die structure 901 may have a rectangular shape in a top view. In some embodiments, two sidewalls of each dummy structure 1003 are substantially coplanar with respective two sidewalls of the first IC die structure 901. In some embodiments, a first width W14 of the dummy structures 1003 is less than a first width W11 of the first IC die structure 901 and a second width W15 of the dummy structures 1003 is less than a second width W12 of the first IC die structure 901. In some embodiments, the width W14 may be between about 4 mm and about 9.5 mm. In some embodiments, the width W15 may be between about 1 mm and about 4 mm. In some embodiments, a ratio W11/W14 may be between about 1.25 and about 1.5. In some embodiments, a ratio W11/W15 may be between about 5 and about 2.5. In some embodiments, a ratio W12/W14 may be between about 1.75 and about 1.5. In some embodiments, a ratio W12/W15 may be between about 7 and about 3.75. In some embodiments, a ratio W14/W15 may be between about 5 and about 2.5. In some embodiments, the IC package 1000 may be formed using a method described below with reference to FIGS. 23A-23F, and the detailed description of the IC package 1000 is provided at that time.

Figure 11A:
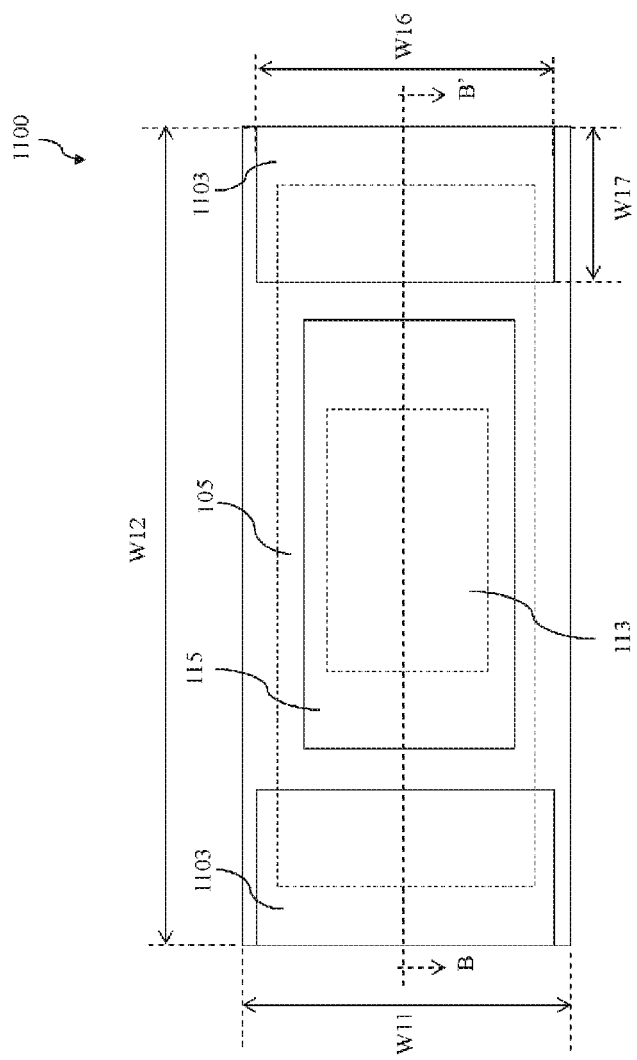
FIGS. 11A and 11B illustrate top and cross-sectional views of an integrated circuit package in accordance with some embodiments.
Figure 11B:
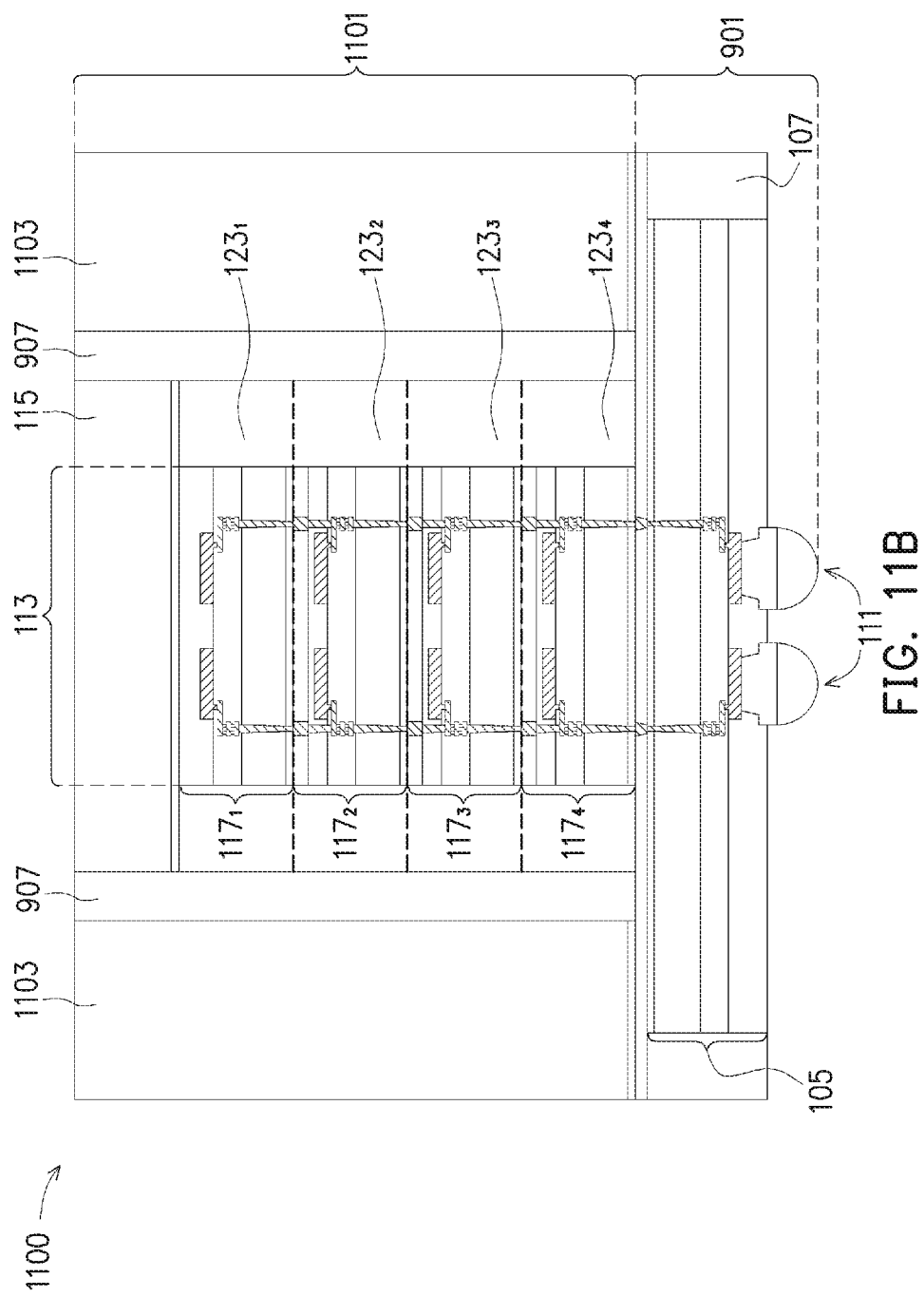

FIGS. 11A and 11B illustrate top and cross-sectional views of an IC package 1100 in accordance with some embodiments. FIG. 11A illustrates a top view, while FIG. 11B illustrated a cross-sectional view along a line BB' in FIG. 11A. To highlight differences between the IC package 1100 and the IC package 900 (see FIGS. 9A and 9B), the common features of these packages are labeled by same numerical references and their description is not repeated herein. In some embodiments, the IC package 1100 comprises a first IC die structure 901 bonded to a second IC die structure 1101. In some embodiments, the first IC die structure 901 is electrically connected to the second IC die structure 1101.

In some embodiments, the second IC die structure 1101 comprises a die stack 113 bonded to a base structure 115. In some embodiments, the die stack 113 comprises IC dies $117_1$-$117_4$ that are encapsulated in encapsulants $123_1$-$123_4$, respectively. In some embodiments, the second IC die structure 1101 further comprises an encapsulant 907 encapsulating the base structure 115, the die stack 113, and the encapsulants $123_1$-$123_4$. In some embodiments, the second IC die structure 1101 further comprises dummy structures 1103, such that the die stack 113 is interposed between adjacent dummy structures 1103. In some embodiments, the dummy structures 1103 may be formed using a similar materials and methods as the dummy structures 905 described above with reference to FIGS. 9A and 9B, and the description is not repeated herein. In some embodiments, the dummy structures 1103 may be configured as heat dissipation structures that transfer heat away from the IC die 105 of the first IC die structure 901. Accordingly, the dummy structures 1103 may also be referred to as heat dissipation structures 1103.

Referring further to FIGS. 11A and 11B, the dummy structures 1103 and the first IC die structure 901 may have a rectangular shape in a top view. In some embodiments, a sidewall of each dummy structure 1103 is substantially coplanar with a respective sidewall of the first IC die structure 901. In some embodiments, a first width W16 of the dummy structures 1103 is less than a first width W11 of the first IC die structure 901 and a second width W17 of the dummy structures 1103 is less than a second width W12 of the first IC die structure 901. In some embodiments, the width W16 may be between about 3 mm and about 9 mm. In some embodiments, the width W17 may be between about 1 mm and about 4 mm. In some embodiments, a ratio W11/W16 may be between about 1.6 and about 1.1. In some embodiments, a ratio W11/W17 may be between about 5 and about 2.5. In some embodiments, a ratio W12/W16 may be between about 2.3 and about 1.6. In some embodiments, a ratio W12/W17 may be between about 7 and about 3.75. In some embodiments, a ratio W16/W17 may be between about 3 and about 2.25. In some embodiments, the IC package 1100 may be formed using a method described below with reference to FIGS. 23A-23F, and the detailed description of the IC package 1000 is provided at that time.

Figure 12A:
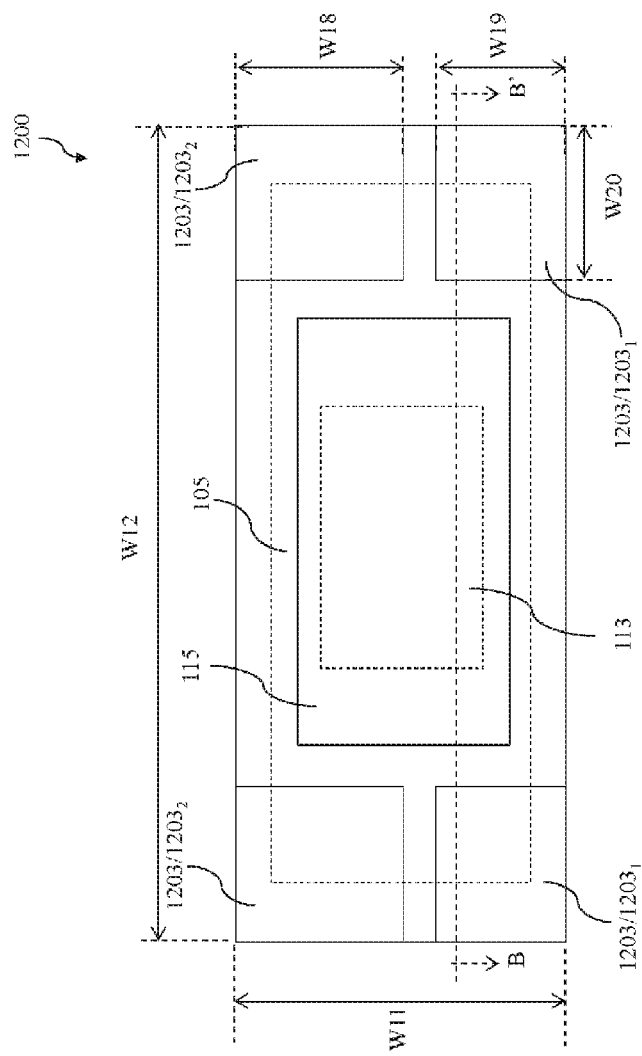

FIGS. 12A and 12B illustrate top and cross-sectional views of an IC package 1200 in accordance with some embodiments. FIG. 12A illustrates a top view, while FIG. 12B illustrated a cross-sectional view along a line BB' in FIG. 12A. To highlight differences between the IC package 1200 and the IC package 900 (see FIGS. 9A and 9B), the common features of these packages are labeled by same numerical references and their description is not repeated herein. In some embodiments, the IC package 1200 comprises a first IC die structure 901 bonded to a second IC die structure 1201. In some embodiments, the first IC die structure 901 is electrically connected to the second IC die structure 1201.

In some embodiments, the second IC die structure 1201 comprises a die stack 113 bonded to a base structure 115. In some embodiments, the die stack 113 comprises IC dies $117_1$-$117_4$ that are encapsulated in encapsulants $123_1$-$123_4$, respectively. In some embodiments, the second IC die structure 1201 further comprises an encapsulant 907 encapsulating the base structure 115, the die stack 113, and the encapsulants $123_1$-$123_4$. In some embodiments, the second IC die structure 1201 further comprises dummy structures 1203, such that the die stack 113 is interposed between adjacent dummy structures 1203. In some embodiments, the dummy structures 1203 may be formed using a similar materials and methods as the dummy structures 905 described above with reference to FIGS. 9A and 9B, and the description is not repeated herein. In some embodiments, the dummy structures 1203 may be configured as heat dissipation structures that transfer heat away from the IC die 105 of the first IC die structure 901. Accordingly, the dummy structures 1203 may also be referred to as heat dissipation structures 1203.

Referring further to FIGS. 12A and 12B, the dummy structures 1203 and the first IC die structure 901 may have a rectangular shape in a top view. In some embodiments, two sidewalls of each dummy structure 1203 are substantially coplanar with respective two sidewall of the first IC die structure 901. In some embodiments, the dummy structures 1203 (such as dummy structures $1203_1$ and $1203_2$) disposed at opposite corners of the first IC die structure 901 have different dimensions. In some embodiments, a first width W19 of the dummy structures $1203_1$ is less than a first width W11 of the first IC die structure 901. In some embodiments, a first width W18 of the dummy structures $1203_2$ is less than a first width W11 of the first IC die structure 901. In some embodiments, the width W18 is different from the width W19. In other embodiments, the width W18 may be substantially equal to the width W19. In some embodiments, a second width of the dummy stacks $1203_1$ may equal to a second width of the dummy stacks $1203_2$ and may equal to a width W20. In some embodiments, the width W20 is less than a second width W12 of the second IC die structure 901. In some embodiment, a sum of the widths W18 and W19 is less than the width W11. In some embodiments, the width W18 may be between about 2 mm and about 4.5 mm. In some embodiments, the width W19 may be between about 2 mm and about 4.5 mm. In some embodiments, the width W20 may be between about 1 mm and about 4 mm. In some embodiments, a ratio W11/W18 may be between about 2.5 and about 2. In some embodiments, a ratio W11/W19 may be between about 2.5 and about 2. In some embodiments, a ratio W11/W20 may be between about 5 and about 2.5. In some embodiments, a ratio W12/W18 may be between about 3.5 and about 3. In some embodiments, a ratio W12/W19 may be between about 3.5 and about 3. In some embodiments, a ratio W12/W20 may be between about 7 and about 3.75. In some embodiments, a ratio W18/W19 may be between about 1 and about 2.5. In some embodiments, a ratio W18/W20 may be between about 2 and about 1. In some embodiments, a ratio W19/W20 may be between about 2 and about 1. In some embodiments, the IC package 1200 may be formed using a method described below with reference to FIGS. 23A-23F, and the detailed description of the IC package 1200 is provided at that time.

FIGS. 13A and 13B illustrate top and cross-sectional views of an IC package 1300 in accordance with some embodiments. FIG. 13A illustrates a top view, while FIG. 13B illustrated a cross-sectional view along a line BB' in FIG. 13A. To highlight differences between the IC package 1300 and the IC package 900 (see FIGS. 9A and 9B), the common features of these packages are labeled by same numerical references and their description is not repeated herein. In some embodiments, the IC package 1300 comprises a first IC die structure 1301 bonded to a second IC die structure 1303. In some embodiments, the first IC die structure 1301 is electrically connected to the second IC die structure 1303. In some embodiment, the first IC die structure 1301 is similar to the first IC die structure 901 (see FIGS. 9A and 9B) with the distinction that the first IC die structure 1301 and the first IC die structure 901 have different backside structures. In some embodiments, the first IC die structure 1301 may be formed using a method described below with reference to FIGS. 19A-19G, and the detailed description of the first IC die structure 1301 is provided at that time. In some embodiments, the second IC die structure 1303 is similar to the second IC die structure 903 (see FIGS. 9A and 9B) with the distinction that the structure comprising the die stack 113 and the encapsulants $123_1$-$123_4$ is vertically flipped, such that a backside of the IC die $117_4$ of the die stack 113 is bonded to the base structure 115. Furthermore, a front side of the IC die $117_1$ of the die stack 113 is bonded to the backside of the IC die 105. In some embodiments, the IC package 1300 may be formed using a method described below with reference to FIGS. 24A-24C, and the detailed description of the IC package 1300 is provided at that time.

Figure 14A:
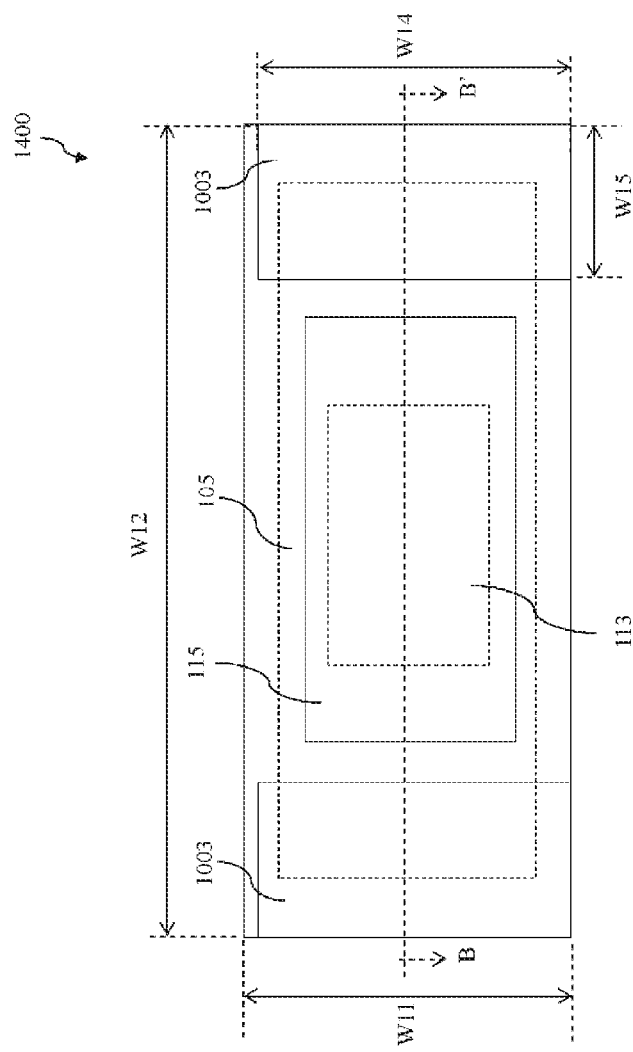
FIGS. 14A and 14B illustrate top and cross-sectional views of an integrated circuit package in accordance with some embodiments.
Figure 14B:
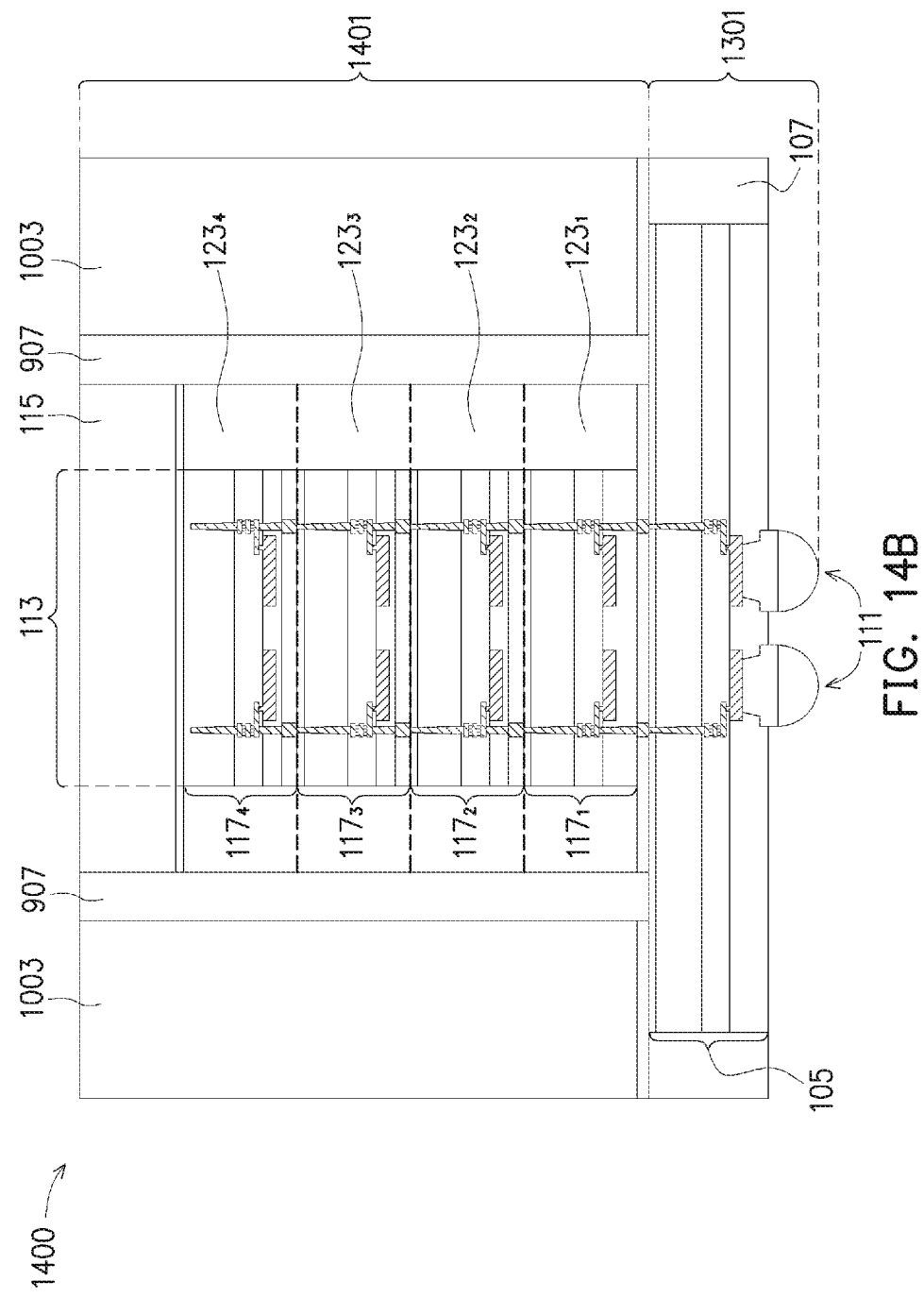

FIGS. 14A and 14B illustrate top and cross-sectional views of an IC package 1400 in accordance with some embodiments. FIG. 14A illustrates a top view, while FIG. 14B illustrated a cross-sectional view along a line BB' in FIG. 14A. To highlight differences between the IC package 1400 and the IC package 1000 (see FIGS. 10A and 10B), the common features of these packages are labeled by same numerical references and their description is not repeated herein. In some embodiments, the IC package 1400 comprises a first IC die structure 1301 bonded to a second IC die structure 1401. In some embodiments, the first IC die structure 1301 is electrically connected to the second IC die structure 1401. In some embodiment, the first IC die structure 1301 is similar to the first IC die structure 901 (see FIGS. 10A and 10B) with the distinction that the first IC die structure 1301 and the first IC die structure 901 have different backside structures. In some embodiments, the first IC die structure 1301 may be formed using a method described below with reference to FIGS. 19A-19G, and the detailed description of the first IC die structure 1301 is provided at that time. In some embodiments, the second IC die structure 1401 is similar to the second IC die structure 1001 (see FIGS. 10A and 10B) with the distinction that the structure comprising the die stack 113 and the encapsulants $123_1$-$123_4$ is vertically flipped, such that a backside of the IC die $117_4$ of the die stack 113 is bonded to the base structure 115. Furthermore, a front side of the IC die $117_1$ of the die stack 113 is bonded to the backside of the IC die 105. In some embodiments, the IC package 1400 may be formed using a method described below with reference to FIGS. 24A-24C, and the detailed description of the IC package 1400 is provided at that time.

Figure 15A:
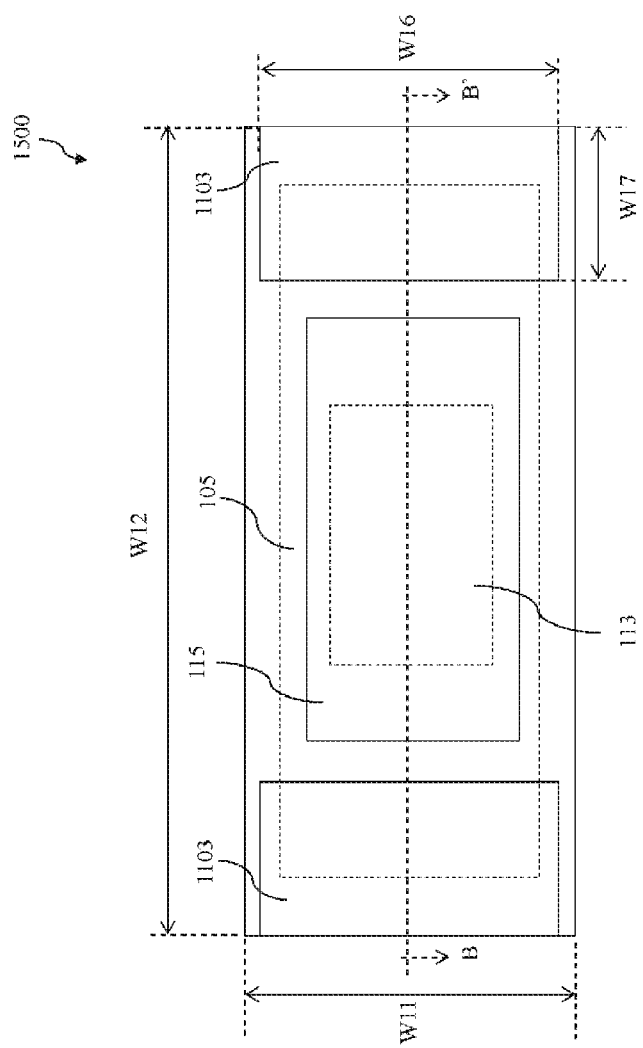

FIGS. 15A and 15B illustrate top and cross-sectional views of an IC package 1500 in accordance with some embodiments. FIG. 15A illustrates a top view, while FIG. 15B illustrated a cross-sectional view along a line BB' in FIG. 15A. To highlight differences between the IC package 1500 and the IC package 1100 (see FIGS. 11A and 11B), the common features of these packages are labeled by same numerical references and their description is not repeated herein. In some embodiments, the IC package 1500 comprises a first IC die structure 1301 bonded to a second IC die structure 1501. In some embodiments, the first IC die structure 1301 is electrically connected to the second IC die structure 1501. In some embodiment, the first IC die structure 1301 is similar to the first IC die structure 901 (see FIGS. 11A and 11B) with the distinction that the first IC die structure 1301 and the first IC die structure 901 have different backside structures. In some embodiments, the first IC die structure 1301 may be formed using a method described below with reference to FIGS. 19A-19G, and the detailed description of the first IC die structure 1301 is provided at that time. In some embodiments, the second IC die structure 1501 is similar to the second IC die structure 1101 (see FIGS. 11A and 11B) with the distinction that the structure comprising the die stack 113 and the encapsulants $123_1$-$123_4$ is vertically flipped, such that a backside of the IC die $117_4$ of the die stack 113 is bonded to the base structure 115. Furthermore, a front side of the IC die $117_1$ of the die stack 113 is bonded to the backside of the IC die 105. In some embodiments, the IC package 1500 may be formed using a method described below with reference to FIGS. 24A-24C, and the detailed description of the IC package 1500 is provided at that time.

Figure 16A:
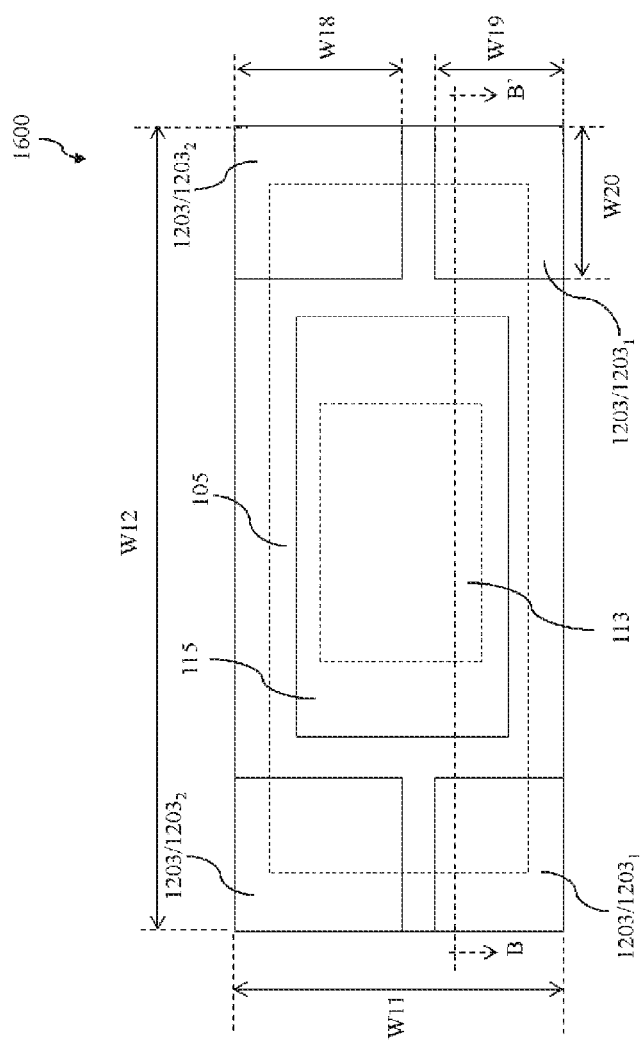
FIGS. 16A and 16B illustrate top and cross-sectional views of an integrated circuit package in accordance with some embodiments.
Figure 16B:
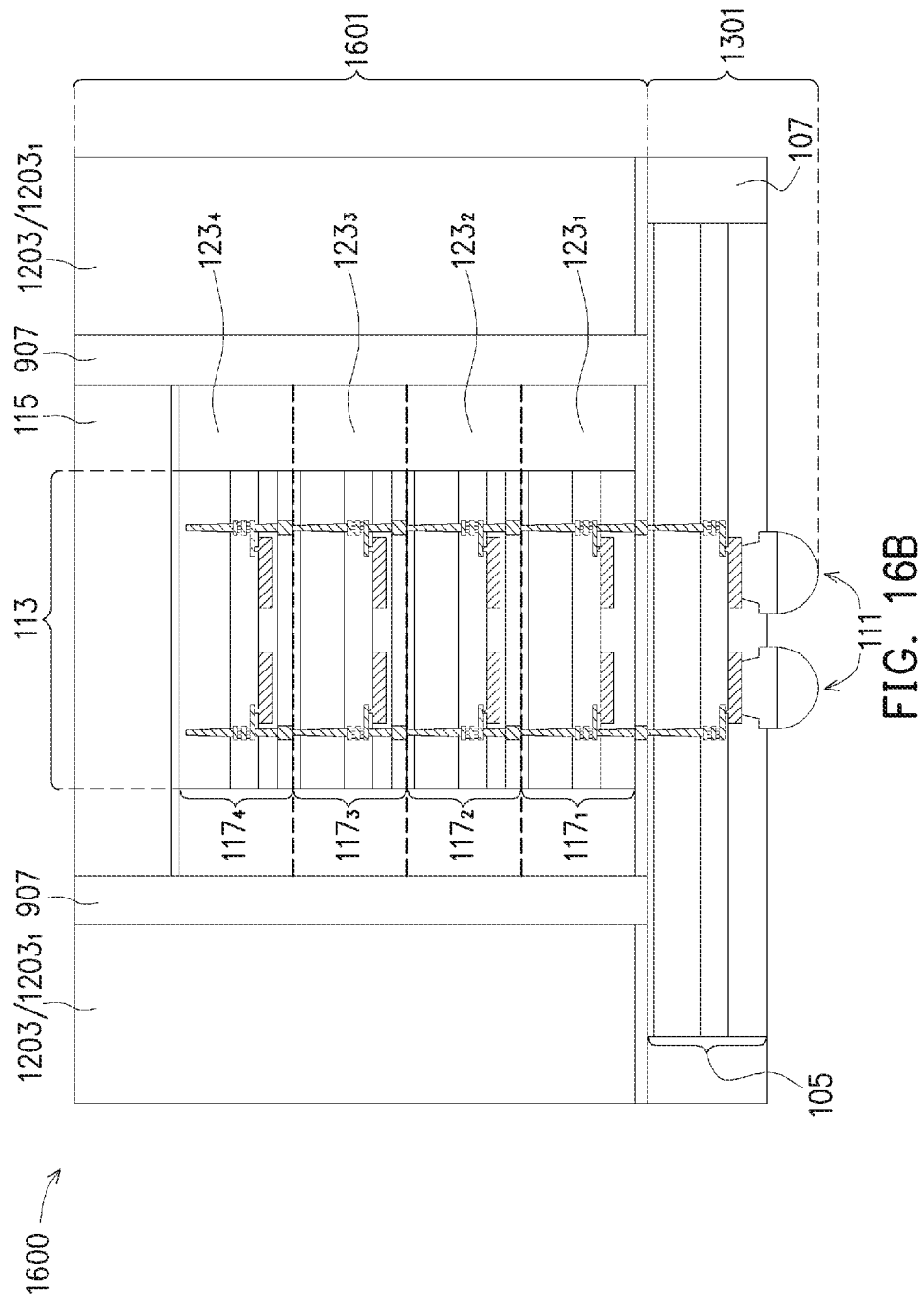

FIGS. 16A and 16B illustrate top and cross-sectional views of an IC package 1600 in accordance with some embodiments. FIG. 16A illustrates a top view, while FIG. 16B illustrated a cross-sectional view along a line BB' in FIG. 16A. To highlight differences between the IC package 1600 and the IC package 1200 (see FIGS. 12A and 12B), the common features of these packages are labeled by same numerical references and their description is not repeated herein. In some embodiments, the IC package 1600 comprises a first IC die structure 1301 bonded to a second IC die structure 1601. In some embodiments, the first IC die structure 1301 is electrically connected to the second IC die structure 1601. In some embodiment, the first IC die structure 1301 is similar to the first IC die structure 901 (see FIGS. 12A and 12B) with the distinction that the first IC die structure 1301 and the first IC die structure 901 have different backside structures. In some embodiments, the first IC die structure 1301 may be formed using a method described below with reference to FIGS. 19A-19G, and the detailed description of the first IC die structure 1301 is provided at that time. In some embodiments, the second IC die structure 1601 is similar to the second IC die structure 1201 (see FIGS. 12A and 12B) with the distinction that the structure comprising the die stack 113 and the encapsulants $123_1$-$123_4$ is vertically flipped, such that a backside of the IC die $117_4$ of the die stack 113 is bonded to the base structure 115. Furthermore, a front side of the IC die $117_1$ of the die stack 113 is bonded to the backside of the IC die 105. In some embodiments, the IC package 1600 may be formed using a method described below with reference to FIGS. 24A-24C, and the detailed description of the IC package 1600 is provided at that time.

Figure 17C:
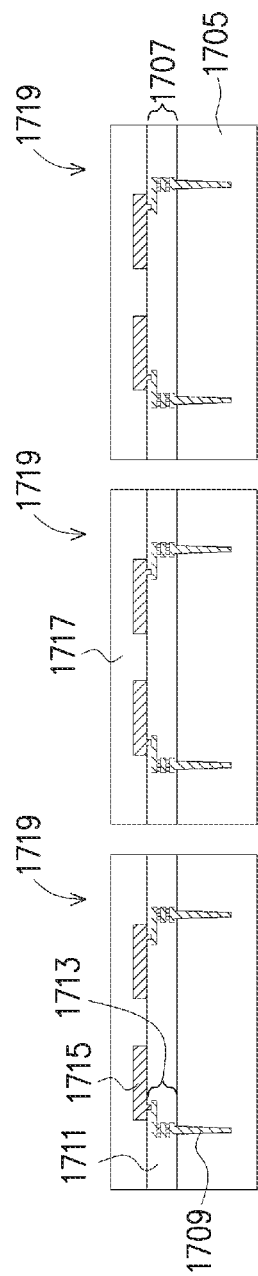

FIGS. 17A-17C illustrate cross-sectional views of various processing steps during fabrication of integrated circuit dies (such as, for example, the IC dies 105 and $117_1$ illustrated in FIGS. 1B-16B) in accordance with some embodiments. Referring to FIG. 17A, a portion of a wafer 1700 having die regions 1701 separated by scribe lines 1703 (also referred to as dicing lines or dicing streets) is illustrated. As described below in greater detail, the wafer 1700 will be diced along the scribe lines 1703 to form individual integrated circuit dies (such as the IC dies 1719 illustrated in FIG. 17C). In some embodiments, the wafer 1700 comprises a substrate 1705, one or more active and/or passive devices (not shown) on the substrate 1705, and an interconnect structure 1707 over the substrate 1705 and the one or more active and/or passive devices. In some embodiments, the substrate 1705 may be formed of silicon, although it may also be formed of other group III, group IV, and/or group V elements, such as silicon, germanium, gallium, arsenic, and combinations thereof. The substrate 1705 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the substrate 1705 may comprise through vias (TVs) 1709 that extend from a front surface of the substrate 1705 toward a backside surface of the substrate 1705. In some embodiments, the TVs 1709 may be formed by forming openings in the substrate 1705 and filling the openings with suitable conductive materials. In some embodiments, the openings may be formed using suitable photolithography and etching methods. In some embodiments, the openings may be filled with copper, a copper alloy, silver, gold, tungsten, tantalum, aluminum, a combination thereof, or the like, using physical vapor deposition (PVD), atomic layer deposition (ALD), electro-chemical plating, electroless plating, or a combination thereof, the like. In some embodiments, a liner layer and/or an adhesive/barrier layer may be formed in the openings before filling the openings with suitable conductive materials. In some embodiments, a planarization process may be performed on the conductive material of the TVs 1709, such that topmost surfaces of the TVs 1709 are substantially level or coplanar with the front surface of the substrate 1705. The planarization process may comprise a CMP process, a grinding process, an etching process, a combination thereof, or the like.

In some embodiments, the one or more active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like.

The interconnect structure 1707 may comprise a plurality of dielectric layers 1711 (such an inter-layer dielectric (ILD)/inter-metal dielectric layers (IMDs)) and interconnects 1713 (such as conductive lines and vias) within the dielectric layers 1711. The dielectric layers 1711 may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, interconnects 1713 may be formed in the dielectric layers 1711 using, for example, a damascene process, a dual damascene process, a combination thereof, or the like. In some embodiments, interconnects 1713 may comprise copper, a copper alloy, silver, gold, tungsten, tantalum, aluminum, a combination thereof, or the like. In some embodiments, the interconnects 1713 may provide electrical connections between the one or more active and/or passive devices formed on the substrate 1705.

Referring further to FIG. 17A, contact pads 1715 are formed over the interconnect structure 1707. The contact pads 1715 may be electrically coupled to the one or more active and/or passive devices through the interconnects 1713. In some embodiments, the contact pads 1715 may comprise a conductive material such as aluminum, copper, tungsten, silver, gold, a combination thereof, or the like. In some embodiments, a conductive material may be formed over the interconnect structure 1707 using, for example, PVD, ALD, electro-chemical plating, electroless plating, a combination thereof, or the like. Subsequently, the conductive material is patterned to form the contact pads 1715. In some embodiments, the conductive material may be patterned using suitable photolithography and etching methods.

Referring to FIG. 17B, an insulating layer 1717 is formed over the interconnect structure 1707 and the contact pads 1715. In some embodiments, the insulating layer 1717 may comprise one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the insulating layer 1717 may comprise one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In some embodiments, the insulating layer 1717 is planarized using a CMP process, a grinding process, an etching process, a combination thereof, or the like.

Referring to FIG. 17C, the wafer 1700 is singulated along the scribe lines 1703 (see FIG. 17B) to form individual IC dies 1719. In some embodiments, the wafer 1700 may be singulated into individual IC dies 1719, for example, by sawing, laser ablation, etching, a combination thereof, or the like.

Figure 18A:
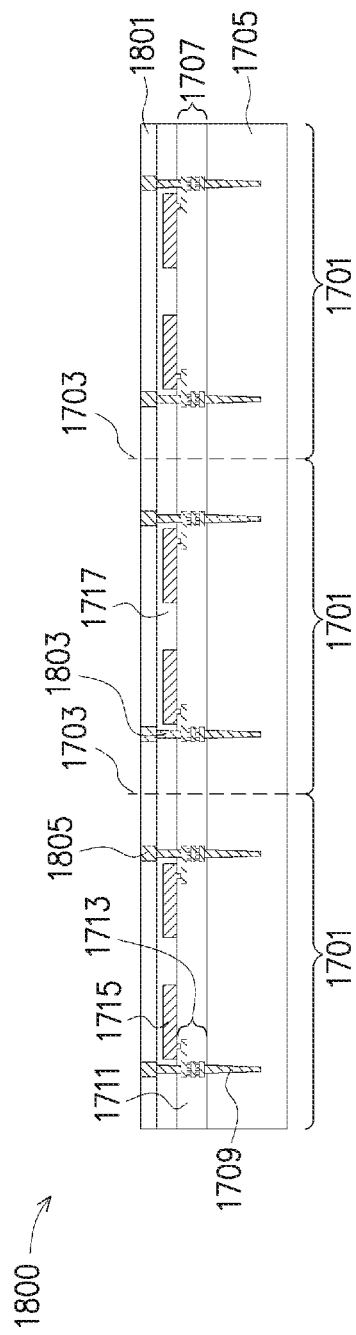
FIGS. 18A and 18B illustrate cross-sectional views of various processing steps during fabrication of integrated circuit dies in accordance with some embodiments.
Figure 18B:
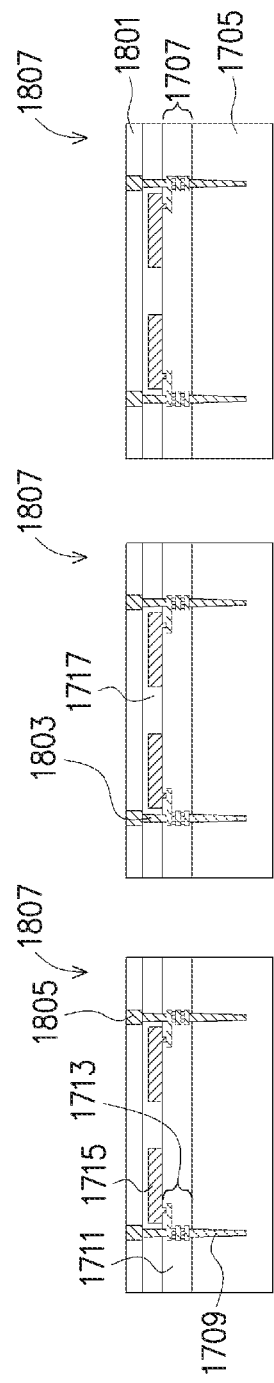

FIGS. 18A and 18B illustrate cross-sectional views of various processing steps during fabrication of integrated circuit dies (such as, for example, the IC dies $117_2$-$117_4$ illustrated in FIGS. 1B-16B) in accordance with some embodiments. FIG. 18A illustrates a wafer 1800 after preforming various processing steps on the wafer 1700 illustrated in FIG. 17B in accordance with some embodiments. In some embodiments, an insulating layer 1801 is formed over the insulating layer 1717. In some embodiments, the insulating layer 1801 may be formed using similar materials and methods as the insulating layer 1717 described above with reference to FIG. 17B, and the description is not repeated herein. In some embodiments, the insulating layer 1801 is planarized using a CMP process, a grinding process, an etching process, a combination thereof, or the like. In some embodiments, the insulating layer 1801 and the insulating layer 1717 may comprise a same material. In other embodiments, the insulating layer 1801 and the insulating layer 1717 may comprise different materials.

Referring further to FIG. 18A, bond pads 1805 and corresponding vias 1803 are formed in the insulating layers 1717 and 1801. In some embodiments, the bond pads 1805 are formed in the insulating layer 1801 and the vias 1803 are formed in the insulating layer 1717. In some embodiments, the bond pads 1805 and the vias 1803 may be formed using similar materials and methods as the interconnects 1713 described above with reference to FIG. 17A, and the description is not repeated herein. In some embodiments, the bond pads 1805 and the insulating layer 1801 are planarized, such that topmost surfaces of the bond pads 1805 are substantially level or coplanar with a topmost surface of the insulating layer 1801. In some embodiments, the vias 1803 are in direct electrical contact with the interconnects 1713. In other embodiments, the vias 1803 may be in direct electrical contact with the contact pads 1715 and may be electrically connected to the interconnects 1713 through the contact pads 1715.

Referring to FIG. 18B, the wafer 1800 is singulated along the scribe lines 1703 (see FIG. 18A) to form individual IC dies 1807. In some embodiments, the wafer 1800 may be singulated into the individual IC dies 1807, for example, by sawing, laser ablation, etching, a combination thereof, or the like.

Figure 19G:
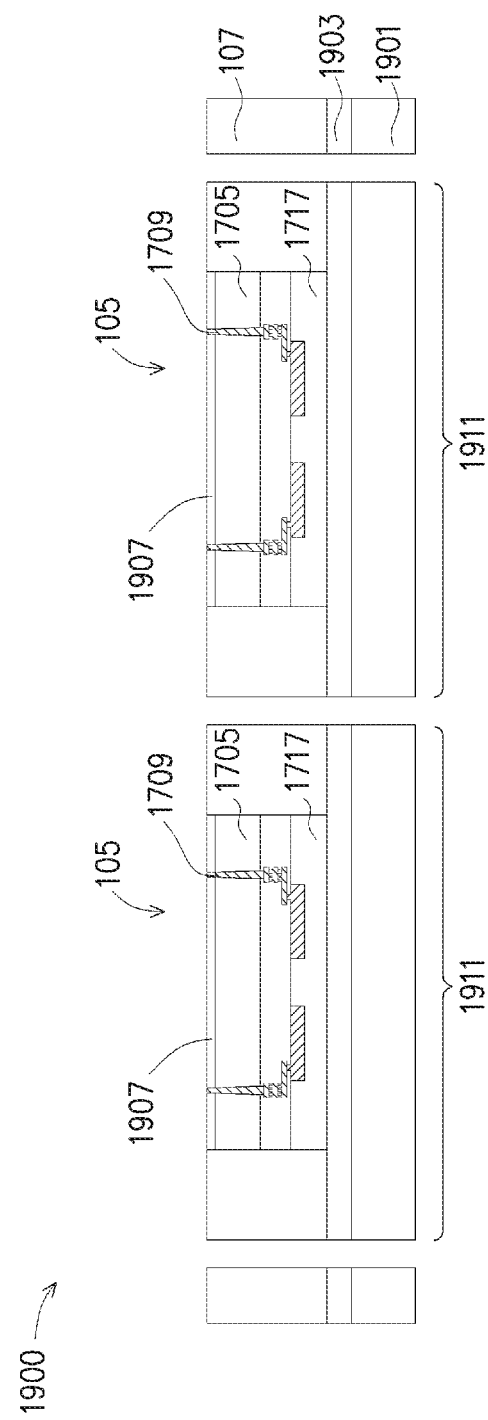

FIGS. 19A-19G illustrate cross-sectional views of various processing steps during fabrication of integrated circuit die structures (such as, for example, the IC die structures 501 and 1301 illustrated in FIGS. 5B-8B and 13B-16B, respectively) in accordance with some embodiments. Referring to FIG. 19A, the IC dies 105 are bonded to a carrier 1901 to start forming a wafer-level die structure 1900. In some embodiments, the carrier 1901 may comprise similar materials as the substrate 1705 described above with reference to FIG. 17A, and the description is not repeated herein. In other embodiments, the carrier 1901 may comprise a suitable insulating material. In some embodiments, the IC dies 105 may be similar to the IC dies 1719 and may be formed using a method described above with reference to FIGS. 17A-17C, with similar features of the IC dies 1719 and 105 being referred to with similar numerical references.

Referring further to FIG. 19A, an insulating layer 1903 is formed over the carrier 1901. In some embodiments, the insulating layer 1903 may be formed using similar materials and methods as the insulating layer 1717 described above with reference to FIG. 17B, and the description is not repeated herein. In some embodiments, the insulating layer 1903 is planarized using a CMP process, a grinding process, an etching process, a combination thereof, or the like. In some embodiments, the IC dies 105 are bonded to the carrier 1901 by bonding the insulating layers 1717 of the IC dies 105 to the insulating layer 1903. In some embodiments, the insulating layers 1717 may be bonded to the insulating layer 1903 using a direct bonding method, such a fusion bonding method. In some embodiments, surface treatment processes may be performed on the insulating layers 1717 and the insulating layer 1903 prior to bonding the insulating layers 1717 to the insulating layer 1903. In other embodiments, the insulating layers 1717 may be bonded to the insulating layer 1903 using other suitable bonding methods or using an adhesive. In some embodiments, an annealing process may be performed after bonding the IC dies 105 to the carrier 1901 to strengthen the bond.

Referring to FIG. 19B, an encapsulant 107 is formed over and surrounding the IC dies 105. In some embodiments, the encapsulant 107 may be formed using similar materials and methods as the insulating layer 1717 described above with reference to FIG. 17B, and the description is not repeated herein. In other embodiments, the encapsulant 107 may comprise a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the IC dies 105.

Referring to FIG. 19C, the encapsulant 107 and the IC dies 105 are planaraized, such that backside surfaces 105*b* of the IC dies 105 are substantially level or coplanar with a topmost surface of the encapsulant 107. In some embodiments, the planarization process may comprise a CMP process, a grinding process, an etching process, a combination thereof, or the like. In some embodiment, the planarization process exposes the TVs 1709 of the IC dies 105, such that exposed surfaces of the TVs 1709 are substantially level or coplanar with the backside surfaces 105*b* of the IC dies 105 and the topmost surface of the encapsulant 107.

Referring to FIG. 19D, the backside surfaces 105*b* of the IC dies 105 are recessed below the topmost surface of the encapsulant 107 to form recesses 1905. In some embodiments, the backside surfaces 105*b* of the IC dies 105 may be recessed using a suitable etching process, such as a selective dry or wet etching process that is selective to the material of the substrate 1705 of the IC dies 105. In some embodiments, sidewalls of the TVs 1709 of the IC dies 105 are exposed within the recesses 1905.

Referring to FIG. 19E, insulating layers 1907 are formed in the recesses 1905 (see FIG. 19D). In some embodiments, the insulating layers 1907 may be formed using similar materials and methods as the insulating layer 1717 described above with reference to FIG. 17B, and the description is not repeated herein. In some embodiments, an insulating material of the insulating layers 1907 is deposited in the recesses 1905 and over the encapsulant 107. Subsequently, portions of the insulating material overfilling the recesses 1905 are removed to form insulating layers 1907, such that topmost surfaces the insulating layer 1907 are substantially level or coplanar with the topmost surface of the encapsulant 107. In some embodiments, the portions of the insulating material overfilling the recesses 1905 may be removed using a CMP process, a grinding process, an etching process, a combination thereof, or the like. In some embodiment, the removal process exposes the TVs 1709 of the IC dies 105, such that exposed surfaces of the TVs 1709 are substantially level or coplanar with the topmost surfaces of the insulating layers 1907 and the topmost surface of the encapsulant 107.

Referring to FIGS. 19F and 19G, the wafer-level die structure 1900 is singulated to form individual (chip-level or die-level) IC die structures 1911, which are intermediate structures in forming the IC die structures 501 and 1301 (see FIGS. 5B-8B and 13B-16B, respectively) in accordance with some embodiments. Referring first to FIG. 19F, the encapsulant 107, the insulating layer 1903 and the carrier 1901 are patterned to form recesses 1909. The recesses 1909 are interposed between the adjacent IC dies 105 and partially extend into the carrier 1901, such that the recesses 1909 partially singulate the carrier 1901. In some embodiments, the patterning process for forming the recesses 1909 may comprise suitable photolithography and etching methods.

Referring to FIG. 19G, the carrier 1901 is thinned to remove un-singulated portions of the carrier 1901, thereby fully singulating the carrier 1901 and forming the individual IC die structures 1911. In some embodiments, the carrier 1901 may be thinned using a CMP process, a grinding process, an etching process, a combination thereof, or the like. In other embodiments, the singulation process may comprise sawing, laser ablation, etching, a combination thereof, or the like.

Figure 20A:
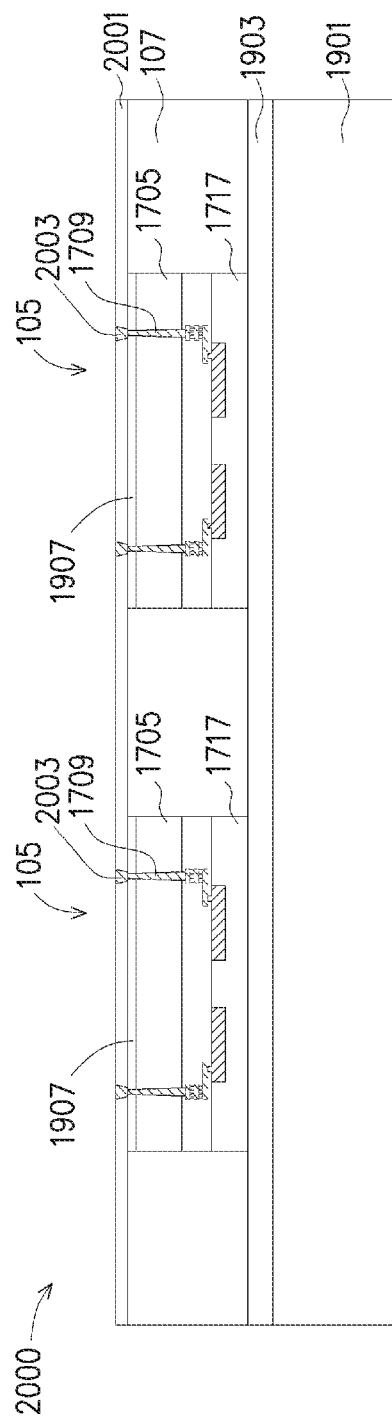
FIGS. 20A and 20B illustrate cross-sectional views of various processing steps during fabrication of integrated circuit die structures in accordance with some embodiments.
Figure 20B:
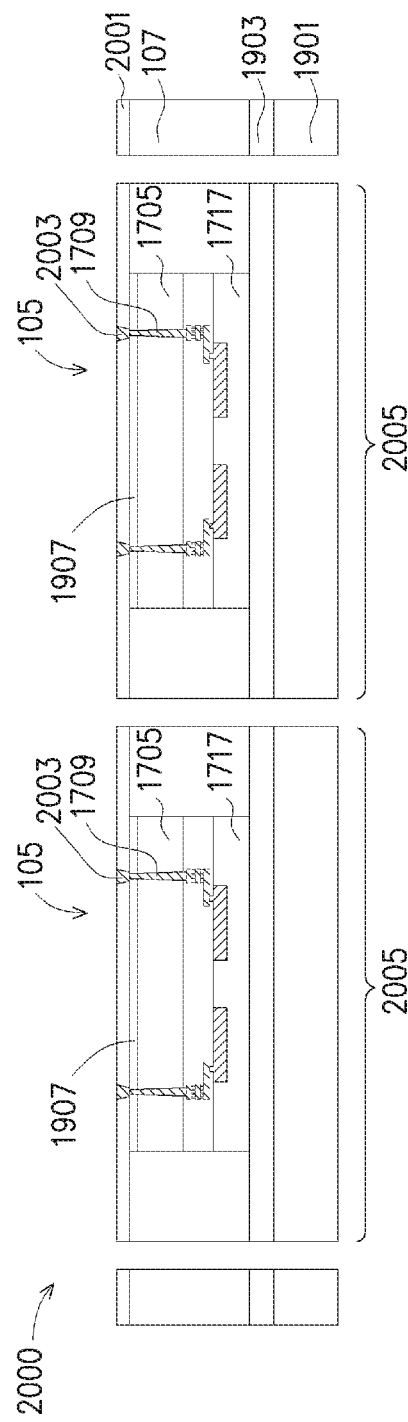

FIGS. 20A and 20B illustrate cross-sectional views of various processing steps during fabrication of integrated circuit die structures (such as, for example, the IC die structures 101 and 901 illustrated in FIGS. 1B-4B and 9B-12B, respectively) in accordance with some embodiments. FIG. 20A illustrates a wafer-level die structure 2000 after preforming various processing steps on the wafer-level die structure 1900 illustrated in FIG. 19E, in accordance with some embodiments. In some embodiments, an insulating layer 2001 is formed over the IC dies 105 and the encapsulant 107. In some embodiments, the insulating layer 2001 may be formed using similar materials and methods as the insulating layer 1717 described above with reference to FIG. 17B, and the description is not repeated herein. In some embodiments, the insulating layer 2001 and the insulating layer 1907 may comprise a same material. In other embodiments, the insulating layer 2001 and the insulating layer 1907 may comprise different materials. In some embodiments, bond pads 2003 are formed in the insulating layer 2001 in electrical contact with respective TVs 1709 of the IC dies 105. In some embodiments, bond pads 2003 may be formed using similar materials and methods as the interconnects 1713 described above with reference to FIG. 17A, and the description is not repeated herein. In some embodiments, the bond pads 2003 are planarized, such that topmost surfaces of the bond pads 2003 are substantially level or coplanar with the topmost surface of the insulating layer 2001. In some embodiments, the planarization process may comprise a CMP process, a grinding process, an etching process, a combination thereof, or the like.

Referring to FIG. 20B, the wafer-level die structure 2000 is singulated to form individual (chip-level or die-level) IC die structures 2005, which are intermediate structures in forming the IC die structures 101 and 901 (see FIGS. 1B-4B and 9B-12B, respectively) in accordance with some embodiments. In some embodiments, the wafer-level die structure 2000 may be singulated using a method described above with reference to FIGS. 19F and 19G, and the description is not repeated herein.

Figure 21A:
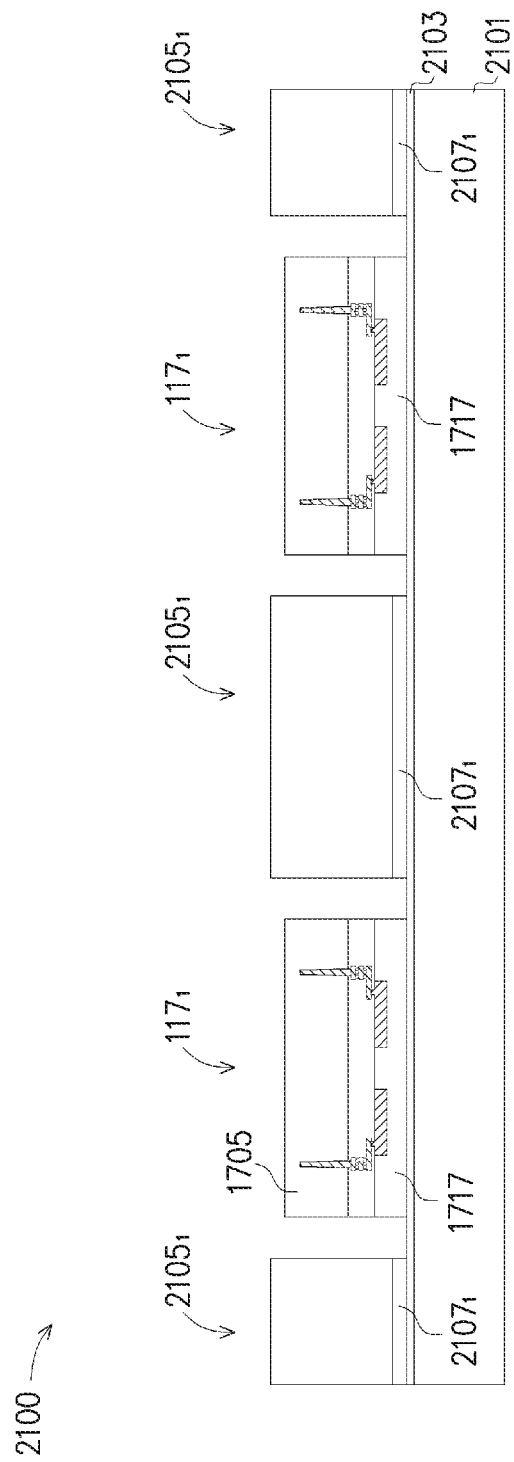
FIGS. 21A-21H illustrate top and cross-sectional views of various processing steps during fabrication of integrated circuit packages in accordance with some embodiments.

FIGS. 21A-21H illustrate top and cross-sectional views of various processing steps during fabrication of integrated circuit packages (such as, for example, the IC packages 100-400 illustrated in FIGS. 1A and 1B, 2A and 2B, 3A and 3B, and 4A and 4B, respectively) in accordance with some embodiments. Referring to FIG. 21A, a method of forming a wafer-level die structure 2100 starts with forming an insulating layer 2103 over a carrier 2101. In some embodiments, the carrier 2101 may be formed using similar materials and methods as the carrier 1901 described above with reference to FIG. 19A, and the description is not repeated herein. In some embodiments, the insulating layer 2103 may be formed using similar materials and methods as the insulating layer 1903 described above with reference to FIG. 19A, and the description is not repeated herein. In some embodiments, IC dies $117_1$ are bonded to the insulating layer 2103. In some embodiments, the IC dies $117_1$ may be similar to the IC dies 1719 and may be formed using a method described above with reference to FIGS. 17A-17C, with similar features of the IC dies $117_1$ and 1719 being referred to with similar numerical references.

In some embodiments, the IC dies $117_1$ are bonded to the insulating layer 2103 by bonding the insulating layers 1717 of the IC dies $117_1$ to the insulating layer 2103. In some embodiments, the insulating layers 1717 may be bonded to the insulating layer 2103 using a direct bonding method, such a fusion bonding method. In some embodiments, surface treatment processes may be performed on the insulating layers 1717 and the insulating layer 2103 prior to bonding the insulating layers 1717 to the insulating layer 2103. In other embodiments, the insulating layers 1717 may be bonded to the insulating layer 2103 using other suitable bonding methods or using an adhesive. In some embodiments, an annealing process may be performed after bonding the IC dies $117_1$ to the carrier 2101 to strengthen the bond. In some embodiments, the insulating layers 1717 and the insulating layer 2103 may a same materials. In other embodiments, the insulating layers 1717 and the insulating layer 2103 may comprise different materials.

Referring further to FIG. 21A, dummy structures $2105_1$ are bonded to the insulating layer 2103, such that each IC die $117_1$ is interposed between adjacent dummy structures $2105_1$. In some embodiments, the dummy structures $2105_1$ may comprise a same material as the substrate 1705 of the IC dies $117_1$. In some embodiments, dummy structures $2105_1$ may not comprise active and/or passive devices, and may not provide additional electrical functionality to the resulting IC packages. In some embodiments, each dummy structure $2105_1$ may comprise an insulating layer $2107_1$ on one side. In some embodiments, the insulating layers $2107_1$ may be formed using similar materials and methods as the insulating layer 1717 described above with reference to FIG. 17B, and description is not repeated herein. In some embodiments, the insulating layers $2107_1$ and the insulating layer 2103 may comprise a same material. In other embodiments, the insulating layers $2107_1$ and the insulating layer 2103 may comprise different materials.

In some embodiments, the dummy structures $2105_1$ are bonded to the insulating layer 2103 by bonding the insulating layers $2107_1$ of the dummy structures $2105_1$ to the insulating layer 2103. In some embodiments, the insulating layers $2107_1$ may be bonded to the insulating layer 2103 using a direct bonding method, such a fusion bonding method. In some embodiments, surface treatment processes may be performed on the insulating layers $2107_1$ and the insulating layer 2103 prior to bonding the insulating layers $2107_1$ to the insulating layer 2103. In other embodiments, the insulating layers $2107_1$ may be bonded to the insulating layer 2103 using other suitable bonding methods or using an adhesive. In some embodiments, an annealing process may be performed after bonding the dummy structures $2105_1$ to the carrier 2101 to strengthen the bond.

Figure 21B:
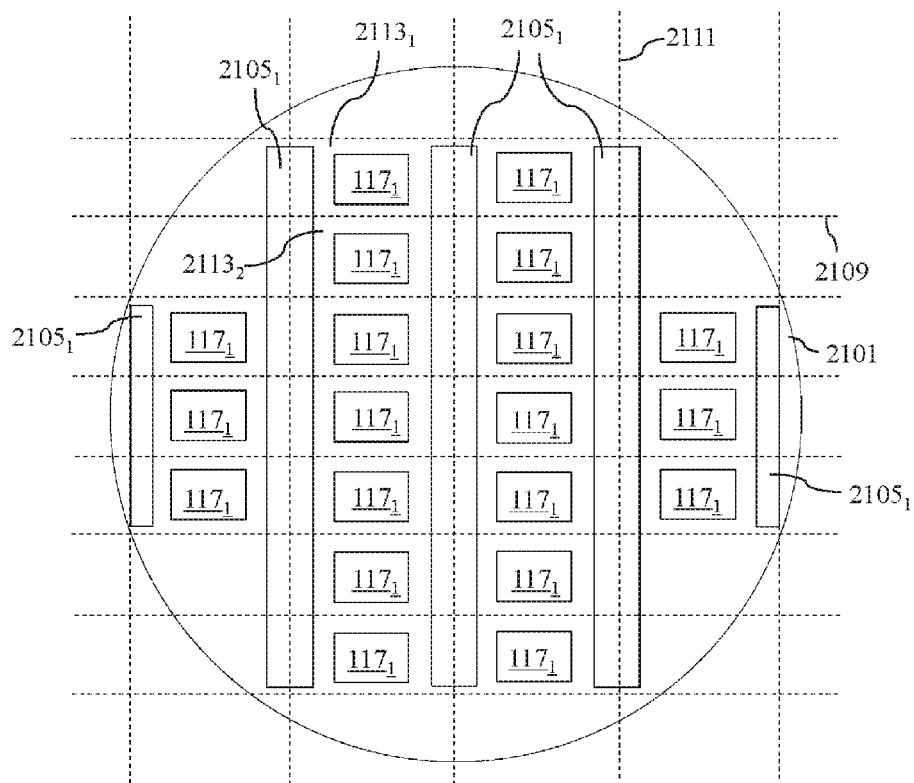

FIG. 21B illustrates a top view of the wafer-level die structure 2100 illustrated in FIG. 21A in accordance with some embodiments. In some embodiments, the carrier 2101 is separated into die regions $2113_i$ (where with N being the total number of die regions) by scribe lines 2109 and 2111. In some embodiments, the scribe lines 2109 are perpendicular to the scribe lines 2111. In such embodiments, the die regions $2113_i$ (where i=1, . . . , N) have rectangular shapes in a top view. In other embodiments, the scribe lines 2109 and the scribe lines 2111 form angles different from 90 degrees. In such embodiments, the die regions $2113_i$ (where i=1, . . . , N) have shapes of a parallelogram in a top view. In some embodiments, the dummy structures $2105_1$ have rectangular shapes in a top view. In some embodiments, the dummy structures $2105_1$ overlap with respective scribe lines 2111, such the dummy structures $2105_1$ are shared between a subset of the die regions $2113_i$ (where i=1, . . . , N) separated by the respective scribe lines 2111. In some embodiments, the dummy structures $2105_1$ may form continuous structures extending along an entirety of the usable portion (such as the portion comprising the die regions $2113_i$) of the carrier 2101, such that each scribe line 2111 is overlapped by a respective single continuous dummy structure $2105_1$. As described below in greater detail, the wafer-level die structure 2100 is singulated along the scribe lines 2109 and 2111 to form individual packages. Such a singulation process also singulates the dummy structures $2105_1$ and forms individual (chip-level or die-level) dummy structures for respective individual packages. In some embodiments, by forming the dummy structures $2105_1$ that overlap with the scribe lines 2111, a time for forming the individual IC packages may be reduced. For example, the time for forming the individual IC packages may be reduced by a time that would be required to place and bond individual (chip-level or die-level) dummy structures within each die region of the carrier 2101 before performing a singulation process. Accordingly, a wafer per hour (WPH) yield may be increased and production cost may be reduced during the production of IC packages.

Figure 21C:
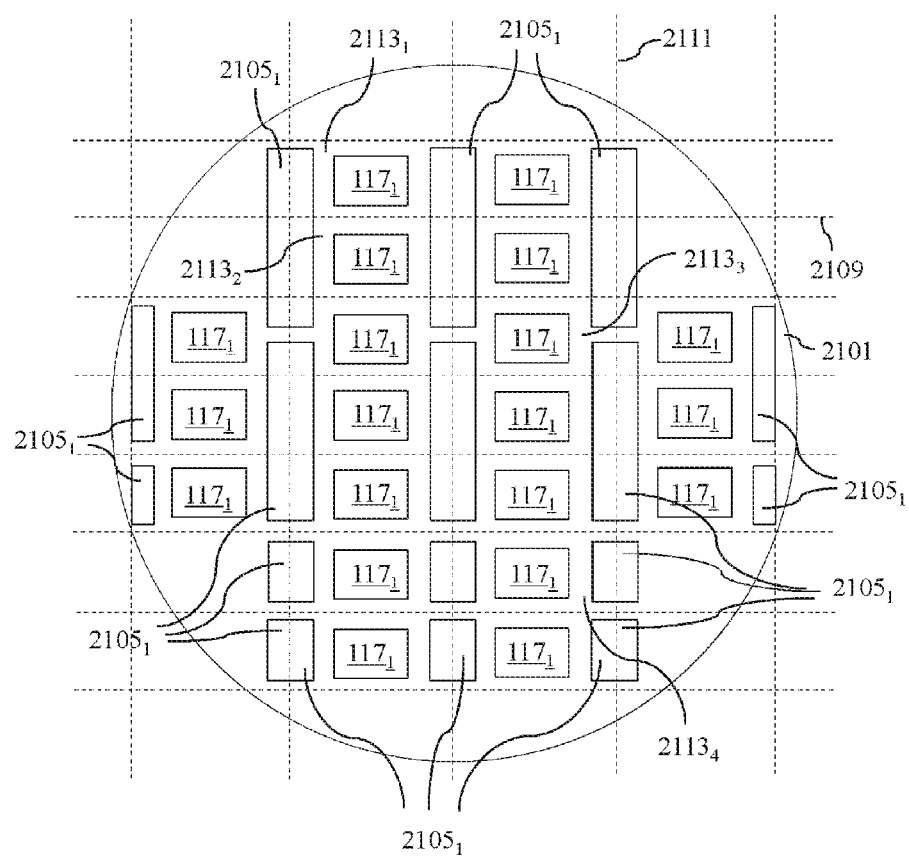

FIG. 21C illustrates a top view of the wafer-level die structure 2100 illustrated in FIG. 21A in accordance with alternative embodiments. The embodiment illustrated in FIG. 21C is similar to the embodiment illustrated in FIG. 21B, with like elements being labeled with like numerical references, and the detailed description is not repeated herein. In the embedment illustrated in FIG. 21C, the dummy structures $2105_1$ do not form continuous structures extending along the entirety of the usable portion of the carrier 2101. Instead, each scribe line 2111 is overlapped by a plurality of disconnected dummy structures $2105_1$ of varying lengths.

Figure 21D:
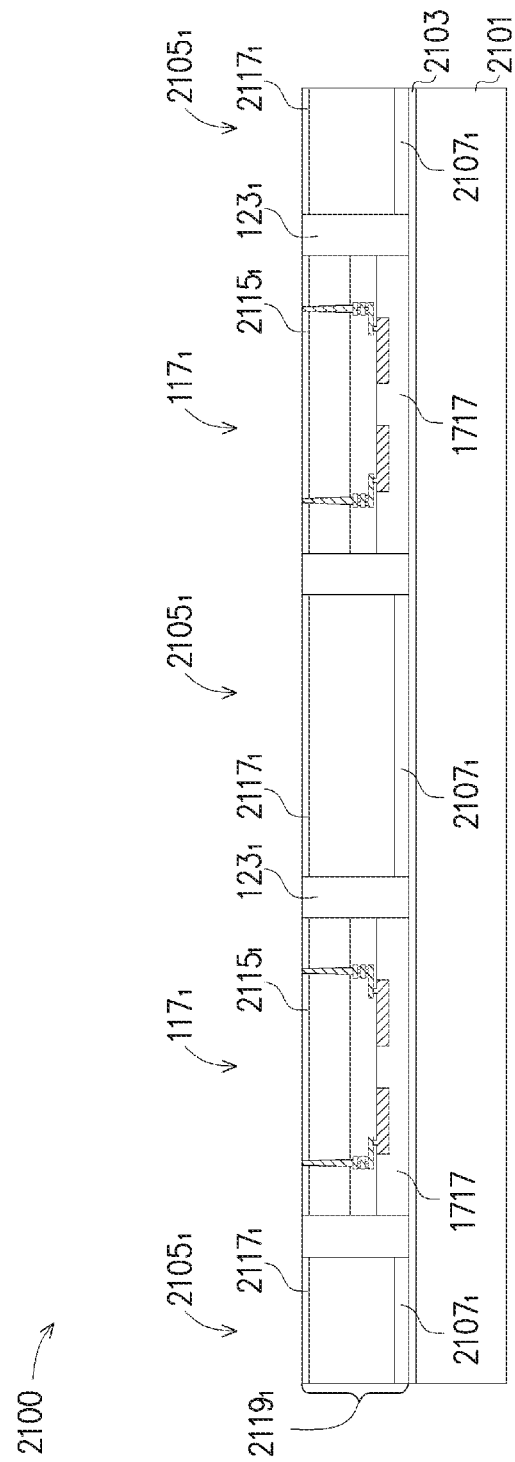

Referring to FIG. 21D, the IC dies $117_1$ and the dummy structures $2105_1$ are encapsulated in an encapsulant $123_1$. Subsequently, insulating layers $2115_1$ are formed over the IC dies $117_1$, and insulating layers $2117_1$ are formed over the dummy structures $2105_1$. In some embodiments, topmost surfaces of the insulating layers $2115_1$ and topmost surfaces of the insulating layers $2117_1$ are substantially level or coplanar with a topmost surface of the encapsulant $123_1$. In some embodiments, the encapsulant $123_1$ may be formed using similar materials and methods as the encapsulant 107 described above with reference to FIGS. 19B and 19C, and the description is not repeated herein. In some embodiments, the insulating layers $2115_1$ and the insulating layers $2117_1$ may be formed using similar materials and methods as the insulating layer 1907 described above with reference to FIGS. 19D and 19E, and the description is not repeated herein. In some embodiments, the insulating layers 2115$_1$ and the insulating layers 2117$_1$ may comprise a same material. In other embodiments, the insulating layers 2115$_1$ and the insulating layers 2117$_1$ may comprise different materials. The IC dies 117$_1$ with corresponding insulating layers 2115$_1$, the dummy structures 2105$_1$ with corresponding insulating layers 2107$_1$ and 2117$_1$, and the encapsulant 123$_1$ form a tier 1 structure 2119$_1$ over the carrier 2101.

Figure 21E:
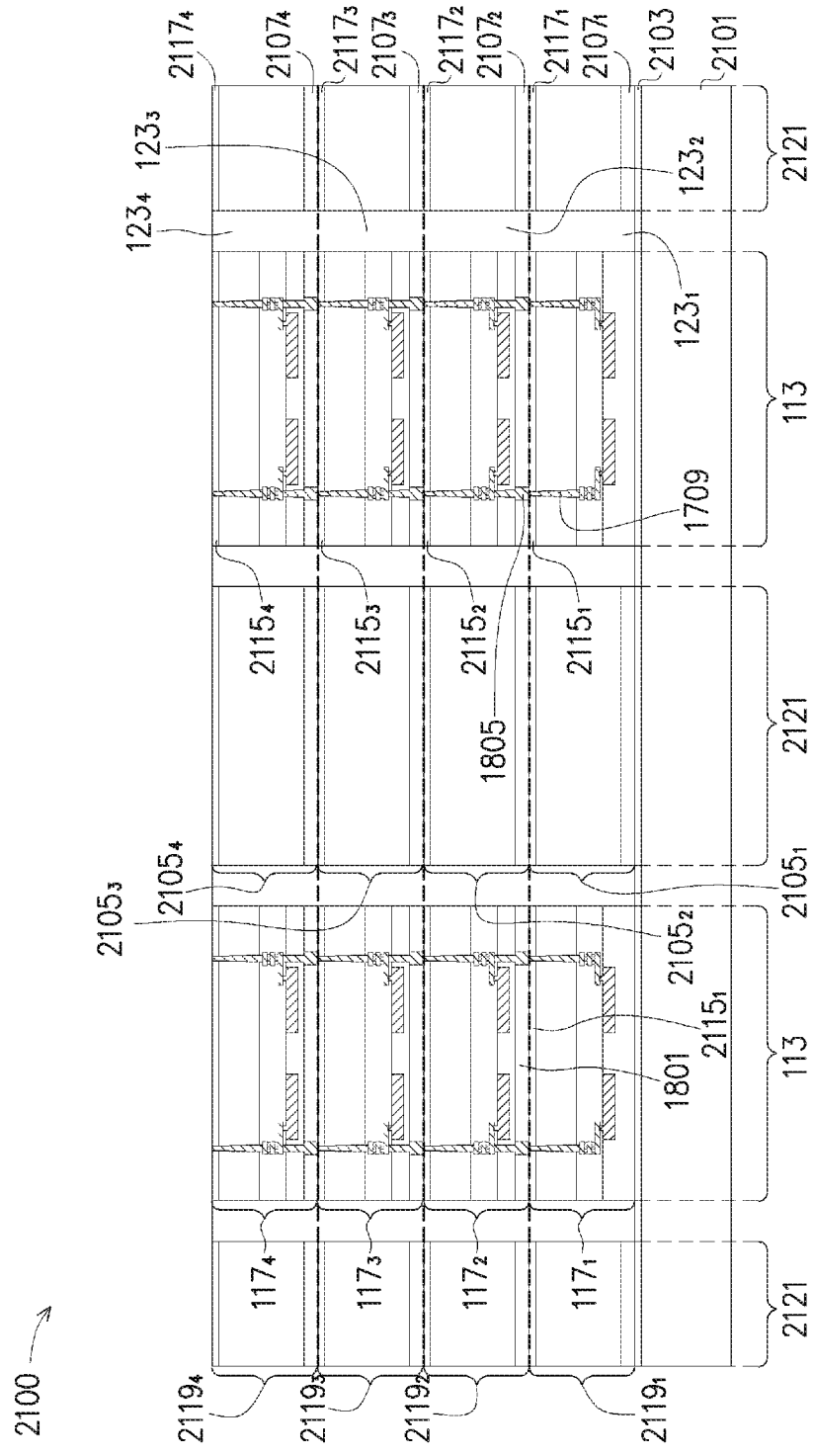

Referring to FIG. 21E, the IC dies 117$_2$ are bonded to the IC dies 117$_1$. In some embodiments, the IC dies 117$_2$ may be similar to the IC dies 1807 and may be formed using a method described above with reference to FIGS. 18A and 18B, with similar features of the IC dies 117$_2$ and the IC dies 1807 being referred to with similar numerical references. In some embodiments, the IC dies 117$_2$ are bonded to the IC dies 117$_1$ using a direct bonding method, such as a hybrid bonding method. In such embodiments, the TVs 1709 of the IC dies 117$_2$ are direct bonded to the bond pads 1805 of the IC dies 117$_2$, and the insulating layers 2115$_1$ of IC dies 117$_1$ are direct bonded to the insulating layers 1801 of the IC dies 117$_2$. In some embodiments, after bonding the IC dies 117$_2$ to the IC dies 117$_1$, an annealing process may be performed to strengthen the bond between the IC dies 117$_1$ and the IC dies 117$_2$. The bonds between the TVs 1709 of the IC dies 117$_1$ and the bond pads 1805 of the IC dies 117$_2$ provide electrical connections between the IC dies 117$_1$ and the IC dies 117$_2$. In some embodiments, the TVs 1709 of the IC dies 117$_1$ and the bond pads 1805 of the IC dies 117$_2$ may comprise a same material. In other embodiments, the TVs 1709 of the IC dies 117$_1$ and the bond pads 1805 of the IC dies 117$_2$ may comprise different materials. In some embodiments, the insulating layers 2115$_1$ of IC dies 117$_1$ and the insulating layers 1801 of the IC dies 117$_2$ may comprise a same material. In other embodiments, the insulating layers 2115$_1$ of IC dies 117$_1$ and the insulating layers 1801 of the IC dies 117$_2$ may comprise different materials.

In some embodiments, dummy structures 2105$_2$ are bonded to the dummy structures 2105$_1$. In some embodiments, the dummy structures 2105$_2$ may be formed using similar materials and methods as the dummy structures 2105$_1$ described above with reference to FIG. 21D, and the description is not repeated herein. In some embodiments, the dummy structures 2105$_2$ may be bonded to the dummy structures 2105$_1$ by bonding the insulating layers 2107$_2$ of the dummy structures 2105$_2$ to the insulating layers 2117$_1$ of the dummy structures 2105$_1$. In some embodiments, the insulating layers 2107$_2$ may be bonded to the insulating layers 2117$_1$ using a direct bonding method, such a fusion bonding method. In some embodiments, surface treatment processes may be performed on the insulating layers 2107$_2$ and the insulating layers 2117$_1$ prior to bonding the insulating layers 2107$_2$ to the insulating layer 2117$_1$. Subsequently, an annealing process may be performed to strengthen the bond between the dummy structures 2105$_2$ and the dummy structures 2105$_1$. In some embodiments, the insulating layers 2107$_2$ and the insulating layer 2117$_1$ may comprise a same material. In other embodiments, the insulating layers 2107$_2$ and the insulating layer 2117$_1$ may comprise different materials. In some embodiments, the dummy structures 2105$_2$ may have same shapes in a top view as respective the dummy structures 2105$_1$ illustrated in FIGS. 21B and 21C, and the description is not repeated herein.

Subsequently, the IC dies 117$_2$ and the dummy structures 2105$_2$ are encapsulated in an encapsulant 123$_2$, insulating layers 2115$_2$ are formed over the IC dies 117$_2$, and insulating layers 2117$_2$ are formed over the dummy structures 2105$_2$. In some embodiments, the encapsulant 123$_2$ may be formed using similar materials and methods as the encapsulant 123$_1$ described above with reference to FIG. 21D, and the description is not repeated herein. In some embodiments, the insulating layers 2115$_2$ and insulating layers 2117$_2$ may be formed using similar materials and methods as the insulating layers 2115$_1$ and insulating layers 2117$_1$, respectively, described above with reference to FIG. 21D, and the description is not repeated herein. In some embodiments, the insulating layers 2115$_2$ and insulating layers 2117$_2$ may comprise a same material. In other embodiments, the insulating layers 2115$_2$ and insulating layers 2117$_2$ may comprise different materials. The IC dies 117$_2$ with corresponding insulating layers 2115$_2$, the dummy structures 2105$_2$ with corresponding insulating layers 2107$_2$ and 2117$_2$, and the encapsulant 123$_2$ form a tier 2 structure 2119$_2$ over the tier 1 structure 2119$_1$.

Referring further to FIG. 21E, a tier 3 structure 2119$_3$ comprising IC dies 117$_3$ with corresponding insulating layers 2115$_3$, the dummy structures 2105$_3$ with corresponding insulating layers 2107$_3$ and 2117$_3$, and the encapsulant 123$_3$ is formed over the tier 2 structure 2119$_2$. In some embodiments, the IC dies 117$_3$ may be similar to the IC dies 1807 and may be formed using a method described above with reference to FIGS. 18A and 18B, with similar features of the IC dies 117$_3$ and the IC dies 1807 being referred to with similar numerical references. In some embodiments, the dummy structures 2105$_3$ may be formed using similar materials and methods as the dummy structures 2105$_1$ described above with reference to FIG. 21D, and the description is not repeated herein. In some embodiments, the tier 3 structure 2119$_3$ may be formed using similar methods as the tier 2 structure 2119$_2$ described above, and the description is not repeated herein. Subsequently, a tier 4 structure 2119$_4$ comprising IC dies 117$_4$ with corresponding insulating layers 2115$_4$, the dummy structures 2105$_4$ with corresponding insulating layers 2107$_4$ and 2117$_4$, and the encapsulant 123$_4$ is formed over the tier 3 structure 2119$_3$. In some embodiments, the IC dies 117$_4$ may be similar to the IC dies 1807 and may be formed using a method described above with reference to FIGS. 18A and 18B, with similar features of the IC dies 117$_4$ and the IC dies 1807 being referred to with similar numerical references. In some embodiments, the dummy structures 2105$_4$ may be formed using similar materials and methods as the dummy dies 2105$_1$ described above with reference to FIG. 21D, and the description is not repeated herein. In some embodiments, the tier 4 structure 2119$_4$ may be formed using similar methods as the tier 2 structure 2119$_2$ described above, and the description is not repeated herein. In some embodiments, the dummy structures 2105$_3$ and 2105$_4$ may have same shapes in a top view as respective the dummy structures 2105$_1$ illustrated in FIGS. 21B and 21C, and the description is not repeated herein. The stacks of dummy structures 2105$_1$-2105$_4$ form may also be referred to as the stacked dummy structures 2121 and the stacks of IC dies 117$_1$-117$_4$ may also be referred to as the die stacks 113.

Figure 21F:
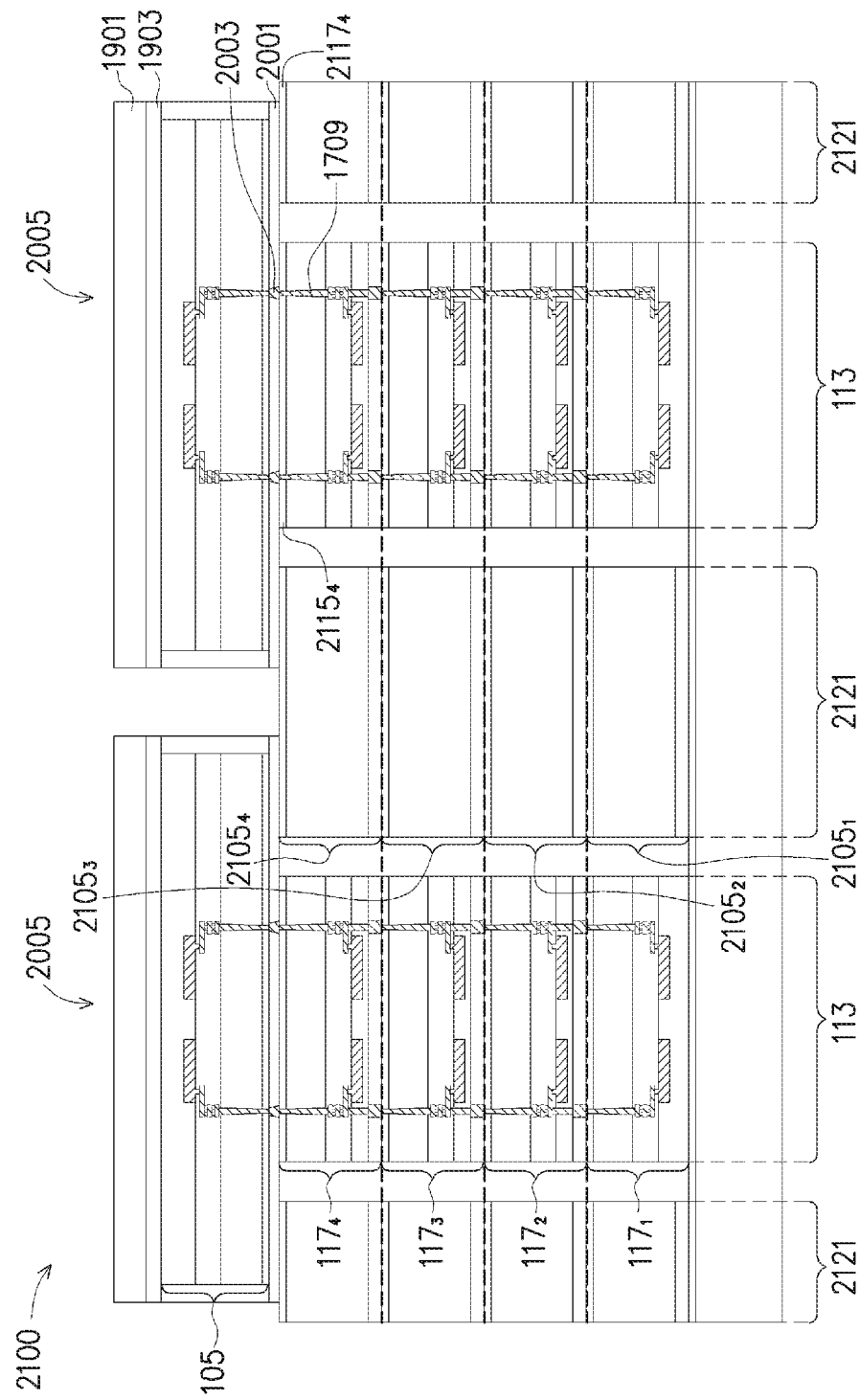

Referring to FIG. 21F, the IC die structures 2005 (see FIG. 20B) are bonded to the IC dies 117$_4$ of the die stacks 113. In some embodiments, IC die structures 2005 are bonded to the IC dies 117$_4$ using a direct bonding method, such as a hybrid bonding method. In such embodiments, the TVs 1709 of the IC dies 117$_4$ are direct bonded to the bond pads 2003 of the IC die structures 2005, and the insulating layers 2115$_4$ of IC dies 117$_4$ are direct bonded to the insulating layers 2001 of the IC die structures 2005. Furthermore, the insulating layers 2001 of the IC die structures 2005 may be direct bonded to the insulating layers $2117_4$ formed over the dummy structures $2105_4$. In some embodiments, after bonding the IC die structures 2005 to the IC dies $117_4$ and the dummy structures $2105_4$, an annealing process may be performed to strengthen the bond. The bonds between the TVs 1709 of the IC dies $117_4$ and the bond pads 2003 of the IC die structures 2005 provide electrical connections between the IC die structures 2005 and IC dies $117_4$. In some embodiments, the TVs 1709 of the IC dies $117_4$ and the bond pads 2003 of the IC die structures 2005 may comprise a same material. In other embodiments, the TVs 1709 of the IC dies $117_4$ and the bond pads 2003 of the IC die structures 2005 may comprise different materials. In some embodiments, the insulating layers 2001 of the IC die structures 2005 and the insulating layers $2115_4$ of the IC dies $117_4$ may comprise a same material. In other embodiments, the insulating layers 2001 of the IC die structures 2005 and the insulating layers $2115_4$ of the IC dies $117_4$ may comprise different materials. In some embodiments, the insulating layers 2001 and the insulating layers $2117_4$ may comprise a same material. In other embodiments, the insulating layers 2001 and the insulating layers $2117_4$ may comprise different materials.

Figure 21G:
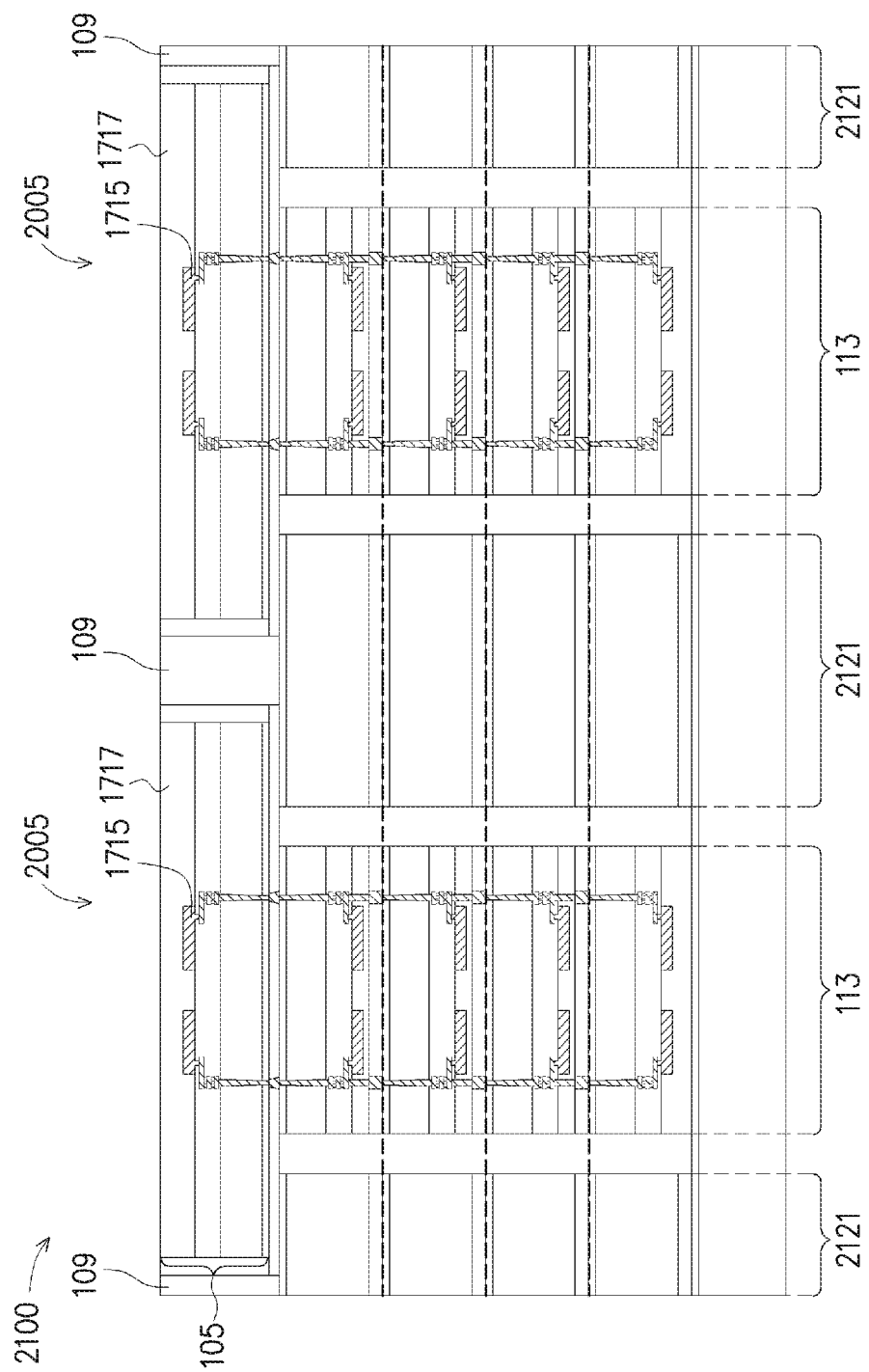

Referring to FIG. 21G, an encapsulant 109 is formed over and between the IC die structures 2005. In some embodiments, the encapsulant 109 may be formed using similar materials and methods as the encapsulant 107 described above with reference to FIG. 19B, and the description is not repeated herein. In some embodiments, the carriers 1901 and the insulating layers 1903 (see FIG. 21F) of the IC die structures 2005 and portions of the encapsulant 109 are removed to expose the insulating layers 1717 of the IC dies 105, such that exposed surfaces of the insulating layers 1717 are substantially level or coplanar with a topmost surface of the encapsulant 109. In some embodiments, the carriers 1901, the insulating layers 1903 and portions of the encapsulant 109 may be removed using a CMP process, a grinding process, an etching process, a combination thereof, or the like.

Figure 21H:
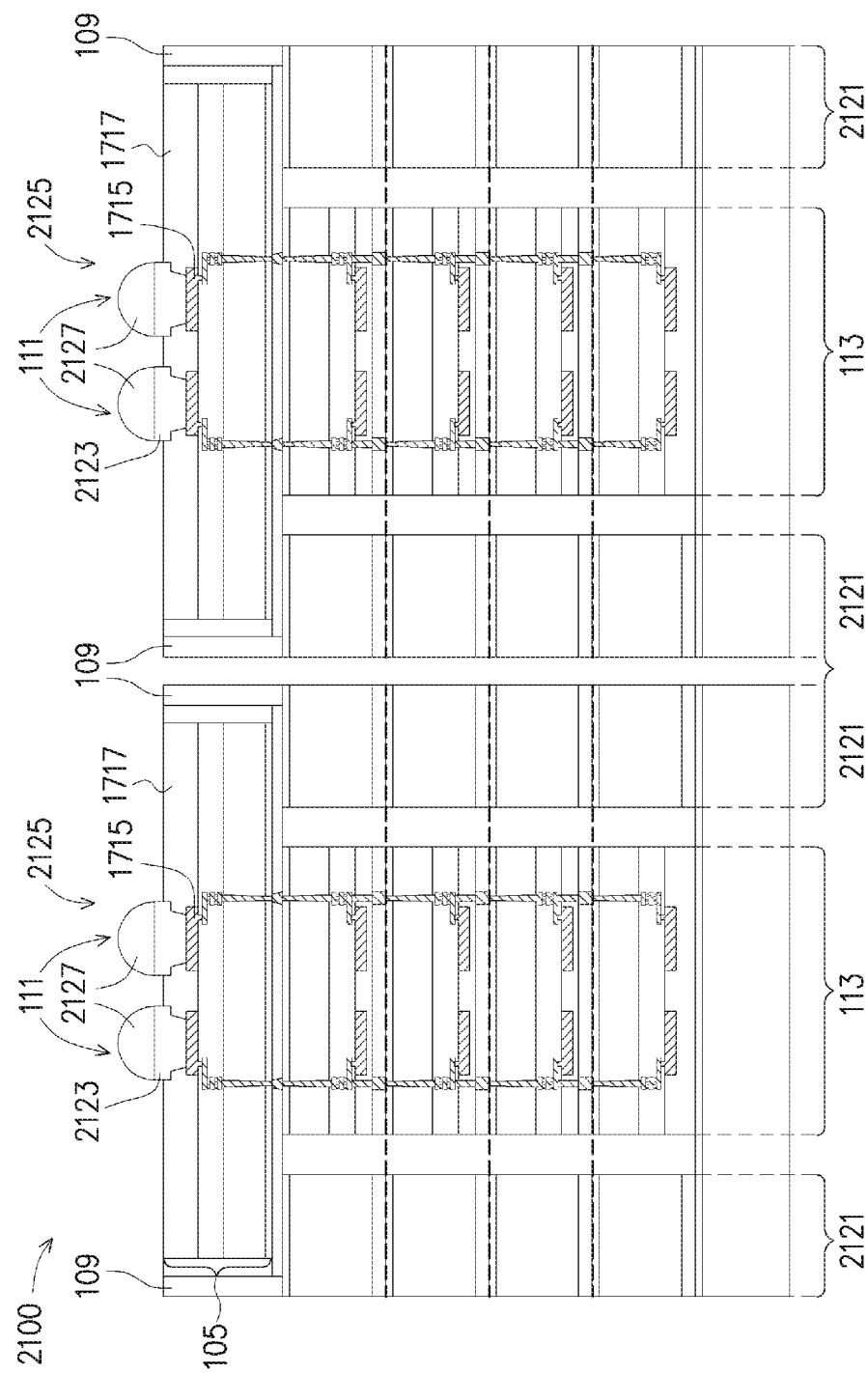

Referring to FIG. 21H, connectors 111 are formed over and electrically coupled to the respective contact pads 1715 of the IC dies 105. In some embodiments, each of the connectors 111 may comprise a conductive pillar bump 2123 and a solder element 2127 over the conductive pillar bump 2123. In some embodiments, the conductive pillar bumps 2123 may comprise a conductive material such as copper, tungsten, aluminum, silver, gold, a combination thereof, or the like. In some embodiments, the solder elements 2127 may comprise lead-based solders such as PbSn compositions, lead-free solders including InSb, tin, silver, and copper ("SAC") compositions, and other eutectic materials that have a common melting point and form conductive solder connections in electrical applications. For lead-free solders, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

In some embodiments, a method of forming the conductive pillar bumps 2123 may comprise forming openings in the insulating layers 1717 to expose respective contact pads 1715, forming a conductive seed layer over the insulating layers 1717 and in the openings of the insulating layers 1717, forming a sacrificial material (such as a photoresist material) over the conductive seed layer, patterning the sacrificial material to form openings in the sacrificial layer such that the openings of the sacrificial layer are aligned with respective openings of the insulating layers 1717 and are forming combined openings, depositing a conductive material in the combined openings using an electro-chemical plating process, an electroless plating process, ALD, PVD, a combination thereof, or the like to form the conductive pillar bumps 2123, removing the sacrificial layer, and removing exposed portions of the conductive seed layer. In some embodiments, before removing the sacrificial layer, a solder material is formed over the conductive material of the conductive pillar bumps 2123 in the combined openings using evaporation, an electro-chemical plating process, an electroless plating process, printing, solder transfer, a combination thereof, or the like to form the solder elements 2127. In other embodiments, the connectors 111 may be solder balls, controlled collapse chip connection (C4) bumps, ball grid array (BGA) balls, micro bumps, electroless nickel-electroless palladium-immersion gold technique (ENEPIG) formed bumps, or the like. In some embodiments where the connectors 111 comprise solder materials, a reflow process may be performed in order to shape the solder material into the desired bump shapes.

Referring further to FIG. 21H, after forming the connectors 111, the wafer-level die structure 2100 is singulated along the scribe lines 2109 and 2111 (see FIGS. 21B and 21C) into individual IC packages 2125, such that each IC packages 2125 comprises the IC die 105 with the respective die stack 113 and portions of the stacked dummy structures 2121. In some embodiments, the singulation process may comprise sawing, laser ablation, etching, a combination thereof, or the like. In some embodiments, the IC package 2125 corresponding to the die region $2113_1$ (see FIGS. 21B and 21C) forms the IC package 200 (see FIGS. 2A and 2B). In some embodiments, the IC package 2125 corresponding to the die region $2113_2$ (see FIGS. 21B and 21C) forms the IC package 100 (see FIGS. 1A and 1B). In some embodiments, the IC package 2125 corresponding to the die region $2113_3$ (see FIG. 21C) forms the IC package 400 (see FIGS. 4A and 4B). In some embodiments, the IC package 2125 corresponding to the die region $2113_4$ (see FIG. 21C) forms the IC package 300 (see FIGS. 3A and 3B).

FIGS. 22A-22D illustrate cross-sectional views of various processing steps during fabrication of integrated circuit packages (such as, for example, the IC packages 500-800 illustrated in FIGS. 5A and 5B, 6A and 6B, 7A and 7B, and 8A and 8B, respectively) in accordance with some embodiments. To highlight differences between the embodiment illustrated in FIGS. 22A-22D and the embodiment illustrated in FIGS. 21A-21H, the common features of these embodiments are labeled by same numerical references. Furthermore, the detailed descriptions of the common features (described above with reference to FIGS. 21A-21H) are not repeated herein.

Figure 22A:
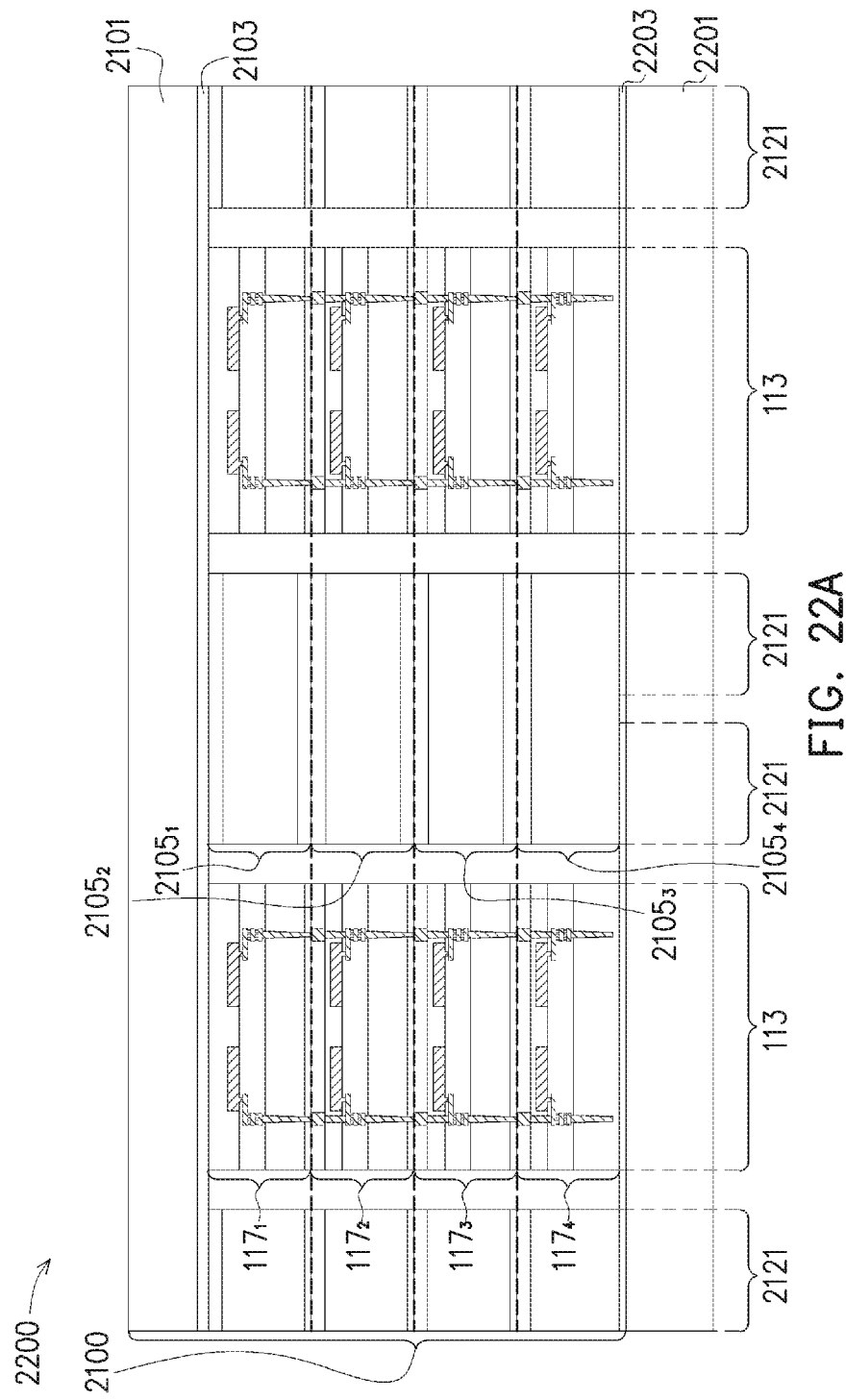

Referring to FIG. 22A, the wafer-level die structure 2100 illustrated in FIG. 21E is bonded to a carrier 2201 before forming the insulating layers $2115_4$ and $2117_4$ to start forming a wafer-level die structure 2200. In some embodiments, an insulating layer 2203 is formed over the carrier 2201 and the wafer-level die structure 2100 is bonded to the insulating layer 2203 using a direct bonding method, such as a fusion bonding method, for example. In other embodiments, the insulating layer 2203 may be omitted and the wafer-level die structure 2100 may be bonded to the carrier 2201 using a direct bonding method, such as a fusion bonding method, for example. In some embodiments, the carrier 2201 may be formed using similar materials and methods as the carrier 2101 described above with reference to FIG. 21A, and the description is not repeated herein. In some embodiments, the insulating layer 2203 may be formed using similar materials and methods as the insulating layer 2103 described above with reference to FIG. 21A, and the description is not repeated herein.

Referring to FIG. 22B, the carrier 2101 and the insulating layer 2103 are removed to expose the insulating layers 1717 of the IC dies $117_1$. In some embodiments, the carrier 2101 and the insulating layer 2103 may be removed using a CMP process, a grinding process, an etching process, a combination thereof, or the like. In some embodiments, an insulating layer 2205 is formed over the die stacks 113 and the stacked dummy structures 2121, and bond pads 2209 and corresponding vias 2207 are formed in the insulating layers 1717 and 2205. In some embodiments, the bond pads 2209 are formed in the insulating layer 2205 and the vias 2207 are formed in the insulating layers 1717. In some embodiments, the insulating layer 2205 may be formed using similar materials and methods as the insulating layer 1801 described above with reference to FIG. 18A, and the description is not repeated herein. In some embodiments, the bond pads 2209 and the vias 2207 may be formed using similar materials and methods as the bond pads 1805 and the vias 1803, respectively, described above with reference to FIG. 18A, and the description is not repeated herein. In some embodiments, the vias 2207 are in direct electrical contact with the respective interconnects 1713 of the IC dies $117_1$. In other embodiments, the vias 2207 may be in direct electrical contact with the respective contact pads 1715 of the IC dies $117_1$ and may be electrically connected to the respective interconnects 1713 of the IC dies $117_1$ through the respective contact pads 1715 of the IC dies $117_1$.

Figure 22C:
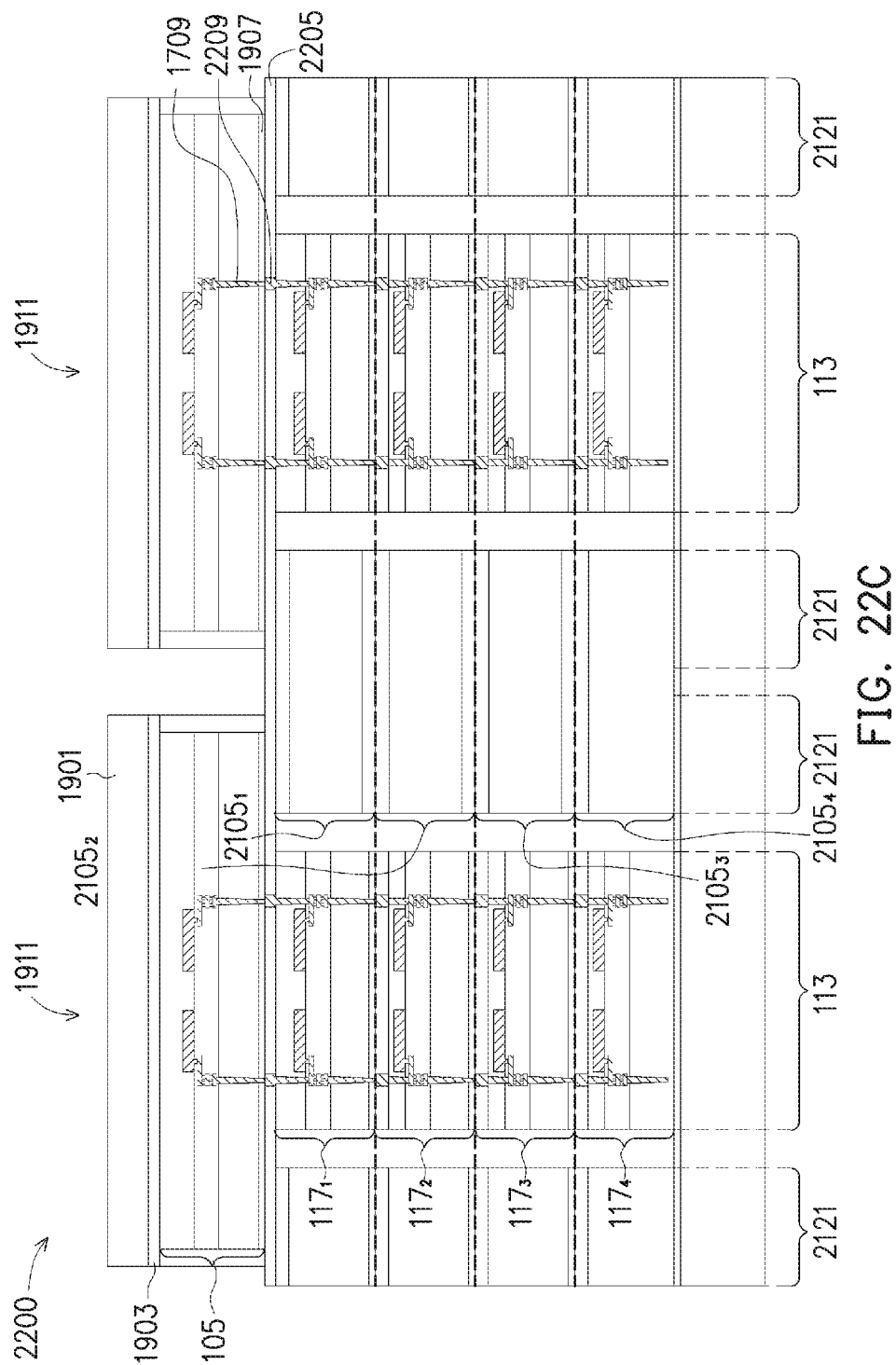

Referring to FIG. 22C, the IC die structures 1911 (see FIG. 19G) are bonded to the IC dies $117_1$ of the die stacks 113. In some embodiments, IC die structures 1911 are bonded to the respective IC dies $117_1$ using a direct bonding method, such as a hybrid bonding method. In such embodiments, the bond pads 2209 are direct bonded to respective TVs 1709 of the IC dies 105 of the IC die structures 1911, and the insulating layer 2205 is direct bonded to the insulating layers 1907 of the IC dies 105 of the IC die structures 1911. In some embodiments, after bonding the IC die structures 1911 to the respective die stacks 113, an annealing process may be performed to strengthen the bond. The bonds between the TVs 1709 of the IC dies 105 and the bond pads 2009 provide electrical connection between the IC die structures 1911 and the die stacks 113. In some embodiments, the TVs 1709 of the IC dies 105 and the bond pads 2209 may comprise a same material. In other embodiments, the TVs 1709 of the IC dies 105 and the bond pads 2209 may comprise different materials. In some embodiments, the insulating layer 2205 and the insulating layers 1907 of the IC die structures 1911 may comprise a same material. In other embodiments, the insulating layer 2205 and the insulating layers 1907 of the IC die structures 1911 may comprise different materials.

Figure 22D:
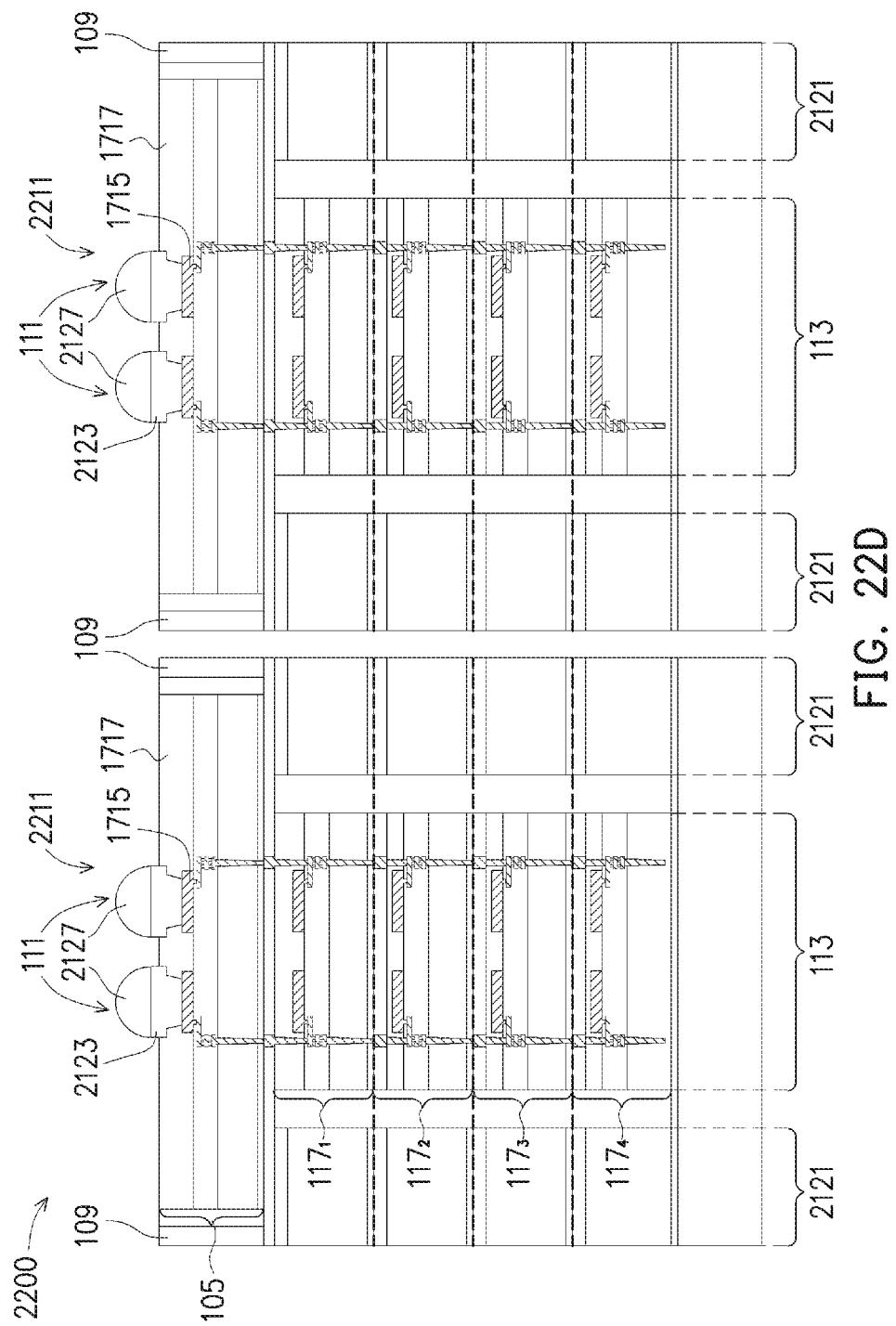

Referring to FIG. 22D, an encapsulant 109 is formed over and between the IC die structures 1911. In some embodiments, the encapsulant 109 may be formed using similar materials and methods as the encapsulant 107 described above with reference to FIG. 19B, and the description is not repeated herein. In some embodiments, the carriers 1901 and the insulating layers 1903 (see FIG. 22C) of the IC die structures 1911 and portions of the encapsulant 109 are removed to expose the insulating layers 1717 of the IC dies 105, such that exposed surfaces of the insulating layers 1717 are substantially level or coplanar with a topmost surface of the encapsulant 109. In some embodiments, the carriers 1901, the insulating layers 1903 and portions of the encapsulant 109 may be removed using a CMP process, a grinding process, an etching process, a combination thereof, or the like.

In some embodiments, after removing the carriers 1901 and the insulating layers 1903, connectors 111 are formed over and electrically coupled to the respective contact pads 1715 of the IC dies 105 as described above with reference to FIG. 21H, and the description is not repeated herein. In some embodiments, after forming the connectors 111, the wafer-level die structure 2200 is singulated along the scribe lines 2109 and 2111 (see FIGS. 21B and 21C) into individual IC packages 2211, such that each IC package 2211 comprises the IC die 105 with the respective die stack 113 and portions of the stacked dummy structures 2121. In some embodiments, the singulation process may comprise sawing, laser ablation, etching, a combination thereof, or the like. In some embodiments, the IC package 2211 corresponding to the die region $2113_1$ (see FIGS. 21B and 21C) forms the IC package 600 (see FIGS. 6A and 6B). In some embodiments, the IC package 2211 corresponding to the die region $2113_2$ (see FIGS. 21B and 21C) forms the IC package 500 (see FIGS. 5A and 5B). In some embodiments, the IC package 2211 corresponding to the die region $2113_3$ (see FIG. 21C) forms the IC package 800 (see FIGS. 8A and 8B). In some embodiments, the IC package 2211 corresponding to the die region $2113_4$ (see FIG. 21C) forms the IC package 700 (see FIGS. 7A and 7B).

FIGS. 23A-23F illustrate top and cross-sectional views of various processing steps during fabrication of integrated circuit packages (such as, for example, the IC packages 900-1200 illustrated in FIGS. 9A and 9B, 10A and 10B, 11A and 11B, and 12A and 12B, respectively) in accordance with some embodiments. To highlight differences between the embodiment illustrated in FIGS. 23A-23F and the embodiment illustrated in FIGS. 21A-21H, the common features of these embodiments are labeled by same numerical references. Furthermore, the detailed descriptions of the common features (described above with reference to FIGS. 21A-21H) are not repeated herein. In the embodiment illustrated in FIGS. 21A-21H, the IC dies 105 are bonded to the respective die stacks 113, such that the die stacks 113 are parts of the un-singulated wafer-level die structure 2100 (see, for example, FIG. 21F), while the IC dies 105 are parts of the singulated IC die structures 2005 (see, for example, FIG. 21F). As described below in greater detail, in the embodiment illustrated in FIGS. 23A-23F, the IC dies 105 are bonded to the die stacks 113, such that the die stacks 113 are parts of the singulated die structures (see, for example, FIG. 23B), while the IC dies 105 are parts of the un-singulated wafer-level die structure (see, for example, FIG. 23B).

Figure 23A:
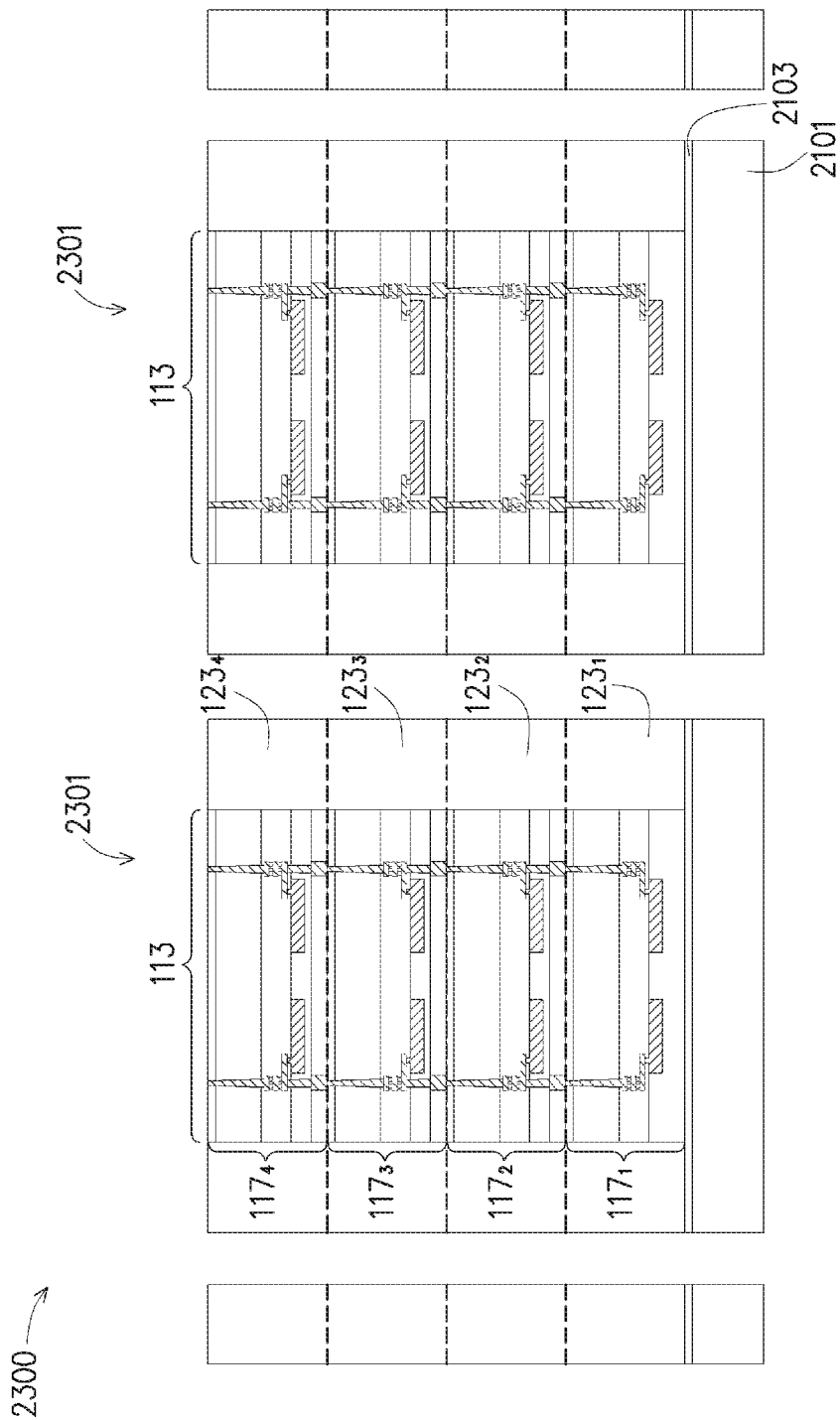
FIGS. 23A-23F illustrate top and cross-sectional views of various processing steps during fabrication of integrated circuit packages in accordance with some embodiments.

Referring to FIG. 23A, a wafer-level die structure 2300 is illustrated. In some embodiments, the wafer-level die structure 2300 is similar to the wafer-level die structure 2100 illustrated in FIG. 21E, with like features labeled with like numerical references and with the distinction that the stacked dummy structures 2121 have been omitted. In some embodiments, the wafer-level die structure 2300 may be formed as described above with reference to FIGS. 21A-21E, without forming the stacked dummy structures 2121, and the description is not repeated herein. In some embodiments, the wafer-level die structure 2300 is singulated into individual (chip-level or die-level) IC die structures 2301. In some embodiments, the singulation process may comprise sawing, laser ablation, etching, a combination thereof, or the like.

Figure 23B:
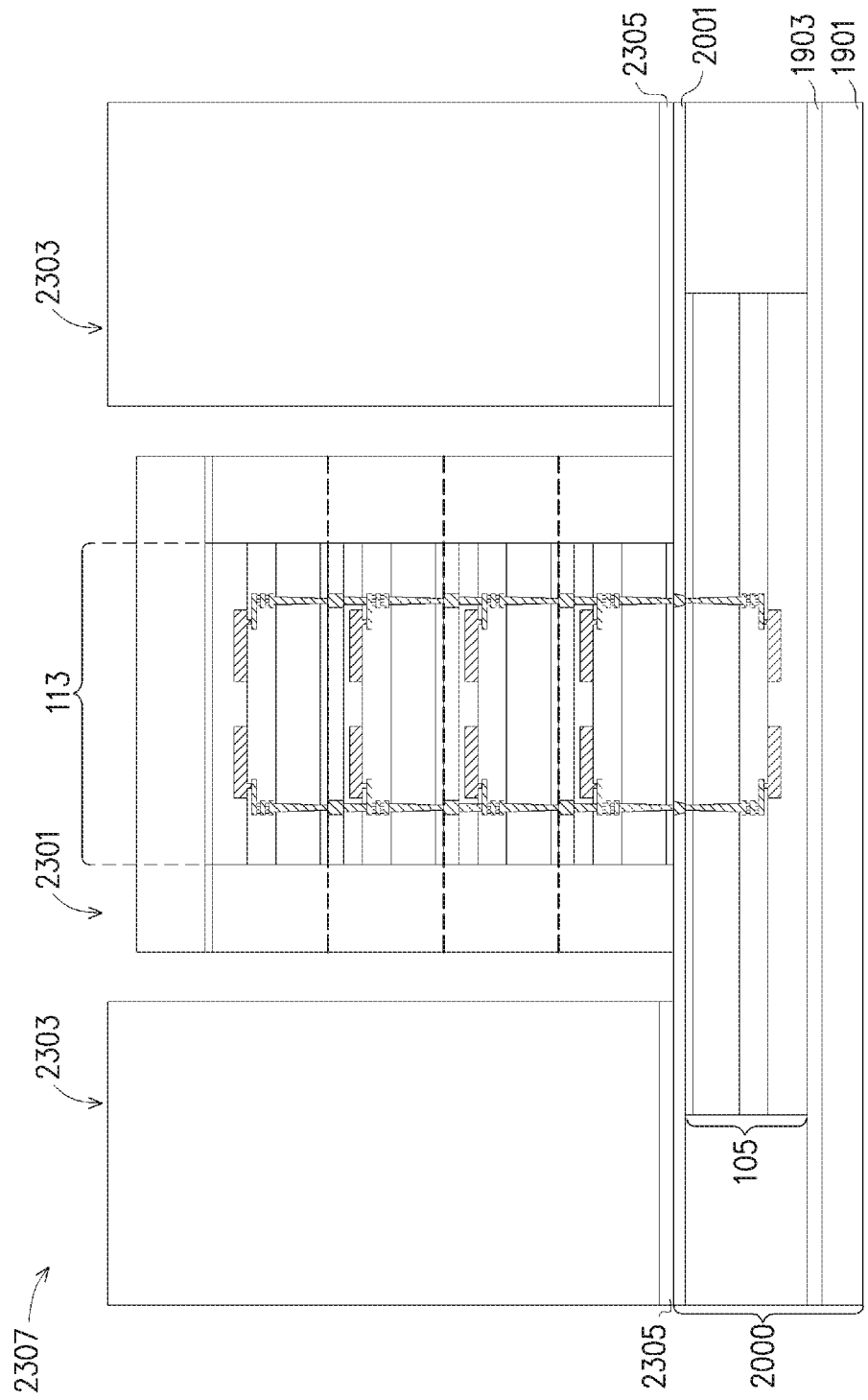

Referring to FIG. 23B, in some embodiments, the IC die structures 2301 are bonded to respective IC dies 105, while the IC dies 105 are still part of the un-singulated wafer-level die structure 2000 (see FIG. 20A) to start forming a wafer-level die structure 2307. In some embodiments, the IC die structures 2301 are bonded to respective IC dies 105 as described above with reference to FIG. 21F, and the description is not repeated herein. In some embodiments, dummy structures 2303 are bonded to the insulating layer 2001 of the wafer-level die structure 2000, such that each IC die structure 2301 is interposed between adjacent dummy structures 2303. In some embodiments, the dummy structures 2303 may be formed using similar materials and methods as the dummy structures $2105_1$ described above with reference to FIG. 21A, and the description is not repeated herein. In some embodiments, each dummy structure 2303 may comprise an insulating layer 2305 on one side. In some embodiments, the insulating layers 2305 may be formed using similar materials and methods as the insulating layers $2107_1$ described above with reference to FIG. 21A, and description is not repeated herein. In some embodiments, the insulating layers 2305 and the insulating layer 2001 may comprise a same material. In other embodiments, the insulating layers 2305 and the insulating layer 2001 may comprise different materials. In some embodiments, the dummy structures 2303 may be bonded to the insulating layer 2001 by bonding the insulating layers 2305 of the dummy structures 2303 to the insulating layer 2001. In some embodiments, the insulating layers 2305 may be bonded to the insulating layer 2001 using a direct bonding method, such a fusion bonding method. In some embodiments, surface treatment processes may be performed on the insulating layers 2305 and the insulating layer 2001 prior to bonding the insulating layers 2305 to the insulating layer 2001. Subsequently, an annealing process may be performed to strengthen the bond between the dummy structures 2303 and the wafer-level die structure 2000.

Figure 23C:
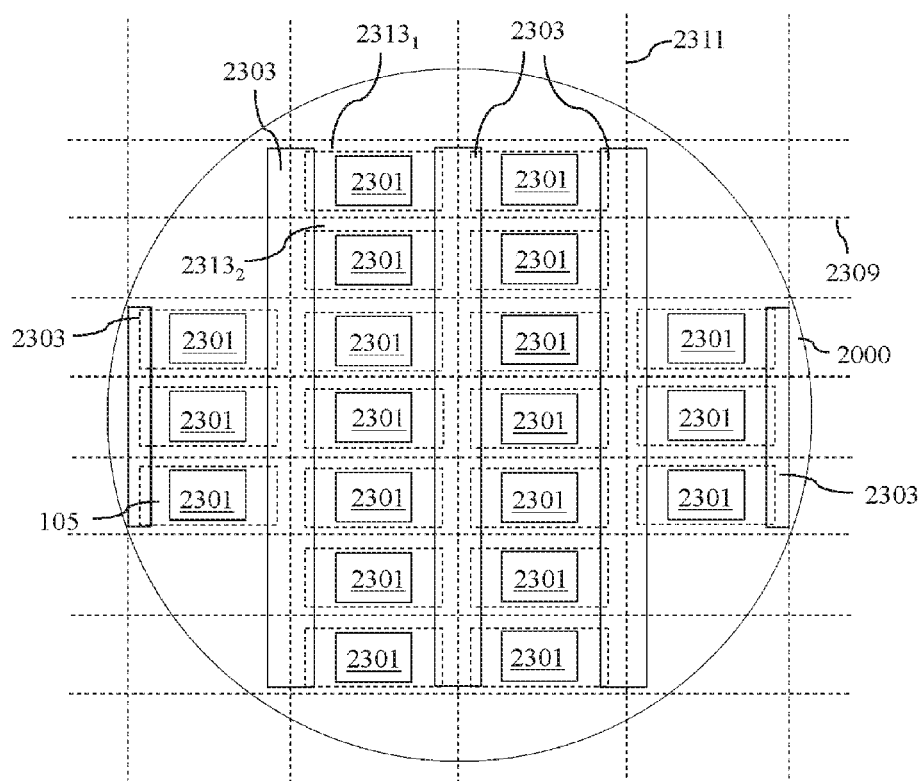

FIG. 23C illustrates a top view of the wafer-level die structure 2307 illustrated in FIG. 23B in accordance with some embodiments. In some embodiments, the wafer-level die structure 2000 is separated into die regions 2313, (where i=1, ... , N, with N being the total number of die regions) by scribe lines 2309 and 2311. In some embodiments, the scribe lines 2309 are perpendicular to the scribe lines 2311. In such embodiments, the die regions 2313, (where i= 1, ... , N) have rectangular shapes in a top view. In other embodiments, the scribe lines 2309 and the scribe lines 2311 may form angles different from 90 degrees. In such embodiments, the die regions 2313, (where i=1, ... , N) have shapes of a parallelogram in a top view. In some embodiments, the dummy structures 2303 have rectangular shapes in a top view. In some embodiments, the dummy structures 2303 overlap with respective scribe lines 2311, such that the dummy structures 2303 are shared between a subset of the die regions $2113_i$ (where i=1, ... , N) separated by the respective scribe lines 2311. In some embodiments, the dummy structures 2303 may form continuous structures extending along an entirety of the usable portion (such as the portion comprising the die regions $2113_i$) of the wafer-level die structure 2000, such that each scribe line 2311 is overlapped by a respective single continuous dummy structure 2303. As described below in greater detail, the wafer-level die structure 2307 is singulated along the scribe lines 2309 and 2311 to form individual IC packages. Such a singulation process also singulates the dummy structures 2303 and forms individual (chip-level or die-level) dummy structures for respective individual IC packages. In some embodiments, by forming the dummy structures 2303 that overlap with the scribe lines 2311, a time for forming the individual IC packages may be reduced. For example, the time for forming the individual IC packages may be reduced by a time that would be required to place and bond individual (chip-level or die-level) dummy structures within each die region of the wafer-level die structure 2000 before the singulation process. Accordingly, a wafer per hour (WPH) yield may be increased and production cost may be reduced during the production of IC packages.

Figure 23D:
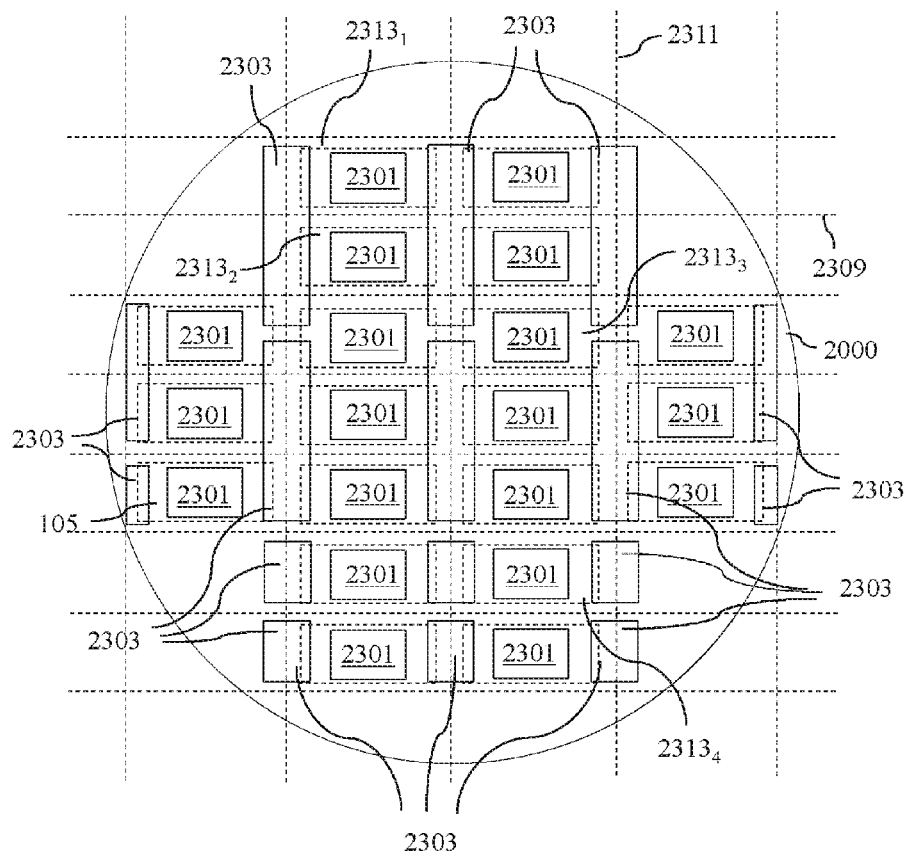

FIG. 23D illustrates a top view of the wafer-level die structure 2307 illustrated in FIG. 23B in accordance with alternative embodiments. The embodiment illustrated in FIG. 23D is similar to the embodiment illustrated in FIG. 23C, with like elements being labeled with like numerical references, and the detailed description is not repeated herein. In the embedment illustrated in FIG. 23D, the dummy structures 2303 do not form continuous structures extending along the entirety of the usable portion of the wafer-level die structure 2000. Instead, each scribe line 2311 is overlapped by a plurality of disconnected dummy structures 2303 of varying lengths.

Figure 23E:
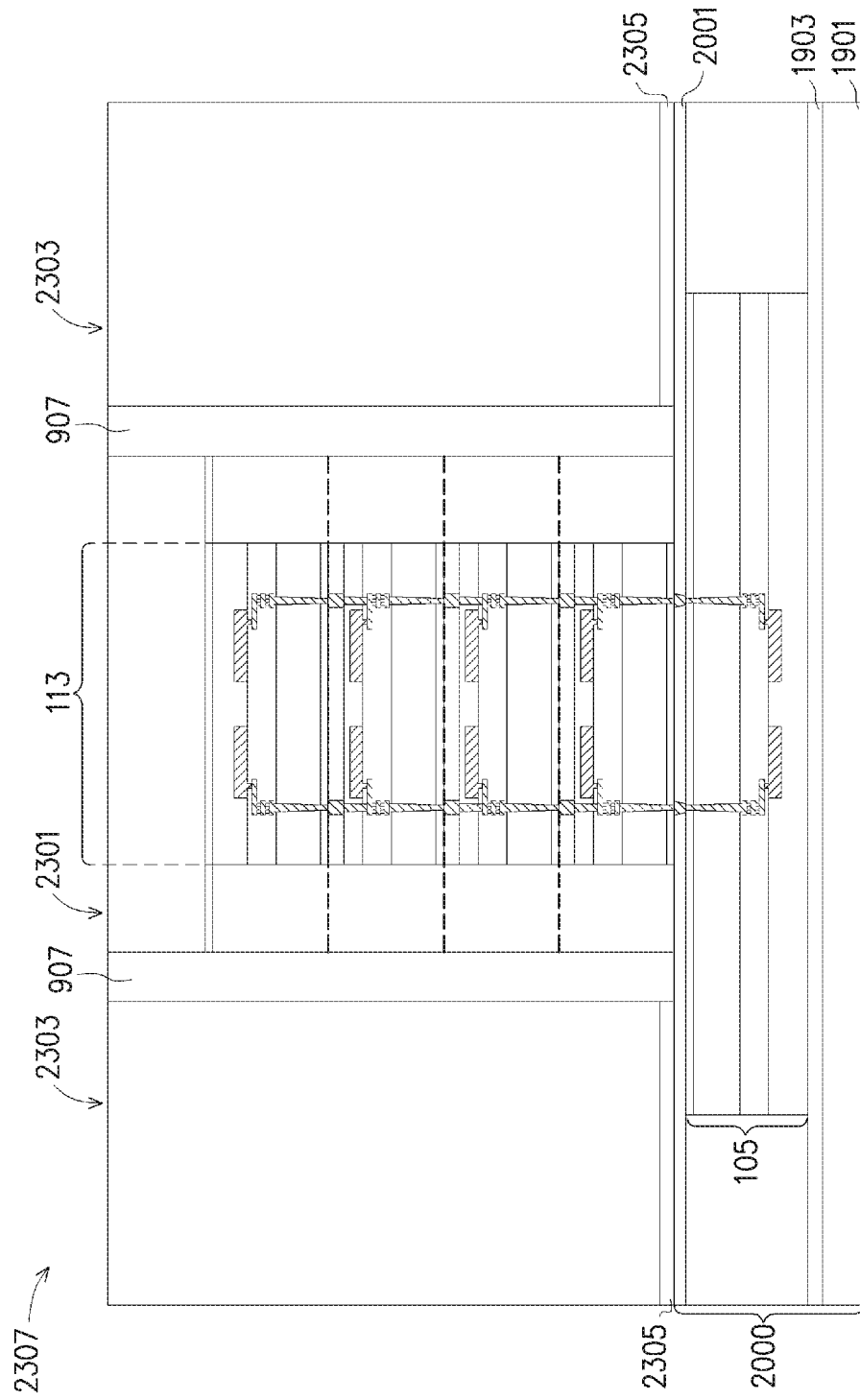

Referring to FIG. 23E, an encapsulant 907 is formed over and surrounding the IC die structures 2301 and the dummy structures 2303. In some embodiments, the encapsulant 907 may be formed using similar materials methods as the encapsulant 107 described above with reference to FIG. 19B, and the description is not repeated herein. Subsequently, the encapsulant 907, the IC die structures 2301 and the dummy structures 2303 are planarized, such that topmost surfaces of the IC die structures 2301 are substantially level or coplanar with topmost surfaces of the dummy structures 2303 and a topmost surface of the encapsulant 907. In some embodiments, the planarization process may comprise a CMP process, a grinding process, an etching process, a combination thereof, or the like.

Figure 23F:
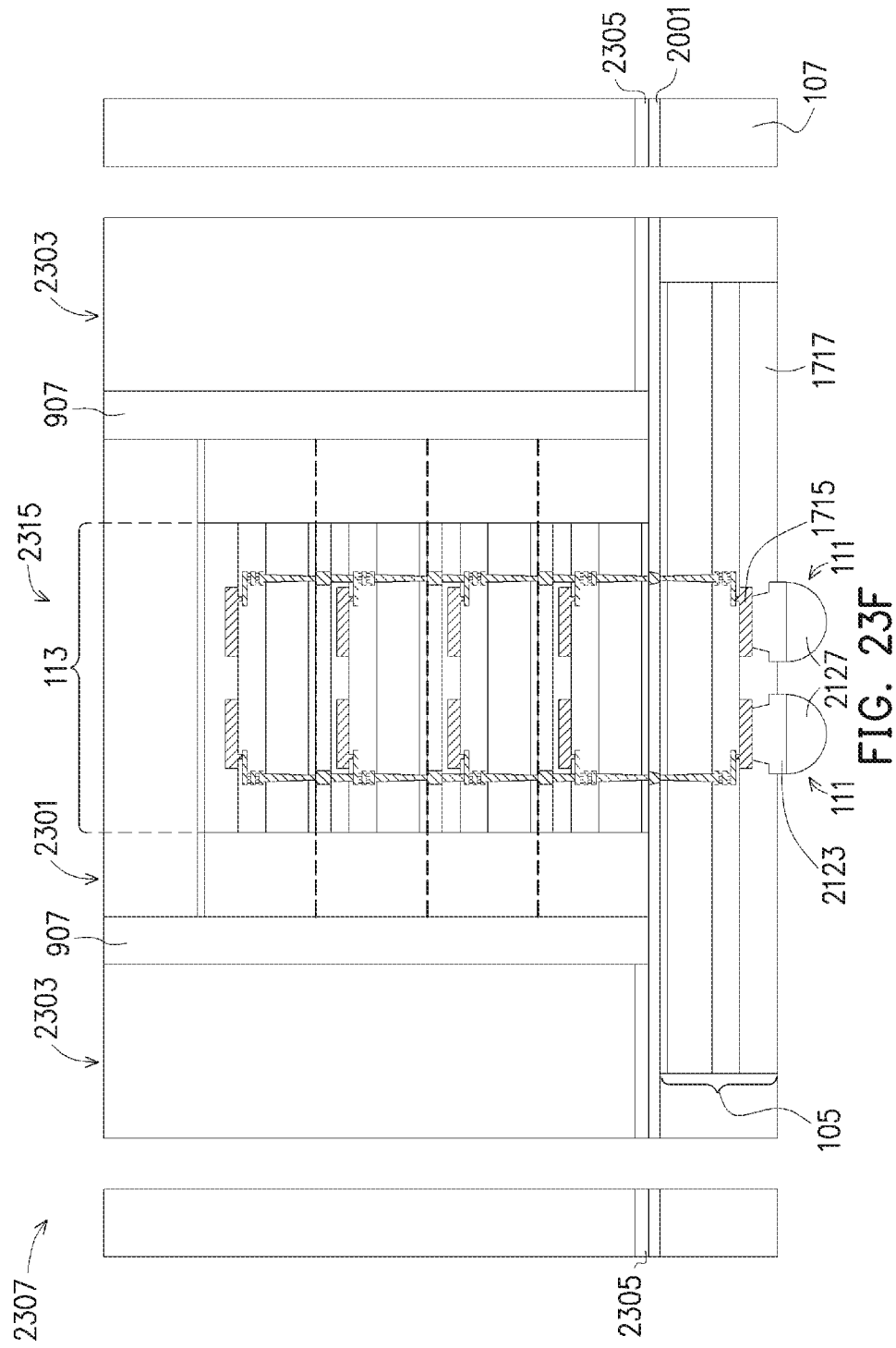

Referring to FIG. 23F, in some embodiments, the carrier 1901 and the insulating layer 1903 (see FIG. 23E) are removed from the wafer-level die structure 2000 to expose the insulating layers 1717 of the IC dies 105 and the encapsulant 107, such that exposed surfaces of the insulating layers 1717 are substantially level or coplanar with the exposed surface of the encapsulant 107. In some embodiments, the carrier 1901 and the insulating layer 1903 may be removed using a CMP process, a grinding process, an etching process, a combination thereof, or the like.

Referring further to FIG. 23F, connectors 111 are formed over and electrically coupled to the respective contact pads 1715 of the IC dies 105 as described above with reference to FIG. 21H, and the description is not repeated herein. After forming the connectors 111, the wafer-level die structure 2307 is singulated along the scribe lines 2309 and 2311 (see FIGS. 23C and 23D) into individual IC packages 2315, such that each IC package 2315 comprises the IC die 105 with the respective die stack 113 and portions of the respective dummy structures 2303. In some embodiments, the singulation process may comprise sawing, laser ablation, etching, a combination thereof, or the like. In some embodiments, the IC package 2315 corresponding to the die region $2313_1$ (see FIGS. 23C and 23D) forms the IC package 1000 (see FIGS. 10A and 10B). In some embodiments, the IC package 2315 corresponding to the die region $2313_2$ (see FIGS. 23C and 23D) forms the IC package 900 (see FIGS. 9A and 9B). In some embodiments, the IC package 2315 corresponding to the die region $2313_3$ (see FIG. 23D) forms the IC package 1200 (see FIGS. 12A and 12B). In some embodiments, the IC package 2315 corresponding to the die region 2313₄ (see FIG. 23 D) forms the IC package 1100 (see FIGS. 11A and 11B).

Figure 24A:
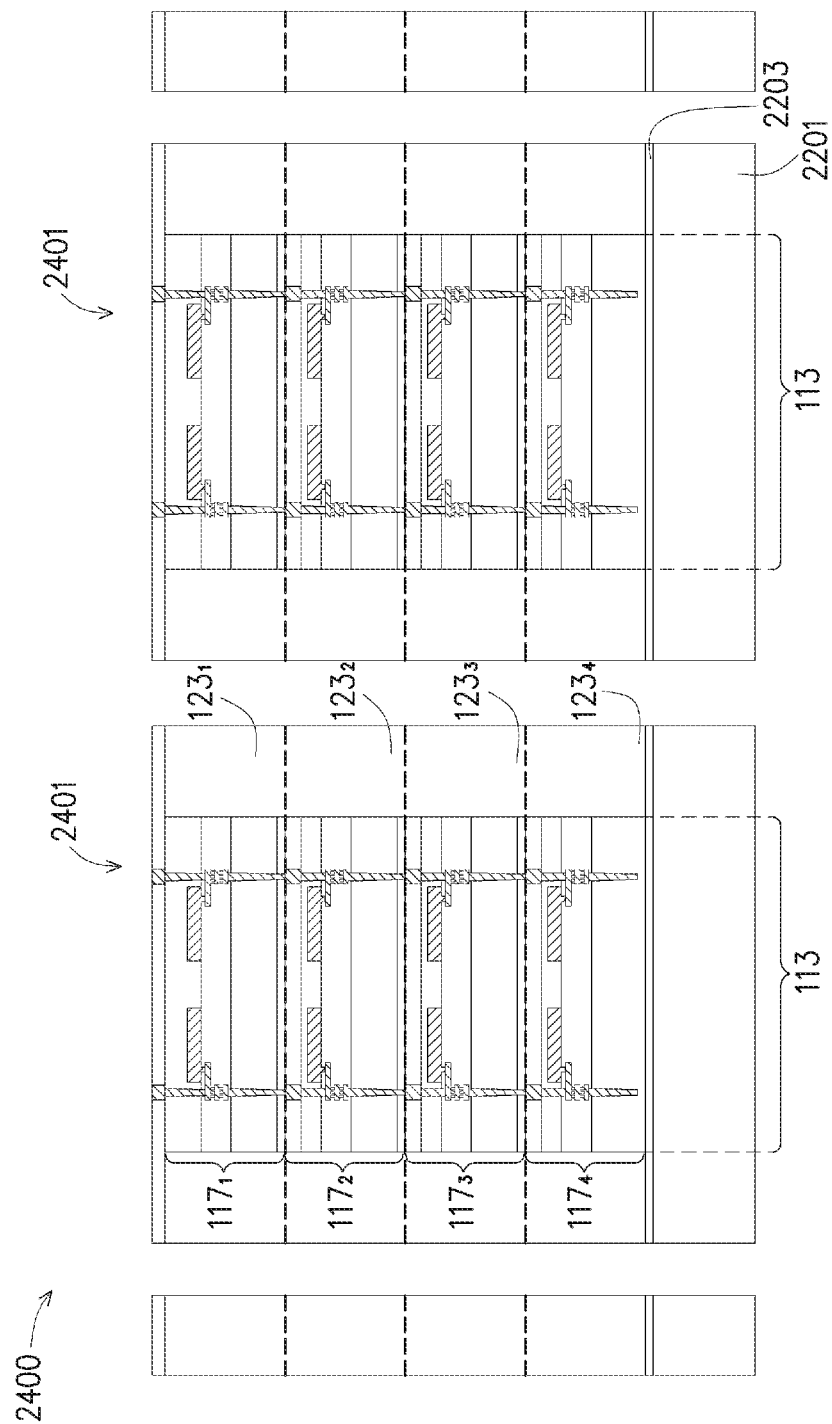
Figure 24B:
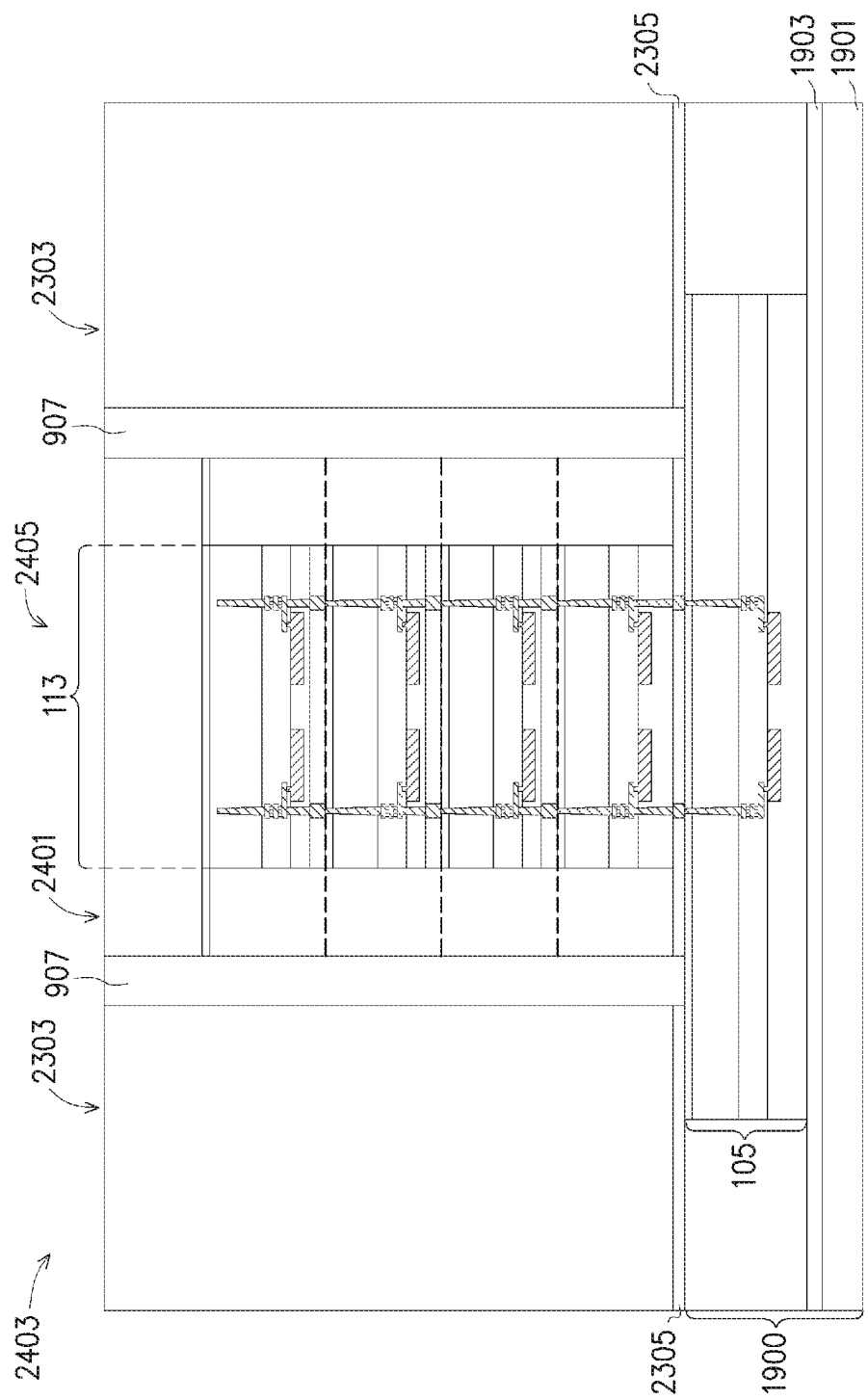

FIGS. 24A-24C illustrate cross-sectional views of various processing steps during fabrication of integrated circuit packages (such as, for example, the IC packages 1300-1600 illustrated in FIGS. 13A and 13B, 14A and 14B, 15A and 15B, and 16A and 16B, respectively) in accordance with some embodiments. To highlight differences between the embodiment illustrated in FIGS. 24A-24C and the embodiment illustrated in FIGS. 23A-23F, the common features of these embodiments are labeled by same numerical references. Furthermore, the detailed descriptions of the common features (described above with reference to FIGS. 23A-23F) are not repeated herein.

Referring to FIG. 24A, a wafer-level die structure 2400 is illustrated. In some embodiments, the wafer-level die structure 2400 is similar to the wafer-level die structure 2200 illustrated in FIG. 22B, with like features labeled with like numerical references and with the distinction that the stacked dummy structures 2121 have been omitted. In some embodiments, the wafer-level die structure 2400 may be formed as described above with reference to FIGS. 22A and 22B, without forming the stacked dummy structures 2121, and the description is not repeated herein. In some embodiments, the wafer-level die structure 2400 is singulated into individual (chip-level or die-level) IC die structures 2401. In some embodiments, the singulation process may comprise sawing, laser ablation, etching, a combination thereof, or the like.

Referring to FIG. 24B, in some embodiments, the IC die structures 2401 are bonded to respective IC dies 105, while the IC dies 105 are still part of the un-singulated wafer-level die structure 1900 (see FIG. 19E) to start forming a wafer-level die structure 2403. In some embodiments, the IC die structures 2401 are bonded to respective IC dies 105 of the wafer-level die structure 1900 as described above with reference to FIG. 22C, and the description is not repeated herein. In some embodiments, dummy structures 2303 are bonded to the wafer-level die structure 1900 such that each IC die structure 2401 is interposed between adjacent dummy structures 2303. In some embodiments, the dummy structures 2303 may be bonded to the wafer-level die structure 1900 by bonding the insulating layers 2305 of the dummy structures 2303 to the wafer-level die structure 1900. In some embodiments, the insulating layers 2305 may be bonded to the wafer-level die structure 1900 using a direct bonding method, such a fusion bonding method. Subsequently, an annealing process may be performed to strengthen the bond between the dummy structures 2303 and the wafer-level die structure 1900.

Referring further to FIG. 24B, an encapsulant 907 is formed over and surrounding the IC die structures 2401 and the dummy structures 2303. Subsequently, the encapsulant 907, the IC die structures 2401 and the dummy structures 2303 are planarized, such that topmost surfaces of the IC die structures 2401 are substantially level or coplanar with topmost surfaces of the dummy structures 2303 and a topmost surface of the encapsulant 907. In some embodiments, the planarization process may comprise a CMP process, a grinding process, an etching process, a combination thereof, or the like.

Referring to FIG. 24C, the carrier 1901 and the insulating layer 1903 (see FIG. 24B) of the wafer-level die structure 1900 are removed to expose the insulating layers 1717 of the IC dies 105 and the encapsulant 107, such that exposed surfaces of the insulating layers 1717 are substantially level or coplanar with the exposed surface of the encapsulant 107. In some embodiments, the carrier 1901 and the insulating layer 1903 may be removed using a CMP process, a grinding process, an etching process, a combination thereof, or the like.

Referring to further to FIG. 24C, connectors 111 are formed over and electrically coupled to the respective contact pads 1715 of the IC dies 105 as described above with reference to FIG. 21H, and the description is not repeated herein. After forming the connectors 111, the wafer-level die structure 2403 is singulated along the scribe lines 2309 and 2311 (see FIGS. 23C and 23D) into individual IC packages 2405, such that each IC package 2405 comprises the IC die 105 with the respective die stack 113 and portions of the respective dummy structures 2303. In some embodiments, the singulation process may comprise sawing, laser ablation, etching, a combination thereof, or the like. In some embodiments, the IC package 2405 corresponding to the die region 2313₁ (see FIGS. 23C and 23D) forms the IC package 1400 (see FIGS. 14A and 14B). In some embodiments, the IC package 2405 corresponding to the die region 2313₂ (see FIGS. 23C and 23D) forms the IC package 1300 (see FIGS. 13A and 13B). In some embodiments, the IC package 2405 corresponding to the die region 2313₃ (see FIG. 23D) forms the IC package 1600 (see FIGS. 16A and 16B). In some embodiments, the IC package 2405 corresponding to the die region 2313₄ (see FIG. 23 D) forms the IC package 1500 (see FIGS. 15A and 15B).

Figure 25:
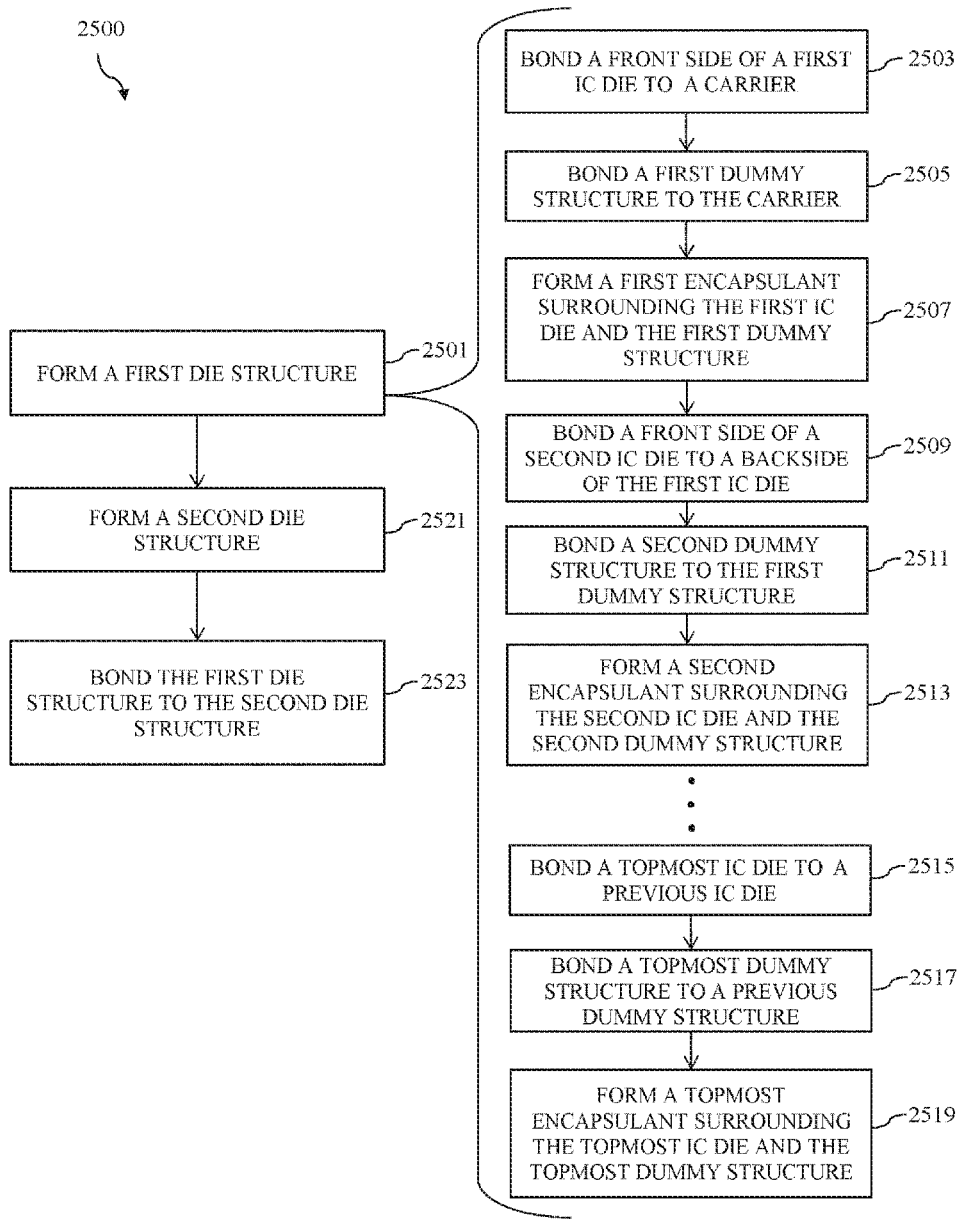
FIG. 25 is a flow diagram illustrating a method of forming of integrated circuit packages in accordance with some embodiments.

FIG. 25 is a flow diagram illustrating a method 2500 of forming of integrated circuit packages (such as, for example, IC packages 100-800 illustrated in FIGS. 1A and 1B, 2A and 2B, 3A and 3B, 4A and 4B, 5A and 5B, 6A and 6B, 7A and 7B, 8A and 8B, respectively) in accordance with some embodiments. The method starts with step 2501, where a first die structure (such as, for example, the IC die structures 103 in FIGS. 1A and 1B) is formed as described above with reference to FIGS. 21A-21E. In step 2521 a second die structure (such as, for example, the IC die structures 101 in FIGS. 1A and 1B) is formed as described above with reference to FIGS. 20A and 20B. In step 2523, the first die structure is bonded to the second die structure as described above with reference to FIG. 21F. A method of forming the first die structure starts with step 2503, where a first IC die (such as, for example, the IC die 117₁ illustrated in FIG. 21A) is bonded to a carrier (such as, for example, the carrier 2101 illustrated in FIG. 21A) as described above with reference to FIG. 21A. In step 2505, a first dummy structure (such as, for example, the dummy structure 2105₁ illustrated in FIG. 21A) is bonded to the carrier as described above with reference to FIG. 21A. In step 2507, a first encapsulant (such as, for example, the encapsulant 123₁ illustrated in FIG. 21D) is formed surrounding the first IC die and the first dummy structure as described above with reference to FIG. 21D. In step 2509, a second IC die (such as, for example, the IC die 117₂ illustrated in FIG. 21E) is bonded to the first IC die as described above with reference to FIG. 21E. In step 2511, a second dummy structure (such as, for example, the dummy structure 2105₂ illustrated in FIG. 21E) is bonded to the first dummy structure as described above with reference to FIG. 21E. In step 2513, a second encapsulant (such as, for example, the encapsulant 123₂ illustrated in FIG. 21E) is formed surrounding the second IC die and the second dummy structure as described above with reference to FIG. 21E. In some embodiments, the stacking process may continue until the desired number of IC dies and the desired number of dummy structures are bonded to the carrier. In step 2515, a topmost IC die (such as, for example, the IC die 117₄ illustrated in FIG. 21E) is bonded to a previous IC die (such as, for example, the IC die 117₃ illustrated in FIG. 21E) as described above with reference to FIG. 21E. In step 2517, a topmost dummy structure (such as, for example, the dummy die 2105₄ illustrated in FIG. 21E) is bonded to a previous dummy structure (such as, for example, the dummy structure 2105₃ illustrated in FIG. 21E) as described above with reference to FIG. 21E. In step 2519, a topmost encapsulant (such as, for example, the encapsulant 123₄ illustrated in FIG. 21E) is formed surrounding the topmost die IC die and the topmost dummy structure as described above with reference to FIG. 21E.

Figure 26:
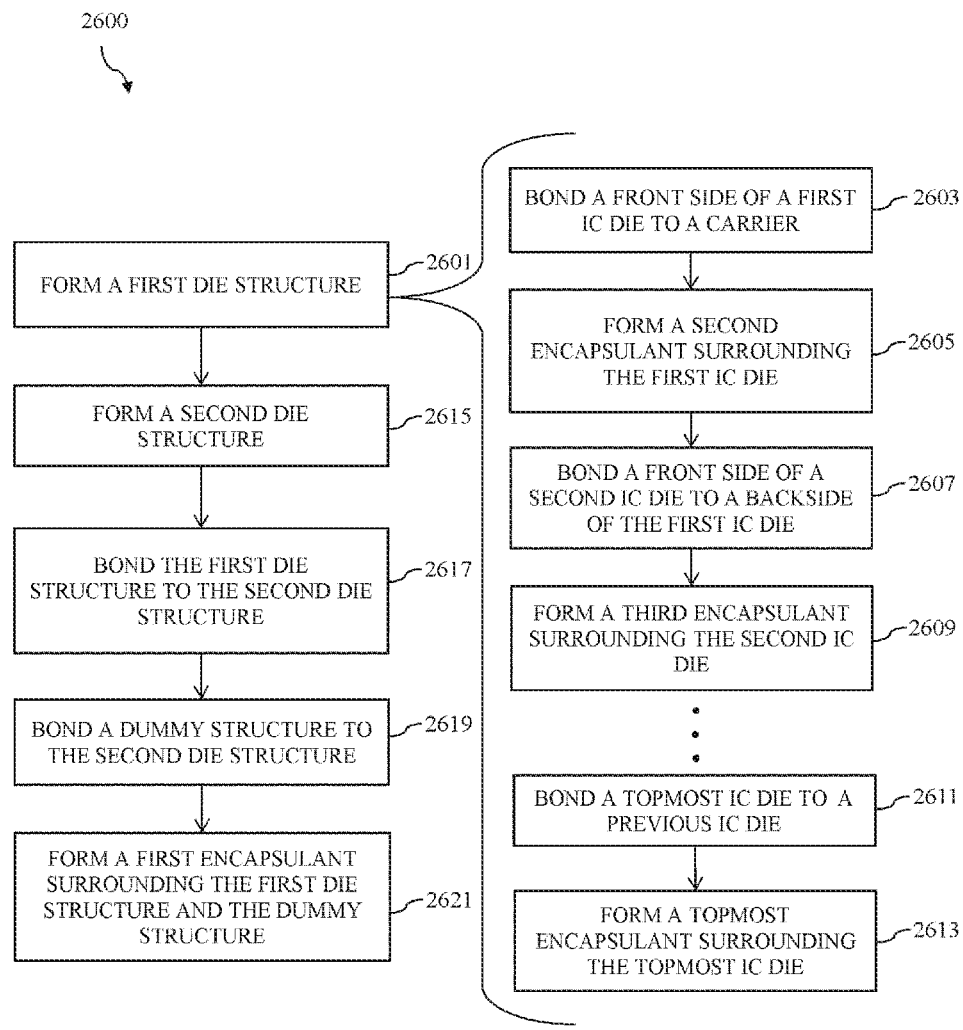
FIG. 26 is a flow diagram illustrating a method of forming of integrated circuit packages in accordance with some embodiments.

FIG. 26 is a flow diagram illustrating a method 2600 of forming of integrated circuit packages (such as, for example, the IC package 900-1600 illustrated in FIGS. 9A and 9B, 10A and 10B, 11A and 11B, 12A and 12B, 13A and 13B, 14A and 14B, 15A and 15B, 16A and 16B, respectively) in accordance with some embodiments. The method starts with step 2601, where a first die structure (such as, for example, the IC die structure 2301 illustrated in FIG. 23A) is formed as described above with reference to FIG. 23A. In step 2615, a second die structure (such as, for example, the wafer-level die structure 2000 illustrated in FIG. 23B) is formed as described above with reference to FIGS. 20A and 20B. In step 2617, the first die structure is bonded to the second die structure as described above with reference to FIG. 23B. In step 2619, a dummy structure (such as, for example, the dummy structure 2303 illustrated in FIG. 23B) is bonded to the second die structure as described above with reference to FIG. 23B. In step 2621, a first encapsulant (such as, for example, the encapsulant 907 illustrated in FIG. 23E) is formed surrounding the first die structure and the dummy structure as described above with reference to FIG. 23E. A method of forming the first die structure starts with step 2603, where a first IC die (such as, for example, the IC die 117₁ illustrated in FIG. 23A) is bonded to a carrier (such as, for example, the carrier 2101 illustrated in FIG. 23A) as described above with reference to FIG. 23A. In step 2605, a second encapsulant (such as, for example, the encapsulant 123₁ illustrated in FIG. 23A) is formed surrounding the first IC die as described above with reference to FIG. 23A. In step 2607, a second IC die (such as, for example, the IC die 117₂ illustrated in FIG. 23A) is bonded to the first IC die as described above with reference to FIG. 23A. In step 2609, a third encapsulant (such as, for example, the encapsulant 123₂ illustrated in FIG. 23A) is formed surrounding the second IC die as described above with reference to FIG. 23A. In some embodiments, the stacking process may continue until the desired number of IC dies is bonded to the carrier. In step 2611, a topmost IC die (such as, for example, the IC die 117₄ illustrated in FIG. 23A) is bonded to a previous IC die (such as, for example, the IC die 117₃ illustrated in FIG. 23A) as described above with reference to FIG. 23A. In step 2613, a topmost encapsulant (such as, for example, the encapsulant 123₄ illustrated in FIG. 23A) is formed surrounding the topmost die IC die as described above with reference to FIG. 23A.

In accordance with an embodiment, a method includes: forming a first die structure, the first die structure including a first die stack and a stacked dummy structure bonded to a carrier; forming a second die structure, the second die structure including a first integrated circuit die; bonding the first die structure to the second die structure by bonding a topmost integrated circuit die of the first die stack to the first integrated circuit die, the topmost integrated circuit die of the die first stack being a farthest integrated circuit die of the die first stack from the carrier; and performing a singulation process on the first die structure to form a plurality of individual die structures, where the singulation process singulates the stacked dummy structure into a plurality of individual stacked dummy structures. In an embodiment, forming the first die structure includes: bonding a front side of a second integrated circuit die to the carrier; bonding a first dummy structure to the carrier adjacent the second integrated circuit die; encapsulating the second integrated circuit die and the first dummy structure in a first encapsulant; bonding a front side of a third integrated circuit die to a backside of the second integrated circuit die, the backside of the second integrated circuit die being opposite the front side of the second integrated circuit die; bonding a second dummy structure to the first dummy structure; and encapsulating the third integrated circuit die and the second dummy structure in a second encapsulant. In an embodiment, the front side of the second integrated circuit die is bonded to the carrier using a fusion bonding method. In an embodiment, the front side of the third integrated circuit die is bonded to the backside of the second integrated circuit die using a hybrid bonding method. In an embodiment, the second dummy structure is bonded to the first dummy structure using a fusion bonding method. In an embodiment, the topmost integrated circuit die of the first die stack is bonded to the first integrated circuit die using a hybrid bonding method. In an embodiment, the stacked dummy structure is configured as a heat dissipation structure. In an embodiment, the first die structure further includes a second die stack bonded to the carrier, and the stacked dummy structure is disposed over a scribe line of the carrier between the first die stack and the second die stack.

In accordance with another embodiment, a method includes: forming a first die structure, the first die structure including a die stack bonded to a carrier; forming a second die structure, the second die structure including a first integrated circuit die; bonding the first die structure to the second die structure by bonding a topmost integrated circuit die of the die stack to the first integrated circuit die, the topmost integrated circuit die of the die stack being a farthest integrated circuit die of the die stack from the carrier; bonding a first dummy structure to the second die structure adjacent the first die structure; encapsulating the first die structure in a first encapsulant; and performing a singulation process on the second die structure to form a plurality of individual die structures, where the singulation process singulates the first dummy structure into a plurality of individual dummy structures. In an embodiment, forming the first die structure includes: bonding a front side of a second integrated circuit die to the carrier; encapsulating the second integrated circuit die in a second encapsulant; bonding a front side of a third integrated circuit die to a backside of the second integrated circuit die, the backside of the second integrated circuit die being opposite the front side of the second integrated circuit die; and encapsulating the third integrated circuit die in a third encapsulant. In an embodiment, the topmost integrated circuit die of the die stack is bonded to the first integrated circuit die using a hybrid bonding method. In an embodiment, the first dummy structure is bonded to the second die structure using a fusion bonding method. In an embodiment, forming the second die structure includes encapsulating the first integrated circuit die in a second encapsulant. In an embodiment, the first dummy structure is configured as a heat dissipation structure. In an embodiment, the method further includes bonding a second dummy structure to the second die structure, the first die structure being interposed between the first dummy structure and the second dummy structure.

In accordance with yet another embodiment, a semiconductor structure includes: a die stack bonded to a base structure, the die stack including a first integrated circuit die, the first integrated circuit die being a farthest integrated circuit die of the die stack from the base structure; a die structure bonded to the die stack, the die structure including a second integrated circuit die, a first side of the first integrated circuit die being in physical contact with a second side of the second integrated circuit die; a heat dissipation structure bonded to the die structure adjacent the die stack, a sidewall of the heat dissipation structure being substantially coplanar with a sidewall of the die structure; and an encapsulant extending along sidewalls of the die stack. In an embodiment, the heat dissipation structure includes a stack of dummy structures. In an embodiment, the sidewall of the heat dissipation structure is free from the encapsulant. In an embodiment, a topmost surface of the base structure is substantially level with a topmost surface of the heat dissipation structure, the topmost surface of the base structure being a farthest surface of the base structure from the die structure, the topmost surface of the heat dissipation structure being a farthest surface of the heat dissipation structure from the die structure. In an embodiment, a topmost surface of the heat dissipation structure is substantially level with a topmost surface of the encapsulant, the topmost surface of the heat dissipation structure being a farthest surface of the heat dissipation structure from the die structure, the topmost surface of the encapsulant being a farthest surface of the encapsulant from the die structure.

In accordance with yet another embodiment, a method includes: forming a wafer-level die structure, the wafer-level die structure including a plurality of integrated circuit dies encapsulated in a first encapsulant; forming a first die structure, the first die structure including a plurality of tiers over a carrier, each of the plurality of tiers including an encapsulated integrated circuit die; bonding the first die structure to the wafer-level die structure, the plurality of tiers being interposed between the wafer-level die structure and the carrier; bonding a dummy structure to the wafer-level die structure adjacent the first die structure; encapsulating the first die structure and the dummy structure in a second encapsulant; and performing a singulation process on the wafer-level die structure to form a plurality of individual die structures, wherein the singulation process separates the dummy structure into a plurality of individual dummy structures.

In accordance with yet another embodiment, a semiconductor structure includes: a die structure including a first integrated circuit die; a die stack bonded to the die structure, the die stack including a second integrated circuit die; a base structure bonded to the die stack, the second integrated circuit die being interposed between the first integrated circuit die and the base structure; a heat dissipation structure bonded to the die structure adjacent the die stack, a top surface of the heat dissipation structure being substantially level with a top surface of the base structure; and a first encapsulant interposed between the die stack and the heat dissipation structure.

In accordance with yet another embodiment, a semiconductor structure including: a die structure including a first integrated circuit die encapsulated in a first encapsulant; a die stack attached to the die structure; a second encapsulant extending along sidewalls of the die stack; a base structure attached to the die stack and the second encapsulant, the die stack being interposed between the first integrated circuit die and the base structure; a heat dissipation structure attached to the die structure at an interface between the first integrated circuit die and the first encapsulant; and a third encapsulant interposed between the second encapsulant and the heat dissipation structure, a top surface of the third encapsulant being substantially level with a top surface of the base structure.

In accordance with yet another embodiment, a semiconductor structure including: a die structure including a first integrated circuit die; a die stack attached to the die structure, the die stack having a first height; a first heat dissipation structure attached to the die structure, the first heat dissipation structure having a second height greater than the first height; and a first encapsulant interposed between the die stack and the first heat dissipation structure, a thickness of the first encapsulant being greater than the first height.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a die structure comprising a first integrated circuit die;
   a die stack bonded to the die structure, the die stack comprising a second integrated circuit die;
   a base structure bonded to the die stack, a width of the base structure being greater than a width of the die stack, the second integrated circuit die being interposed between the first integrated circuit die and the base structure;
   a heat dissipation structure bonded to the die structure adjacent the die stack, a top surface of the heat dissipation structure being substantially level with a top surface of the base structure, the top surface of the heat dissipation structure and the top surface of the base structure facing away from the die structure; and
   a first encapsulant interposed between the die stack and the heat dissipation structure.

2. The semiconductor structure of claim 1, wherein the heat dissipation structure has a rectangular shape in a plan view.

3. The semiconductor structure of claim 1, wherein the top surface of the heat dissipation structure is substantially level with a top surface of the first encapsulant.

4. The semiconductor structure of claim 1, further comprising a second encapsulant extending along sidewalls of the die stack.

5. The semiconductor structure of claim 4, wherein the die structure further comprises a third encapsulant extending along sidewalls of the first integrated circuit die.

6. The semiconductor structure of claim 1, wherein a backside of the first integrated circuit die is in physical contact with a front side of the second integrated circuit die.

7. The semiconductor structure of claim 1, wherein a backside of the first integrated circuit die is in physical contact with a backside of the second integrated circuit die.

8. A semiconductor structure comprising:
a die structure comprising a first integrated circuit die encapsulated in a first encapsulant;
a die stack attached to the die structure, wherein the die stack comprises a second integrated circuit die, and wherein a front side of the second integrated circuit die is in physical contact with a backside of the first integrated circuit die;
a second encapsulant extending along sidewalls of the die stack;
a base structure attached to the die stack and the second encapsulant, the die stack being interposed between the first integrated circuit die and the base structure;
a heat dissipation structure attached to the die structure at an interface between the first integrated circuit die and the first encapsulant; and
a third encapsulant interposed between the second encapsulant and the heat dissipation structure, a top surface of the third encapsulant being substantially level with a top surface of the base structure.

9. The semiconductor structure of claim 8, wherein a first sidewall of the heat dissipation structure is substantially coplanar with a sidewall of the first encapsulant.

10. The semiconductor structure of claim 9, wherein a second sidewall of the heat dissipation structure is substantially coplanar with a sidewall of the third encapsulant.

11. The semiconductor structure of claim 8, wherein the top surface of the base structure is substantially level with a top surface of the heat dissipation structure.

12. The semiconductor structure of claim 8, wherein a width of the heat dissipation structure is substantially same as a width of the third encapsulant.

13. The semiconductor structure of claim 8, wherein a sidewall of the base structure is substantially coplanar with a sidewall of the second encapsulant.

14. The semiconductor structure of claim 8, wherein a width of the base structure is less than a width of the first integrated circuit die.

15. A semiconductor structure comprising:
a die structure comprising a first integrated circuit die;
a die stack attached to the die structure, the die stack having a first height;
a first heat dissipation structure attached to the die structure, the first heat dissipation structure having a second height greater than the first height;
a first encapsulant interposed between the die stack and the first heat dissipation structure, a thickness of the first encapsulant being greater than the first height; and
a base structure attached to the die stack, the die stack being interposed between the first integrated circuit die and the base structure, a width of the base structure being less than a width of the die structure, the width of the base structure being greater than a width of the die stack.

16. The semiconductor structure of claim 15, wherein the first encapsulant surrounds the base structure.

17. The semiconductor structure of claim 15, wherein the die structure further comprises a second encapsulant extending along sidewalls of the first integrated circuit die.

18. The semiconductor structure of claim 17, wherein the first heat dissipation structure overlaps with an interface between the first integrated circuit die and the second encapsulant in a plan view.

19. The semiconductor structure of claim 17, further comprising a third encapsulant extending along sidewalls of the die stack, a thickens of the third encapsulant being equal to the first height.

20. The semiconductor structure of claim 15, further comprising a second heat dissipation structure attached to the die structure, the second heat dissipation structure having the second height, the die stack being interposed between the first heat dissipation structure and the second heat dissipation structure.

* * * * *